(12) United States Patent
Su et al.

(10) Patent No.: US 11,532,703 B2
(45) Date of Patent: Dec. 20, 2022

(54) SEMICONDUCTOR DEVICE AND METHOD

(71) Applicant: Taiwan Semiconductor Manufacturing Co., Ltd., Hsinchu (TW)

(72) Inventors: Huan-Chieh Su, Tianzhong Township (TW); Cheng-Chi Chuang, New Taipei (TW); Shang-Wen Chang, Jhubei (TW); Yi-Hsun Chiu, Zhubei (TW); Pei-Yu Wang, Hsinchu (TW); Ching-Wei Tsai, Hsinchu (TW); Chih-Hao Wang, Baoshan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 48 days.

(21) Appl. No.: 17/127,095

(22) Filed: Dec. 18, 2020

(65) Prior Publication Data

US 2021/0376076 A1    Dec. 2, 2021

Related U.S. Application Data

(60) Provisional application No. 63/030,544, filed on May 27, 2020.

(51) Int. Cl.

| H01L 29/06 | (2006.01) |
|---|---|
| H01L 27/092 | (2006.01) |
| H01L 21/8234 | (2006.01) |
| H01L 29/66 | (2006.01) |
| H01L 29/78 | (2006.01) |
| H01L 23/538 | (2006.01) |

(52) U.S. Cl.
CPC .. H01L 29/0653 (2013.01); H01L 21/823418 (2013.01); H01L 21/823431 (2013.01);
(Continued)

(58) Field of Classification Search
CPC ......... H01L 29/0653; H01L 21/823418; H01L 21/823431; H01L 23/5386; H01L 27/0924; H01L 29/0669; H01L 29/66795; H01L 29/7851; H01L 23/5286; H01L 21/743; H01L 21/76895; H01L 21/76897; H01L 21/76898; H01L 29/0673; H01L 29/42392;
(Continued)

(56) References Cited

U.S. PATENT DOCUMENTS

| 9,209,247 B2 | 12/2015 | Colinge et al. |
| 9,236,267 B2 | 1/2016 | De et al. |

(Continued)

FOREIGN PATENT DOCUMENTS

| CN | 110797306 A | 2/2020 |
| KR | 20190015269 A | 2/2019 |

*Primary Examiner* — Karen Kusumakar
*Assistant Examiner* — Adam S Bowen
(74) *Attorney, Agent, or Firm* — Slater Matsil, LLP

(57) ABSTRACT

In an embodiment, a device includes: a power rail contact; an isolation region on the power rail contact; a first dielectric fin on the isolation region; a second dielectric fin adjacent the isolation region and the power rail contact; a first source/drain region on the second dielectric fin; and a source/drain contact between the first source/drain region and the first dielectric fin, the source/drain contact contacting a top surface of the first source/drain region, a side surface of the first source/drain region, and a top surface of the power rail contact.

20 Claims, 36 Drawing Sheets

(52) U.S. Cl.
CPC ...... *H01L 23/5386* (2013.01); *H01L 27/0924* (2013.01); *H01L 29/0669* (2013.01); *H01L 29/66795* (2013.01); *H01L 29/7851* (2013.01)

(58) Field of Classification Search
CPC ............. H01L 29/66439; H01L 29/775; H01L 21/823814; H01L 21/823878; H01L 27/092; H01L 29/78696; H01L 21/823871
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,734,412 B2 | 8/2020 | Glass et al. |
| 11,081,559 B1 * | 8/2021 | Liang .................... H01L 29/775 |
| 2017/0317027 A1 | 11/2017 | Chen et al. |
| 2019/0172828 A1 | 6/2019 | Smith et al. |
| 2020/0006155 A1 | 1/2020 | Chiang et al. |
| 2020/0043945 A1 | 2/2020 | Kim et al. |
| 2020/0135578 A1 | 4/2020 | Ching et al. |
| 2021/0358911 A1 * | 11/2021 | Zhang ............. H01L 21/823814 |

* cited by examiner

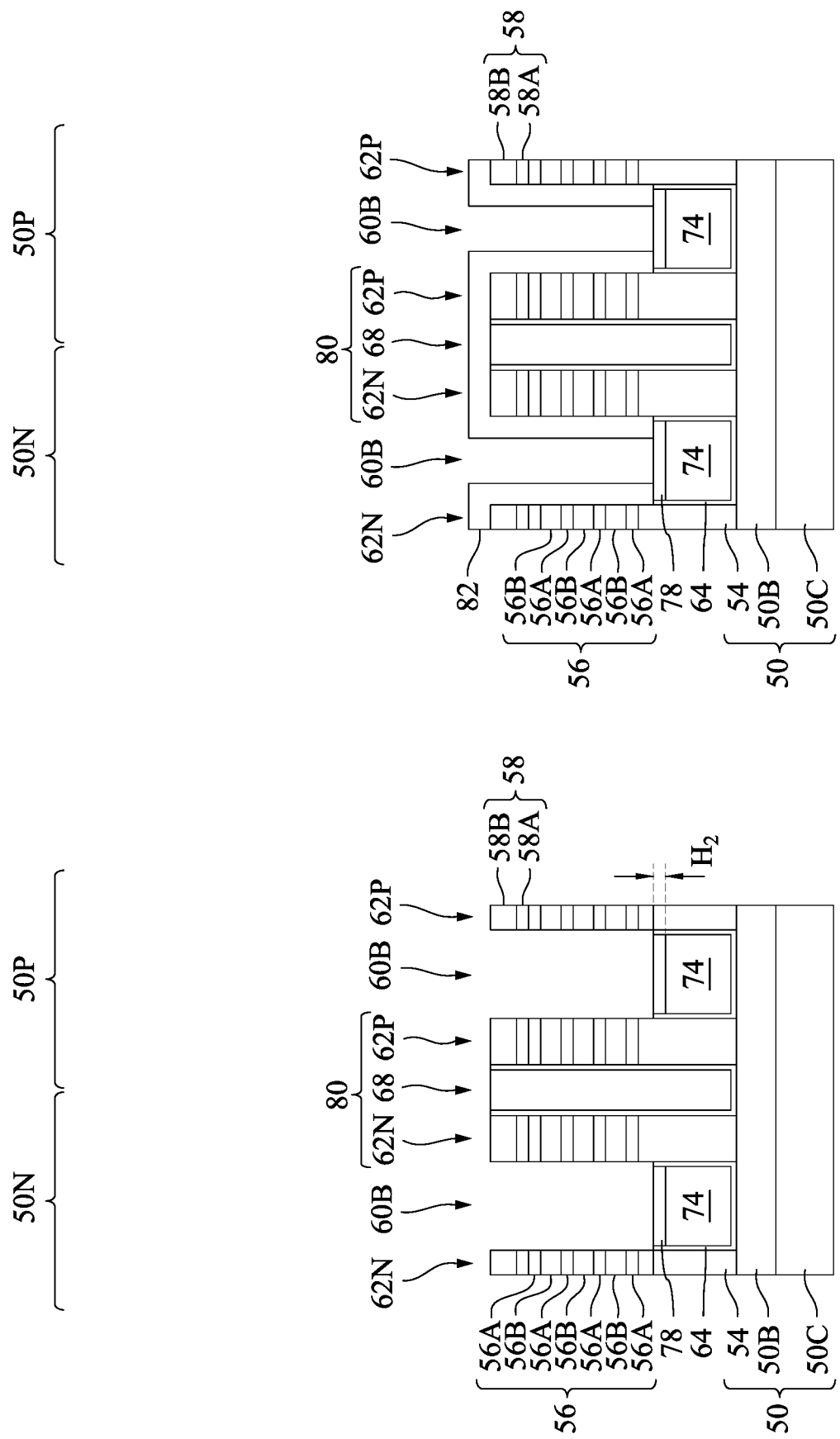

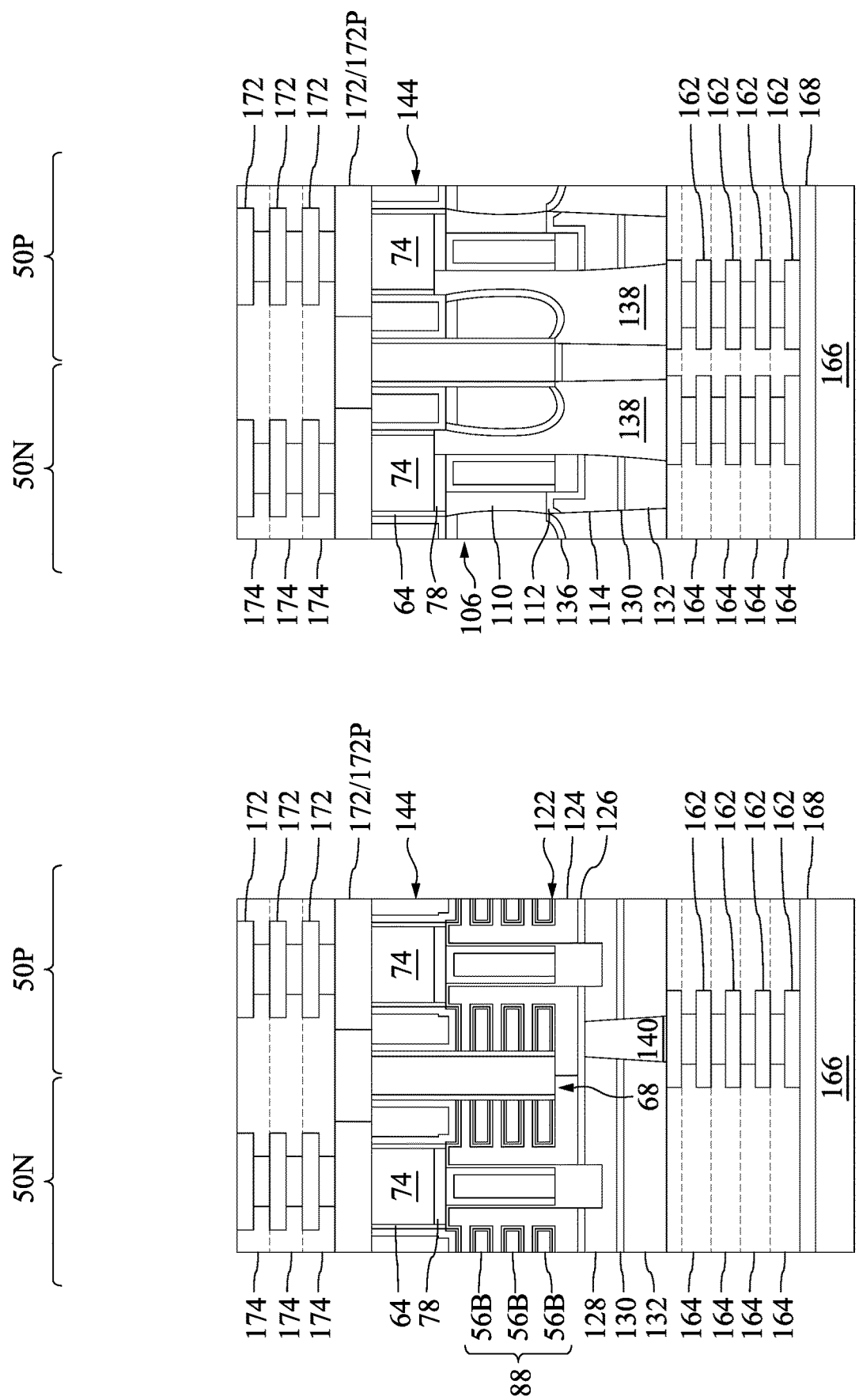

SEMICONDUCTOR DEVICE AND METHOD

PRIORITY CLAIM AND CROSS-REFERENCE

This application claims the benefit of U.S. Provisional Application No. 63/030,544, filed on May 27, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 23C are cross-sectional views of intermediate stages in the manufacturing of semiconductor devices, in accordance with some embodiments.

DETAILED DESCRIPTION

Figure 1:
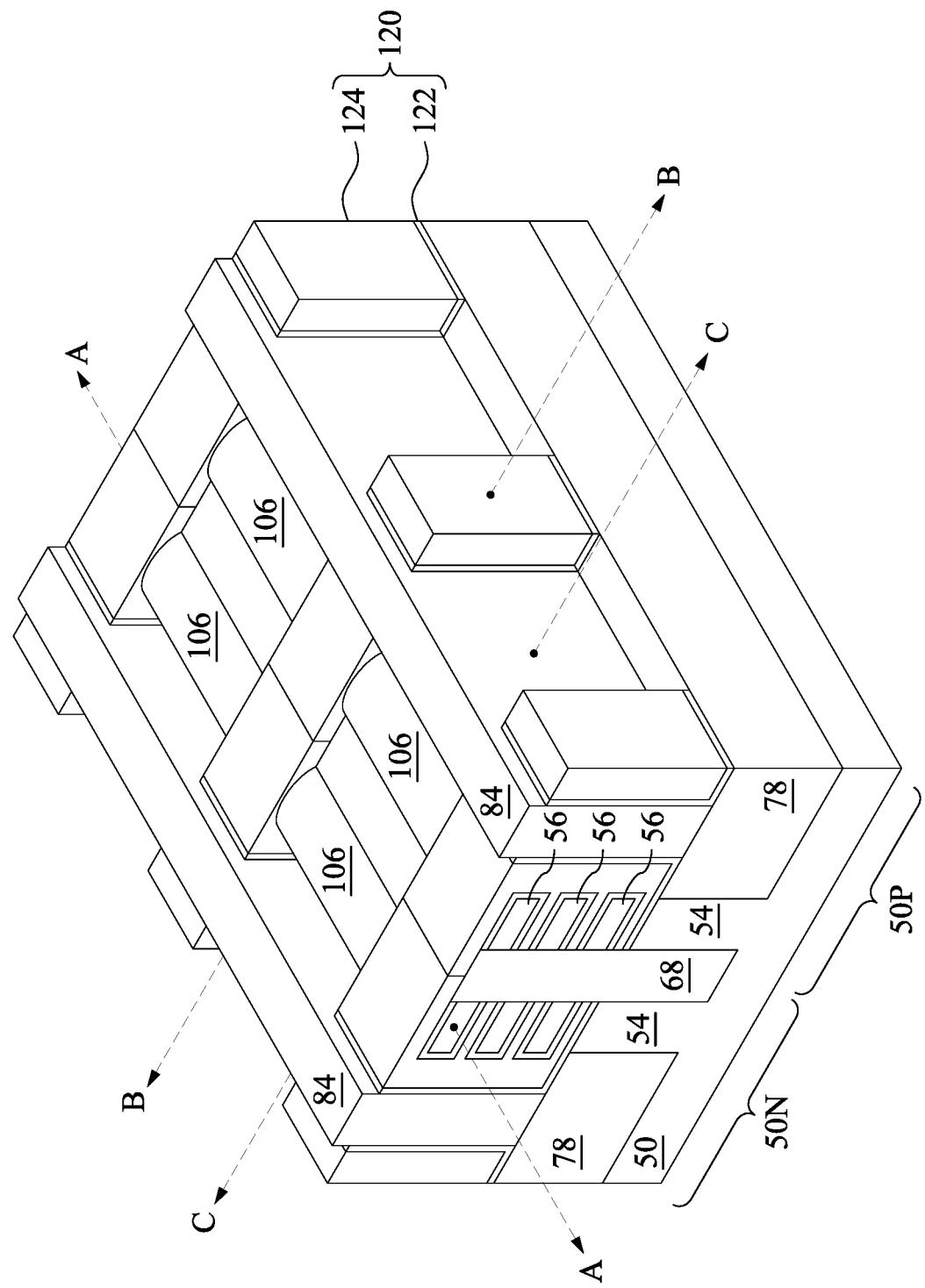
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, power rail contacts for a layer of nano-FETs are buried beneath the isolation regions surrounding the nano-FETs. Source/drain contacts may be used to couple the source/drain regions of the nano-FETs to both overlying interconnects and the underlying power rail contacts. Thus, the source/drain regions may be attached to back-side power rails, and no metal-semiconductor alloy regions need to be formed on the back-sides of the power rail contacts.

FIG. 1 illustrates an example of simplified nano-FETs, in accordance with some embodiments. FIG. 1 is a cutaway three-dimensional view, where some features of the nano-FETs are omitted for illustration clarity. In the illustrated embodiment, the nano-FETs are forksheet FETs. The nano-FETs may also be nanosheet field-effect transistors (NS-FETs), nanowire field-effect transistors (NWFETs), gate-all-around field-effect transistors (GAAFETs), or the like.

The nano-FETs include nanostructures 56 over a substrate 50, such as over fins 54 extending from the substrate 50. The nanostructures 56 are semiconductor layers that act as channel regions for the nano-FETs. Isolation regions 78, such as shallow trench isolation (STI) regions, are disposed over the substrate 50 and adjacent to the fins 54. Although the isolation regions 78 are described/illustrated as being separate from the substrate 50, as used herein, the term "substrate" may refer to the substrate 50 alone or a combination of the substrate 50 and the isolation regions 78. Additionally, although the fins 54 are illustrated as single, continuous materials with the substrate 50, the fins 54 and/or the substrate 50 may include a single material or multiple materials. In this context, the fins 54 refer to the portion extending above and from between the neighboring isolation regions 78.

Gate structures 120 are wrapped around the nanostructures 56 and are disposed over the fins 54. The gate structures 120 include gate dielectrics 122 and gate electrodes 124. The gate dielectrics 122 are along top surfaces, sidewalls, and bottom surfaces of the nanostructures 56 and may extend along sidewalls and/or over top surfaces of the fins 54. The gate electrodes 124 are on the gate dielectrics 122. Epitaxial source/drain regions 106 are disposed on opposite sides of the gate structures 120. In embodiments where multiple transistors are formed, the epitaxial source/drain regions 106 may be shared between various transistors. One or more interlayer dielectric (ILD) layer(s) (discussed in greater detail below) are over the epitaxial source/drain regions 106 and/or the gate structures 120, through which contacts (discussed in greater detail below) to the epitaxial source/drain regions 106 and the gate electrodes 124 are formed.

The substrate 50 has a n-type region 50N and a p-type region 50P. The n-type region 50N includes n-type devices, such as NMOS transistors, e.g., n-type nano-FETs, and the p-type region 50P includes p-type devices, such as PMOS transistors, e.g., p-type nano-FETs. In the illustrated embodiment, the nano-FETs are forksheet FETs. In forksheet FETs, both n-type devices and p-type devices are integrated in a same forksheet structure. A dielectric wall 68 separates the semiconductor fin 54, the nanostructures 56 and the epitaxial source/drain regions 106 for a n-type device from the semiconductor fin 54, the nanostructures 56 and the epitaxial source/drain regions 106 for a p-type device. The gate structures 120 extend along three sides of each nanostructure 56. Forksheet FETs allow n-type devices and p-type devices to be formed close to one another, and allow the gate structures 120 for the devices to be physically and electrically coupled to one another, thereby reducing the amount of gate contacts used in a CMOS process. Dielectric fins 84 are formed over the isolation regions 78 at cell boundaries, separating adjacent forksheet FETs.

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs).

FIG. 1 further illustrates reference cross-sections that are used in later figures. Cross-section A-A is along a longitudinal axis of a nanostructure 56 and in a direction, for example, of current flow between the epitaxial source/drain regions 106. Cross-section B-B is perpendicular to cross-section A-A and is along a longitudinal axis of a gate structure 120. Cross-section C-C is perpendicular to cross-section A-A and extends through epitaxial source/drain regions 106. Subsequent figures refer to these reference cross-sections for clarity.

FIGS. 2 through 23C are cross-sectional views of intermediate stages in the manufacturing of semiconductor devices, in accordance with some embodiments. Specifically, the manufacturing of a device layer of nano-FETs is illustrated. FIGS. 2, 3, 4, 5, 6, 7, 8, 9, 10, 11, 12, 13, 14, and 15 are cross-sectional views illustrated along reference cross-section B-B in FIG. 1, except four fins are shown. FIGS. 16A, 17A, 18A, 19A, 20A, 21A, 22A, and 23A are cross-sectional views illustrated along reference cross-section A-A in FIG. 1, except two gate structures are shown. FIGS. 16B, 17B, 18B, 19B, 20B, 21B, 22B, and 23B are cross-sectional views illustrated along reference cross-section B-B in FIG. 1, except four fins are shown. FIGS. 16C, 17C, 18C, 19C, 20C, 21C, 22C, and 23C are cross-sectional views illustrated along reference cross-section C-C in FIG. 1, except four fins are shown.

Figure 2:
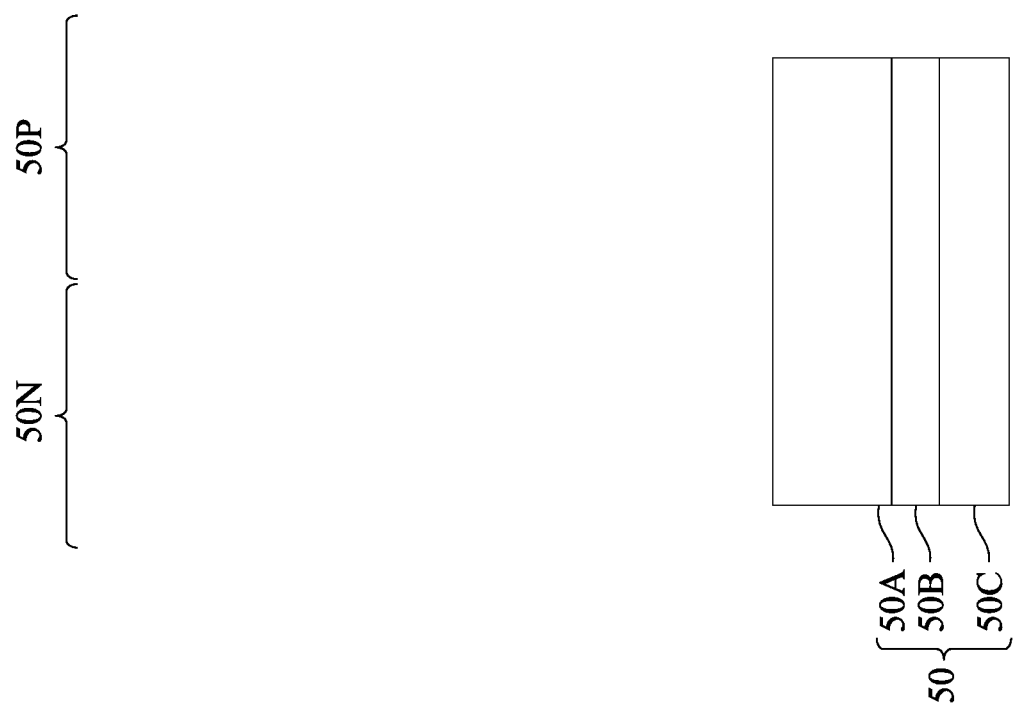

In FIG. 2, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or a n-type dopant) or undoped. The substrate 50 may be a wafer, such as a silicon wafer. In the illustrated embodiment, the substrate 50 is a SOI substrate. Generally, an SOI substrate is a semiconductor layer 50A formed on an insulator layer 50B. The insulator layer 50B may be, for example, a buried oxide (BOX) layer, a silicon oxide layer, or the like. The insulator layer 50B is provided on a substrate core 50C, which is typically a silicon or glass substrate. Other substrates, such as a multi-layered or gradient substrate may also be used. In some embodiments, the semiconductor material of the substrate 50 (e.g., the semiconductor layer 50A) may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. As discussed in greater detail below, although one n-type region 50N and one p-type region 50P are illustrated, the substrate 50 can include any desired quantity of such regions.

The substrate 50 may be lightly doped with a p-type or a n-type impurity. An anti-punch-through (APT) implantation may be performed on an upper portion of the substrate 50 to form an APT region. During the APT implantation, dopants may be implanted in the n-type region 50N and the p-type region 50P. The dopants may have a conductivity type opposite from a conductivity type of source/drain regions that will be subsequently formed in each of the n-type region 50N and the p-type region 50P. The APT region may extend under subsequently formed source/drain regions in the nano-FETs, which will be formed in subsequent processes. The APT region may be used to reduce the leakage from the source/drain regions to the substrate 50. In some embodiments, the doping concentration in the APT region may be in the range of about $10^{18}$ cm$^{-3}$ to about $10^{19}$ cm$^{-3}$.

Figure 3:
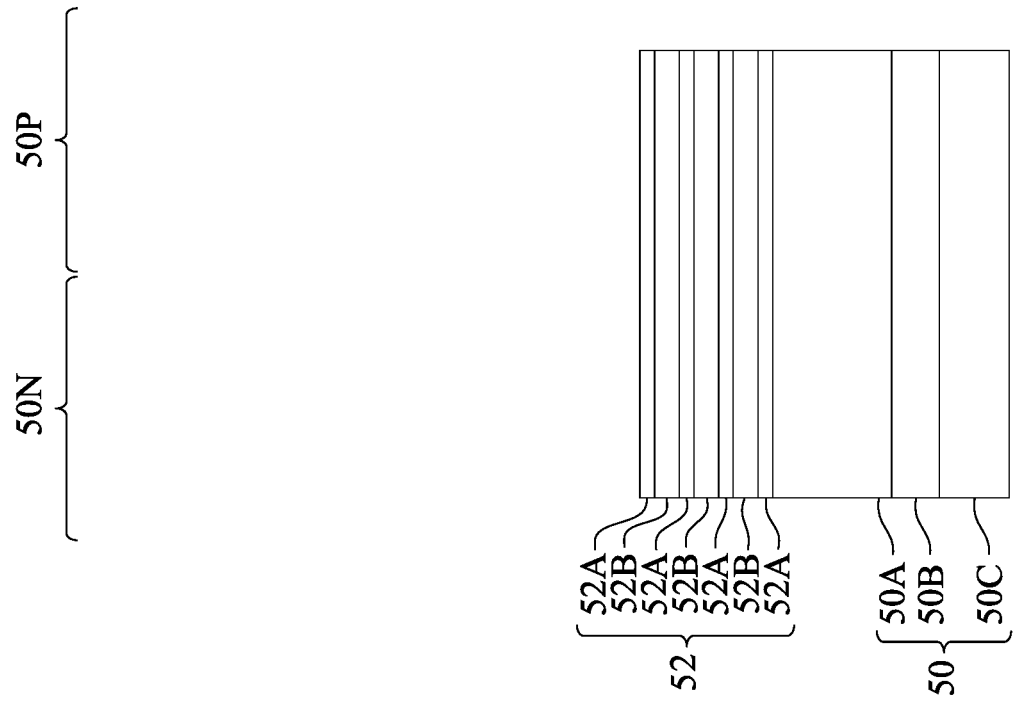

In FIG. 3, a multi-layer stack 52 is formed over the substrate 50. The multi-layer stack 52 includes alternating first semiconductor layers 52A and second semiconductor layers 52B. The first semiconductor layers 52A are formed of a first semiconductor material, and the second semiconductor layers 52B are formed of a second semiconductor material. The semiconductor materials may each be selected from the candidate semiconductor materials of the substrate 50. In the illustrated embodiment, the multi-layer stack 52 includes four layers of each of the first semiconductor layers 52A and the second semiconductor layers 52B. It should be appreciated that the multi-layer stack 52 may include any number of the first semiconductor layers 52A and the second semiconductor layers 52B. For example, the multi-layer stack 52 may include from about three to about eight layers of each of the first semiconductor layers 52A and the second semiconductor layers 52B.

In the illustrated embodiment, the second semiconductor layers 52B will be used to form channel regions for the nano-FETs in both the n-type region 50N and the p-type region 50P. The first semiconductor layers 52A are sacrificial layers (or dummy layers), which will be removed in subsequent processing to expose the top surfaces and the bottom surfaces of the second semiconductor layers 52B in both regions. The second semiconductor material of the second semiconductor layers 52B is a material suitable for both n-type and p-type nano-FETs, such as silicon, and the first semiconductor material of the first semiconductor layers 52A is a material that has a high etching selectivity from the etching of the second semiconductor material, such as silicon germanium.

In another embodiment, the first semiconductor layers 52A will be used to form channel regions for the nano-FETs in one region (e.g., the p-type region 50P), and the second semiconductor layers 52B will be used to form channel regions for the nano-FETs in another region (e.g., the n-type region 50N). The first semiconductor material of the first semiconductor layers 52A may be suitable for p-type nano-FETs, such as silicon germanium (e.g., $Si_xGe_{1-x}$, where x can be in the range of 0 to 1), pure or substantially pure germanium, a III-V compound semiconductor, a II-VI compound semiconductor, or the like, and the second semiconductor material of the second semiconductor layers 52B may be suitable for n-type nano-FETs, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 52A may be removed without removing the second semiconductor layers 52B in the n-type region 50N, and the second semiconductor layers 52B may be removed without removing the first semiconductor layers 52A in the p-type region 50P.

Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like. Each of the layers may be formed to a small thickness, such as a thickness in the range of about 5 nm to about 30 nm. In some embodiments, one group of layers (e.g., the second semiconductor layers 52B) is formed to be thinner than another group of layers (e.g., the first semiconductor layers 52A). For example, in some embodiments where the first semiconductor layers 52A are sacrificial layers (or dummy layers) and the second semiconductor layers 52B are used to form channel regions, the second semiconductor layers 52B can be thicker than the first semiconductor layers 52A. The relative thicknesses of the layers can be based on the desired channel height and the channel work function requirements of the resulting nano-FETs.

Figure 4:
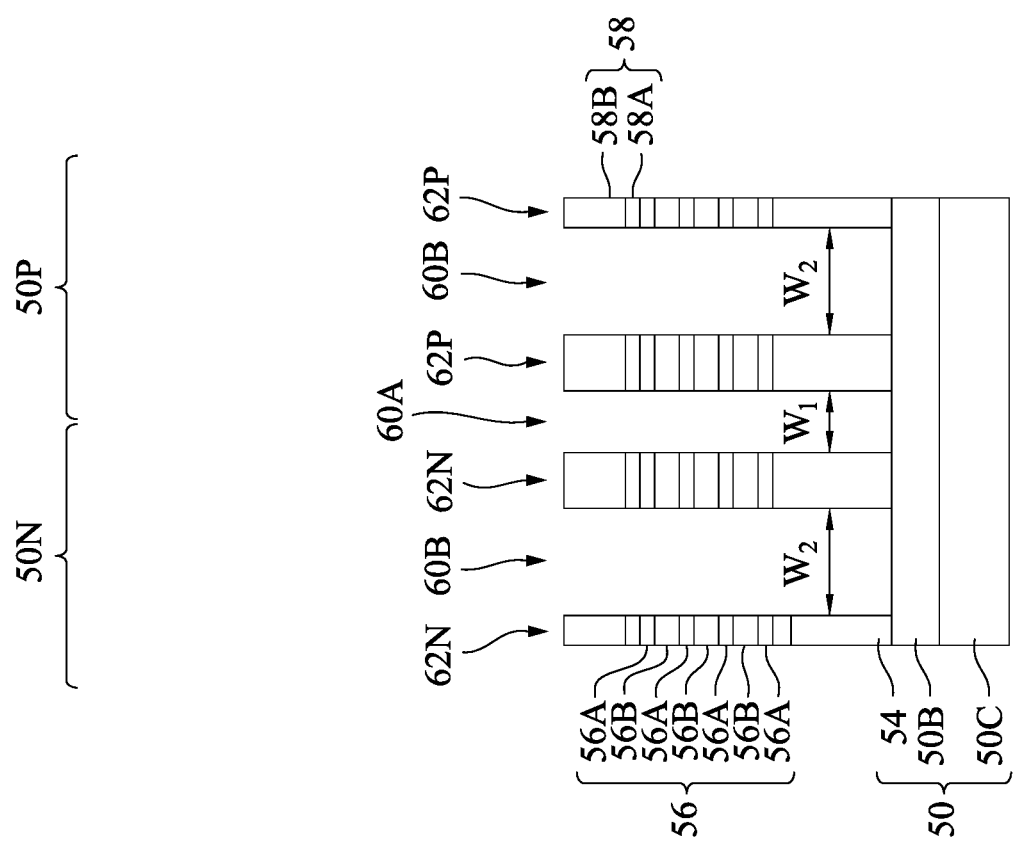

In FIG. 4, trenches 60 are etched in the substrate 50 and the multi-layer stack 52 to form fin structures 62 (including fin structures 62N in the n-type region 50N and fin structures 62P in the p-type region 50P). The fin structures 62 each include a semiconductor fin 54 and nanostructures 56. The semiconductor fins 54 are semiconductor strips patterned in the substrate 50. In embodiments where the substrate 50 is a SOI substrate, the semiconductor fins 54 include the remaining portions of the semiconductor layer 50A. The nanostructures 56 include the remaining portions of the multi-layer stack 52 on the semiconductor fins 54. Specifically, the nanostructures 56 include alternating first nanostructures 56A and second nanostructures 56B. The first nanostructures 56A and the second nanostructures 56B are formed of remaining portions of the first semiconductor layers 52A and the second semiconductor layers 52B, respectively. In the illustrated embodiment, the second nanostructures 56B are each disposed between two of the first nanostructures 56A. The etching may be any acceptable etch process, such as a reactive ion etch (RIE), neutral beam etch (NBE), the like, or a combination thereof, and may be performed with masks 58 having a pattern of the fin structures 62. The etching may be anisotropic.

The masks 58 may be single layered masks, or may be multi-layered masks, such as multi-layered masks that each include a first mask layer 58A and a second mask layer 58B on the first mask layer 58A. The first mask layer 58A and the second mask layer 58B may each be formed from a dielectric material such as silicon oxide, silicon nitride, a combination thereof, or the like, and may be deposited or thermally grown according to acceptable techniques. The material of the first mask layer 58A may have a high etching selectivity from the etching of the material of the second mask layer 58B. For example, the first mask layer 58A may be formed of silicon oxide, and the second mask layer 58B may be formed of silicon nitride.

The fin structures 62 may be patterned by any suitable method. For example, the fin structures 62 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 62. In some embodiments, the masks 58 (or other layer) may remain on the fin structures 62.

The fin structures 62 can have widths in the range of about 5 nm to about 20 nm. The fin structures 62 in the n-type region 50N and the p-type region 50P are illustrated as having substantially equal widths for illustrative purposes. In some embodiments, the fin structures 62 in one region (e.g., the n-type region 50N) may be wider or narrower than the fin structures 62 in the other region (e.g., the p-type region 50P).

The fin structures 62 are formed in adjacent pairs. Each pair of the fin structures 62 will be used to form forksheet FETs. One fin structure 62N of each pair will be used to form a n-type device, and the other fin structure 62P of each pair will be used to form a p-type device. The fin structures 62N, 62P of each pair are separated by corresponding first ones of the trenches 60A. A dielectric wall (discussed in greater detail below) will be formed in the trench 60A between the fin structures 62N, 62P of each pair, thus providing electrical isolation between the nano-FETs of different types that will be formed in the fin structures 62N, 62P. The trenches 60A can have a first width $W_1$ in the range of about 6 nm to about 30 nm. Adjacent pairs of the fin structures 62 are separated by corresponding second ones of the trenches 60B. The trenches 60B can have a second width $W_2$ in the range of about 22 nm to about 46 nm. The width $W_2$ is greater than the first width $W_1$, so that adjacent pairs of fin structures 62 are spaced apart further than the fin structures 62N, 62P of each pair.

Figure 5:
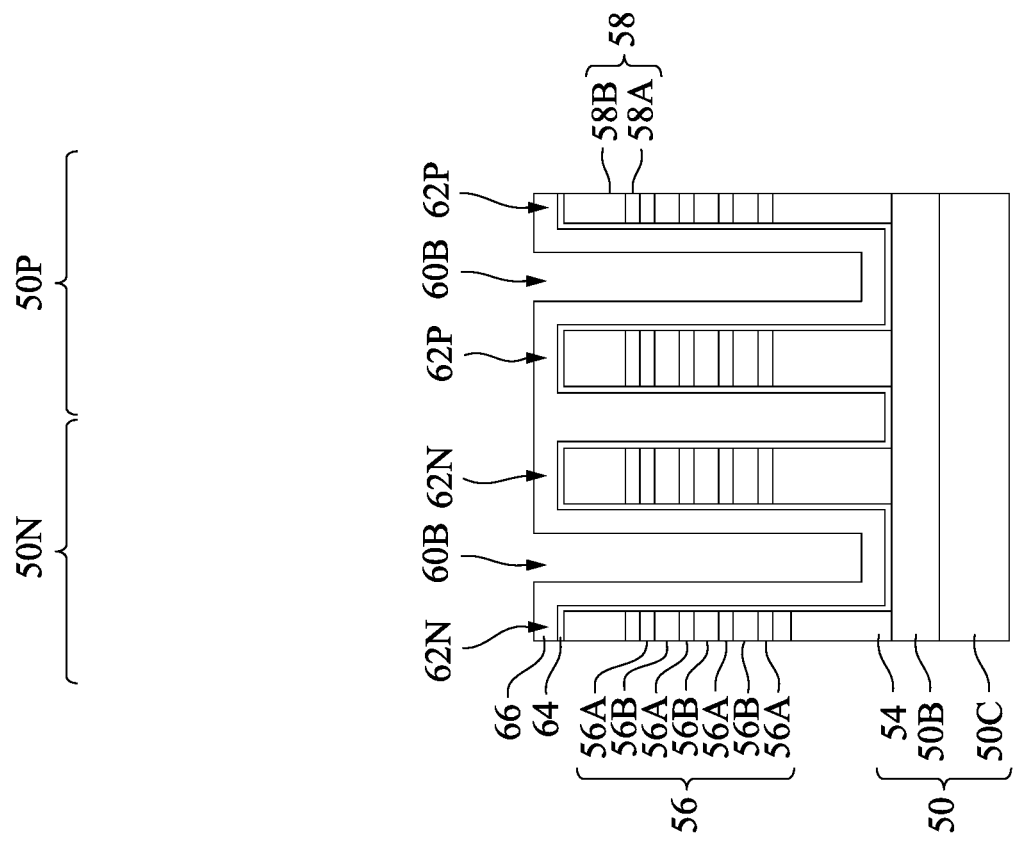

In FIG. 5, a liner layer 64 is formed over the masks 58 (if present), the fin structures 62, and the substrate 50. The liner layer 64 will be used to separate the fin structures 62 from subsequently formed contacts. The liner layer 64 may be formed of a dielectric material, which may be formed by thermal oxidation or a conformal deposition process. Acceptable dielectric materials include low-k dielectric materials (e.g., those having a k-value of less than about 7) such as silicon oxide, silicon nitride, silicon carbonitride, silicon oxycarbide, silicon oxycarbonitride, or the like; high-k dielectric materials (e.g., those having a k-value of greater than about 7) such as hafnium oxide, zirconium oxide, zirconium aluminum oxide, hafnium aluminum oxide, hafnium silicon oxide, aluminum oxide, or the like; combinations thereof; or the like. Acceptable deposition processes include atomic layer deposition (ALD), chemical vapor deposition (CVD), molecular-beam deposition (MBD), physical vapor deposition (PVD), or the like. In some embodiments, the liner layer 64 is formed of silicon oxide by thermal oxidation. The liner layer 64 can be formed to a thickness in the range of about 1 nm to about 10 nm.

A dielectric layer 66 is then formed over the liner layer 64. The dielectric layer 66 may be formed of a low-k dielectric material (such as one selected from the candidate dielectric materials of the liner layer 64), which may be deposited by a conformal deposition process (such as one selected from the candidate methods of forming the liner layer 64). The material of the dielectric layer 66 has a different k-value than the material of the liner layer 64, and has a high etching selectivity from the etching of the material of the liner layer 64. In some embodiments, the dielectric layer 66 is formed of silicon nitride by ALD or CVD.

Because the trenches 60A, 60B have different widths, they are filled with different amount of dielectric material. The liner layer 64 is formed along the sidewalls and the bottoms of the trenches 60A, 60B. Because the trenches 60A have a narrower width, they are completely filled (or overfilled) by the dielectric layer 66. However, because the trenches 60B have a larger width, they are not completely filled by the dielectric layer 66. In other words, after the dielectric layer 66 is deposited, the trenches 60A are filled (or overfilled) but some portions of the trenches 60B remain unfilled.

Figure 6:
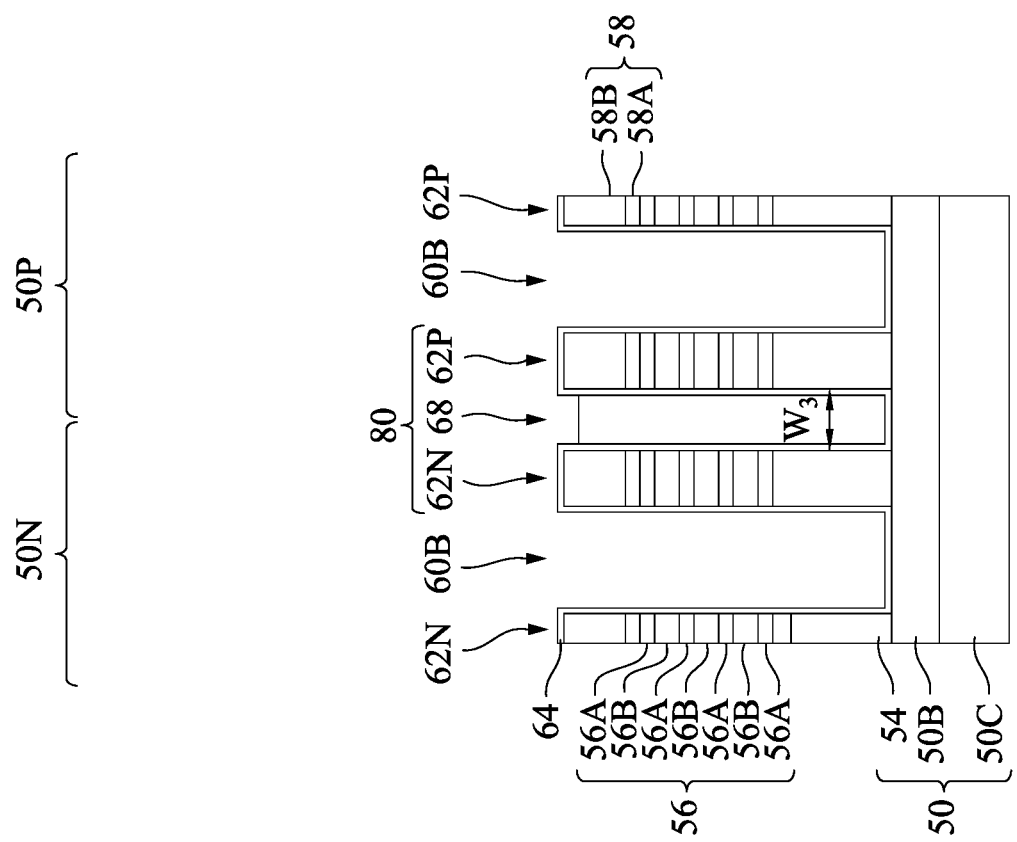

In FIG. 6, the dielectric layer 66 is etched back to remove some portions of the dielectric layer 66. Specifically, the portions of the dielectric layer 66 in the trenches 60B and over the masks 58 (if present) or the fin structures 62 are removed by the etch back, thus reforming the trenches 60B. The dielectric layer 66 is etched back using acceptable etching techniques, such as with an etching process that is selective to the dielectric layer 66 (e.g., etches the material(s) of the dielectric layer 66 at a faster rate than the material(s) of the liner layer 64). After etch back is complete, the remaining portions of the dielectric layer 66 are in the trenches 60A. The remaining portions of the dielectric layer 66 form dielectric walls 68 separating the fin structures 62N, 62P of each pair of the fin structures 62. The dielectric walls 68 may partially or fully fill the trenches 60A. The dielectric walls 68 can have a width $W_3$ in the range of about 6 nm to about 30 nm. After the dielectric layers 66 are formed, forksheet structures 80 extend from the substrate 50. The forksheet structures 80 each include a dielectric wall 68 and a pair of fin structures 62, with the dielectric wall 68 disposed between the fin structures 62.

As noted above, although one n-type region 50N and one p-type region 50P are illustrated, the substrate 50 can include any desired quantity of such regions. Each forksheet structure 80 is disposed at the boundaries of a n-type region 50N and a p-type region 50P. Further, the fin structures 62N, 62P of each forksheet structure 80 alternate. In other words, each n-type region 50N includes a first fin structure 62N from a first forksheet structure 80, and includes a second fin structure 62N from a second forksheet structure 80.

Figure 7:
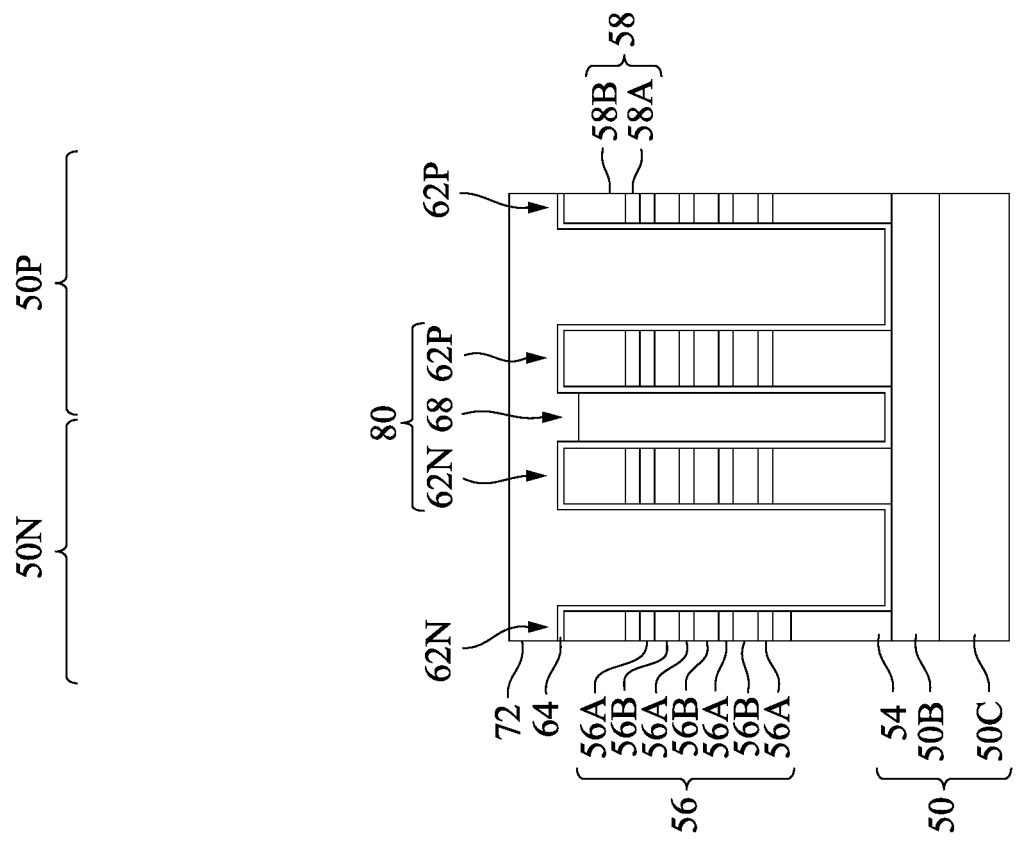

In FIG. 7, a conductive layer 72 is deposited over the dielectric walls 68 and the liner layer 64. The conductive layer 72 fills the trenches 60B and may also be formed over the masks 58 (if present) or the fin structures 62. When the dielectric walls 68 partially fill the trenches 60A, the conductive layer 72 can also be formed in the remaining portions of the trenches 60A. The conductive layer 72 may be formed of a metal or metal-containing material such as tungsten (W), ruthenium (Ru), cobalt (Co), copper (Cu), titanium (Ti), titanium nitride (TiN), tantalum (Ta), tantalum nitride (TaN), molybdenum (Mo), nickel (Ni), alloys thereof, or the like, which may be formed by a deposition process (e.g., ALD, CVD, PVD, etc.), a plating process (e.g., electroplating, electroless plating, etc.), or the like.

Figure 8:
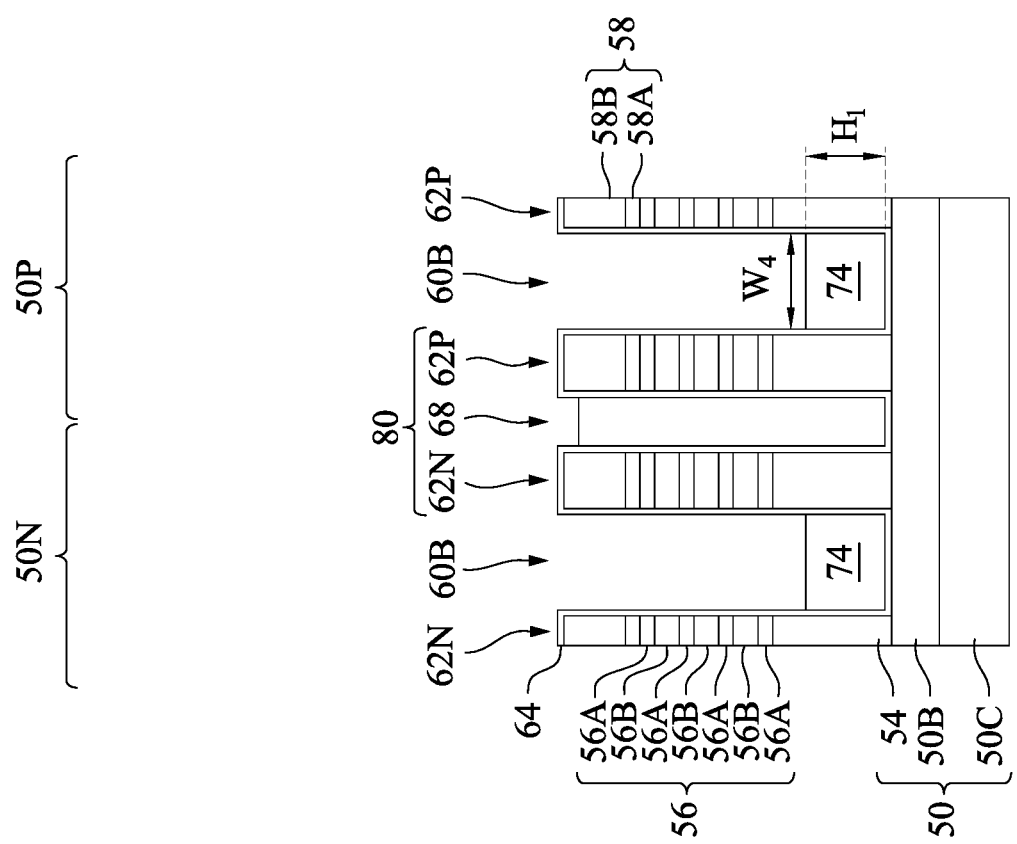

In FIG. 8, the conductive layer 72 is etched back to remove some portions of the conductive layer 72. Specifically, the portions of the conductive layer 72 in the trenches 60A and over the masks 58 (if present) or the fin structures 62 are removed by the etch back. The conductive layer 72 is etched back using acceptable etching techniques, such as with an etching process that is selective to the conductive layer 72 (e.g., etches the material(s) of the conductive layer 72 at a faster rate than the material(s) of the liner layer 64). After etch back is complete, the remaining portions of the conductive layer 72 are disposed in the trenches 60B. The portions of the conductive layer 72 remaining in the trenches 60B form power rail contacts 74 between the forksheet structures 80. Timed etch processes may be used to stop the etching of the conductive layer 72 after the power rail contacts 74 reach a desired height $H_1$. The height $H_1$ can be in the range of about 20 nm to about 60 nm. Further, the power rail contacts 74 can have a width $W_4$ in the range of about 6 nm to about 30 nm.

Figure 9:
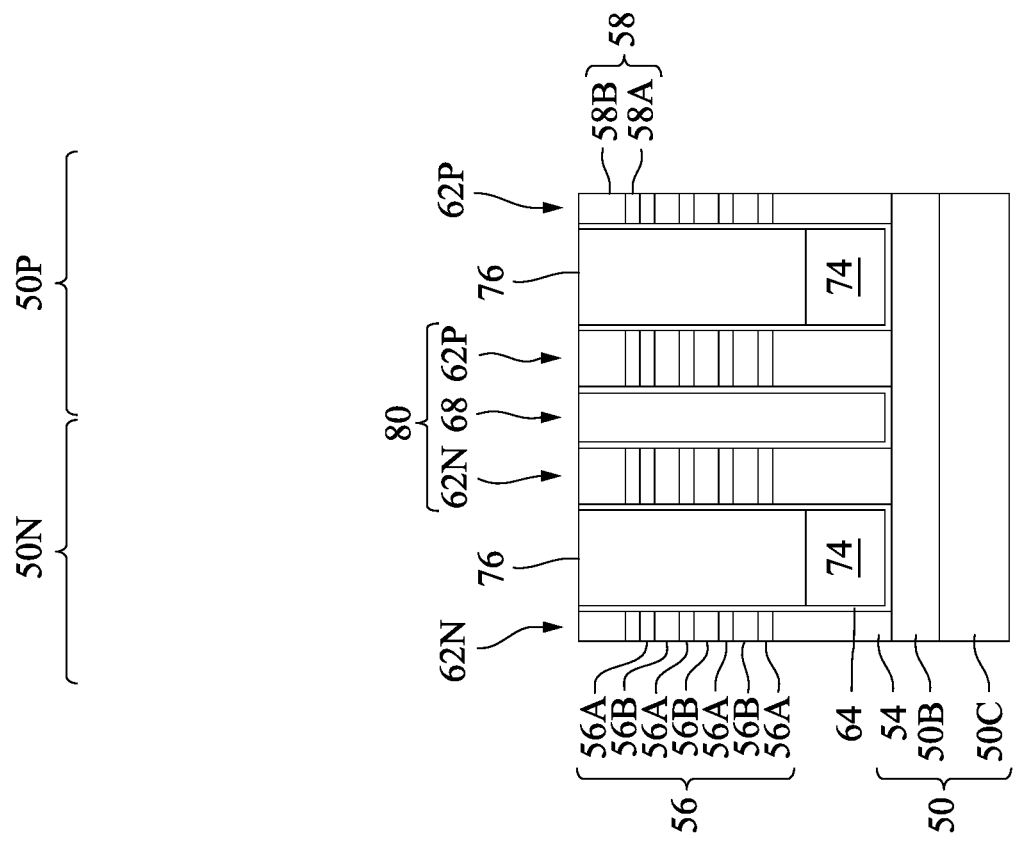

In FIG. 9, an insulation material 76 is formed in the remaining portions of the trenches 60A, adjacent the forksheet structures 80. The insulation material 76 may be deposited on the masks 58 (if present) or the fin structures 62, and in the trenches 60A, 60B. The insulation material 76 may be an oxide such as silicon oxide, a nitride such as silicon nitride, the like, or a combination thereof, and may be formed by high-density plasma CVD (HDP-CVD), flowable CVD (FCVD), the like, or a combination thereof. Other insulation materials formed by any acceptable process may be used. An anneal process may be performed once the insulation material 76 is formed. Although the insulation material 76 is illustrated as a single layer, some embodiments may utilize multiple layers. A removal process is then applied to the insulation material 76 to remove excess material of the liner layer 64 and the insulation material 76 over the masks 58 (if present) or the fin structures 62. In some embodiments, a planarization process such as a chemical mechanical polish (CMP), an etch-back process, combinations thereof, or the like may be utilized. The planarization process exposes the masks 58 or the nanostructures 56 such that top surfaces of, respectively, the masks 58 or the nanostructures 56, the remaining portions of the liner layers 64, and the insulation material 76 are coplanar (within process variations) after the planarization process is complete. In the illustrated embodiment, the masks 58 remain after the planarization process. In another embodiment, the masks 58 may also be removed by the planarization process.

In FIG. 10, the insulation material 76 is recessed to form STI regions 78, thus reforming portions of the trenches 60B. The insulation material 76 is recessed such that at least a portion of the nanostructures 56 protrude from the STI regions 78. In the illustrated embodiment, the top surfaces of the STI regions 78 are below the top surfaces of the semiconductor fins 54. In some embodiments, the top surfaces of the STI regions 78 are above or coplanar (within process variations) with the top surfaces of the semiconductor fins 54. Further, the top surfaces of the STI regions 78 may have a flat surface as illustrated, a convex surface, a concave surface (such as dishing), or a combination thereof. The top surfaces of the STI regions 78 may be formed flat, convex, and/or concave by an appropriate etch. The STI regions 78 may be recessed using an acceptable etching process, such as one that is selective to the insulation material 76 (e.g., selectively etches the material(s) of the insulation material 76 at a faster rate than the material(s) of the forksheet structures 80). For example, an oxide removal using, for example, dilute hydrofluoric (dHF) acid may be used. Timed etch processes may be used to stop the etching of the insulation material 76 after the STI regions 78 reach a desired height $H_2$. The height $H_2$ can be in the range of about 5 nm to about 20 nm. The liner layers 64 can also be recessed during the recessing of the insulation material 76. Top surfaces of the insulation material 76 and the liner layers 64 may be coplanar (within process variations) after the recessing.

After the STI regions 78 are formed, the forksheet structures 80 extend from between neighboring STI regions 78. The STI regions 78 are formed over and bury the power rail contacts 74. Each liner layer 64 is disposed between the forksheet structures 80 and each of the STI regions 78 and the power rail contacts 74. It should be appreciated that the process described above is just one example of how the forksheet structures 80 may be formed. Other acceptable processes may also be used to form the forksheet structures 80 and the STI regions 78. The forksheet structures 80 may be processed in a similar manner as semiconductor fins would be processed in a process for forming FinFETs. Processing a forksheet structure 80 in such a manner allows both n-type devices and p-type devices to be integrated in a same forksheet structure 80.

In FIG. 11, channel spacers 82 are formed over and around the forksheet structures 80, e.g., in portions of the trenches 60B. The channel spacers 82 may be formed of a semiconductor material (such as one selected from the candidate semiconductor materials of the substrate 50), which may be grown by a process such as vapor phase epitaxy (VPE) or molecular beam epitaxy (MBE), deposited by a process such as chemical vapor deposition (CVD) or atomic layer deposition (ALD), or the like. In some embodiments, the channel spacers 82 are grown by epitaxial growth, which may include growing a thin seed layer on the fin structures 62 and then growing the material of the channel spacers 82 from the seed layer. The seed layer may be grown after the fin structures 62 are formed (e.g., after the trenches 60 are etched in the substrate 50, as discussed above for FIG. 4). An anisotropic etch may be performed after forming the material of the channel spacers 82, thus exposing the STI regions 78. The channel spacers 82 are used as temporary spacers during processing, and will subsequently be removed to expose the portions of the nanostructures 56 that will act as channel regions for the nano-FETs. Specifically, in the illustrated embodiment, the channel spacers 82 and the first nanostructures 56A will be subsequently removed and replaced with gate structures that are formed around three sides of the second nanostructures 56B. Thus, the channel spacers 82 are formed of a material that has a high etching selectivity from the etching of the material of the second nanostructures 56B. The channel spacers 82 may be formed of the same semiconductor material as the first nanostructures 56A, or may be formed of a different material.

Figure 12:
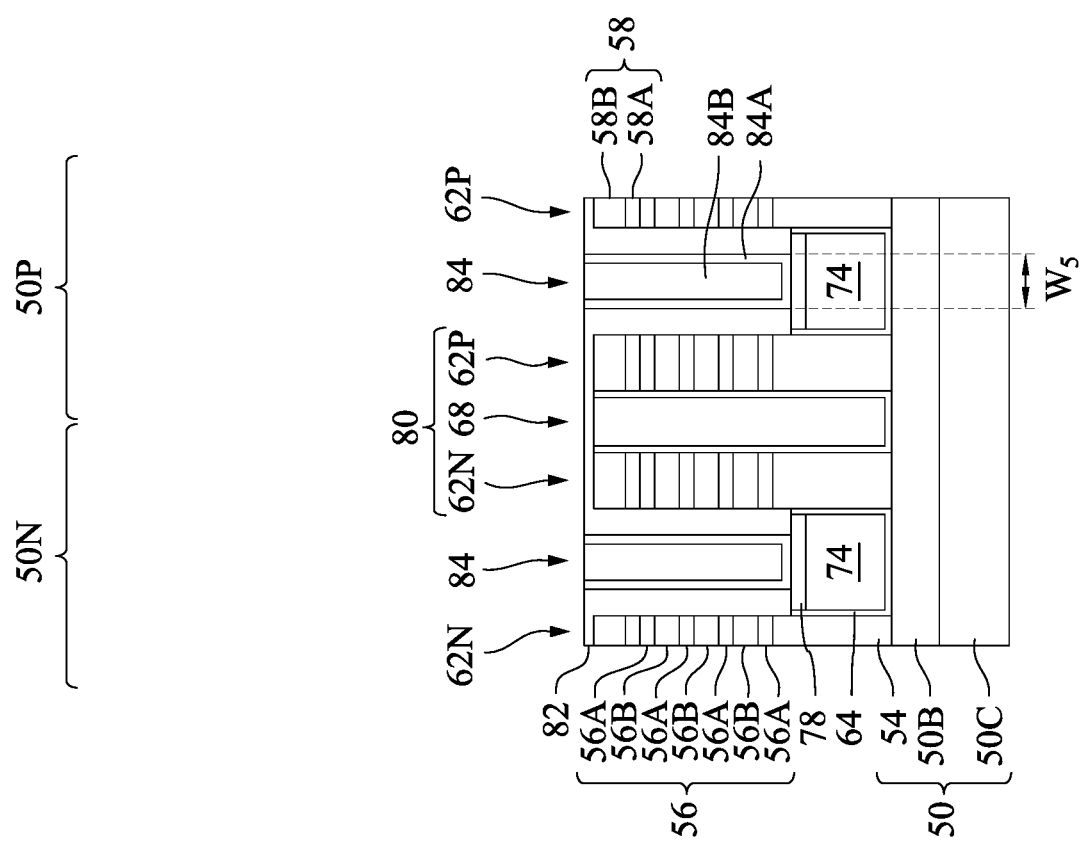

In FIG. 12, dielectric fins 84 are formed between the channel spacers 82 and on the STI regions 78, e.g., in the remaining portions of the trenches 60B that are unfilled by the channel spacers 82. Thus, each trench 60B is filled by a pair of channel spacers 82 and a dielectric fin 84, with the dielectric fin 84 being between the channel spacers 82. The dielectric fins 84 may be formed of a low-k dielectric material (such as one selected from the candidate dielectric materials of the liner layer 64), a high-k dielectric material (such as one selected from the candidate dielectric materials of the liner layer 64), combinations thereof, or the like, which may be formed by thermal oxidation or a conformal deposition process (such as one selected from the candidate methods of forming the liner layer 64). In the illustrated embodiment, each dielectric fin 84 includes a first dielectric layer 84A and a second dielectric layer 84B on the first dielectric layer 84A, with the first dielectric layer 84A formed of silicon carbonitride, silicon oxycarbide, or silicon oxycarbonitride, and the second dielectric layer 84B formed of silicon oxide. The dielectric fins 84 can have a width $W_5$ in the range of about 6 nm to about 30 nm.

A removal process is then applied to the dielectric fins 84 to remove excess material(s) of the dielectric fins 84 over the channel spacers 82. In some embodiments, a planarization process such as a chemical mechanical polish (CMP), an etch-back process, combinations thereof, or the like may be utilized. The planarization process exposes the channel spacers 82 such that top surfaces of the channel spacers 82 and the dielectric fins 84 are coplanar (within process variations) after the planarization process is complete.

Figure 13:
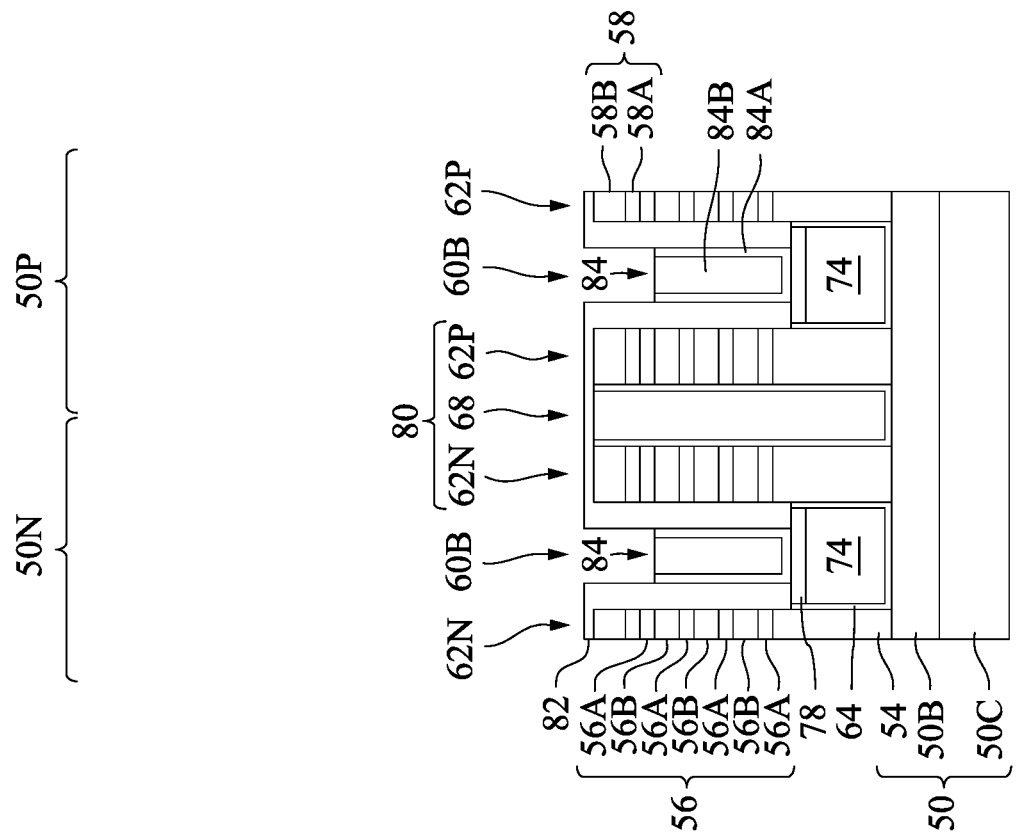

In FIG. 13, the dielectric fins 84 are optionally recessed, thus reforming portions of the trenches 60B. The dielectric fins 84 may be recessed using an acceptable etching process, such as one that is selective to the dielectric fins 84 (e.g., selectively etches the material(s) of the first dielectric layers 84A and the second dielectric layers 84B at a faster rate than the material(s) of the channel spacers 82).

Figure 14:
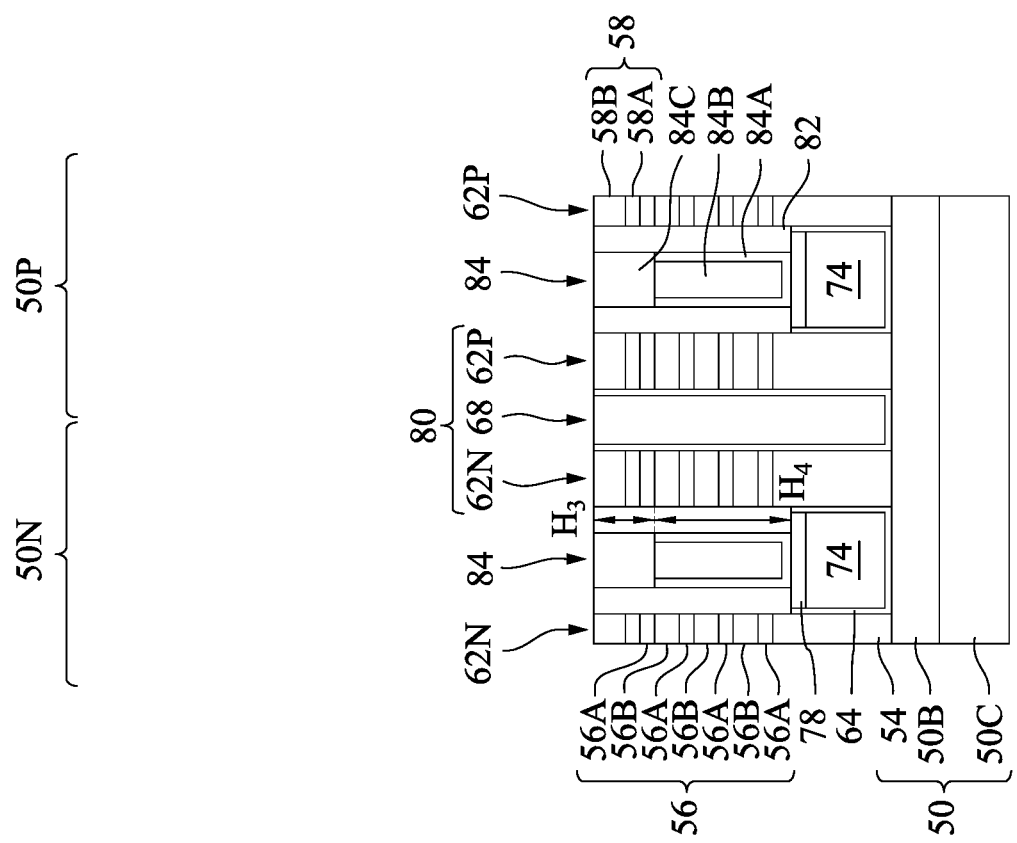

In FIG. 14, third dielectric layers 84C for the dielectric fins 84 are optionally formed in the trenches 60B, such as on the first dielectric layers 84A and the second dielectric layers 84B. The third dielectric layers 84C may be formed of a high-k dielectric material (such as one selected from the candidate dielectric materials of the liner layer 64), which may be deposited by a conformal deposition process (such as one selected from the candidate methods of forming the liner layer 64). A removal process is then applied to remove excess material(s) of the third dielectric layers 84C and the channel spacers 82 over the masks 58 (if present) or the fin structures 62. In some embodiments, a planarization process such as a chemical mechanical polish (CMP), an etch-back process, combinations thereof, or the like may be utilized. The planarization process exposes the masks 58 or the nanostructures 56 such that top surfaces of, respectively, the masks 58 or the nanostructures 56, the channel spacers 82, and the third dielectric layers 84C are coplanar (within process variations) after the planarization process is complete. In the illustrated embodiment, the masks 58 remain after the planarization process. In another embodiment, the masks 58 may also be removed by the planarization process.

In the illustrated embodiment, the dielectric fins 84 have lower portions (including the first dielectric layers 84A and the second dielectric layers 84B) formed of low-k dielectric materials and upper portions (including the third dielectric layers 84C) formed of high-k dielectric materials. It should be appreciated that other types of dielectric fins 84 may be formed, such as dielectric fins 84 with more or fewer layers. In various embodiments, the dielectric fins 84 can include lower and upper portions of low-k dielectric materials; lower and upper portions of high-k dielectric materials; lower portions of high-k dielectric materials and upper portions of low-k dielectric materials; single-layered lower and/or upper portions; multi-layered lower and/or upper portions; or the like. The upper portions of the dielectric fins 84 can have a height $H_3$ in the range of about 6 nm to about 30 nm, the lower portions of the dielectric fins 84 can have a height $H_4$ in the range of about 27 nm to about 60 nm, and the dielectric fins 84 can have an overall height in the range of about 33 nm to about 90 nm.

Figure 15:
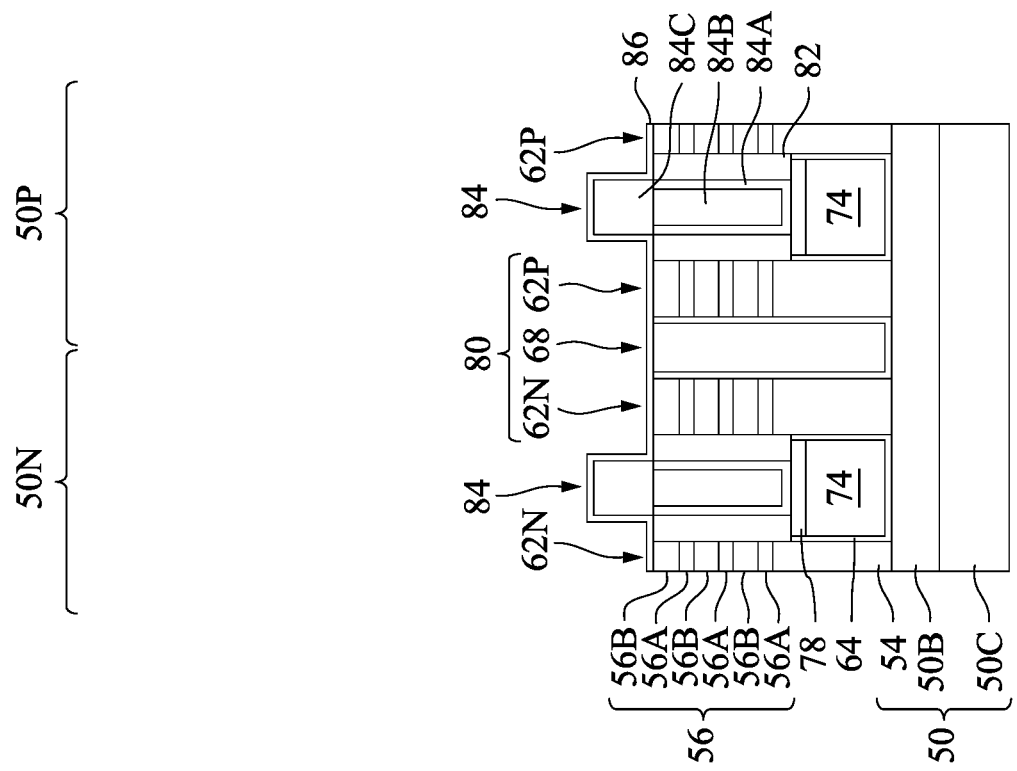

In FIG. 15, the forksheet structures 80 and the channel spacers 82 are recessed so that the dielectric fins 84 extend from between neighboring channel spacers 82. The recessing removes the masks 58 from the fin structures 62, if they are still present at this step of processing. The recessing may be by acceptable etching process(es). For example, the forksheet structures 80 may be recesses using an acceptable etching process, such as one that is selective to the masks 58, the nanostructures 56, and the dielectric walls 68 (e.g., selectively etches the material(s) of the masks 58, the nanostructures 56, and the dielectric walls 68 at a faster rate than the material(s) of the channel spacers 82 and the dielectric fins 84). The channel spacers 82 may optionally be trimmed using an acceptable etching process, such as one that is selective to the channel spacers 82 (e.g., selectively etches the material(s) of the channel spacers 82 at a faster rate than the material(s) of the nanostructures 56 and the dielectric walls 68). The recessing/trimming may remove some of the nanostructures 56.

A dummy dielectric layer 86 is then formed on the forksheet structures 80, the channel spacers 82, and the dielectric fins 84. The dummy dielectric layer 86 may be formed of silicon oxide, silicon nitride, a combination thereof, or the like, which may be deposited or thermally grown according to acceptable techniques.

FIGS. 16A through 23C illustrate further intermediate stages in the manufacturing of nano-FETs. FIGS. 16A, 17A, 18A, 19A, 20A, 21A, 22A, and 23A may be applicable to both the n-type region 50N and the p-type region 50P. Differences (if any) in the structures of the n-type region 50N and the p-type region 50P are described in the text accompanying each figure.

Figure 16A:
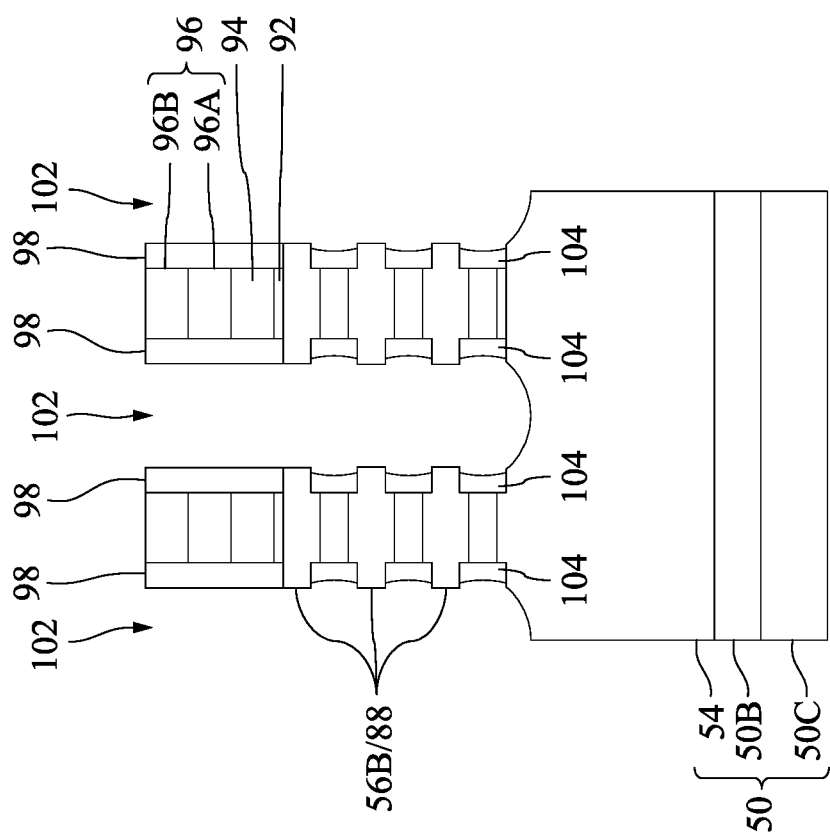
Figure 16C:
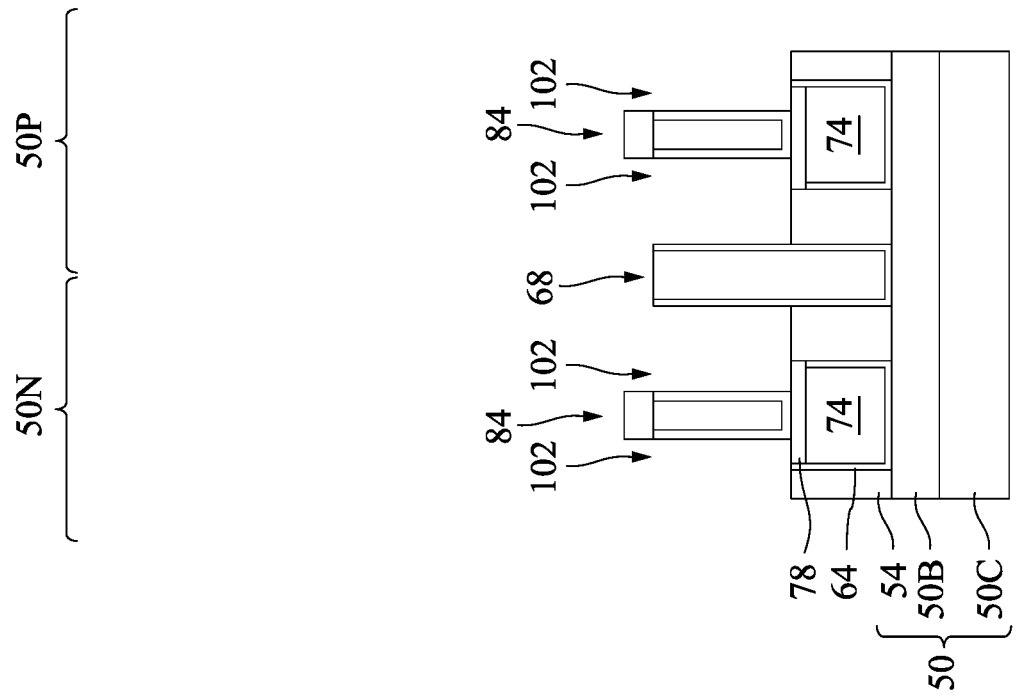
Figure 16B:
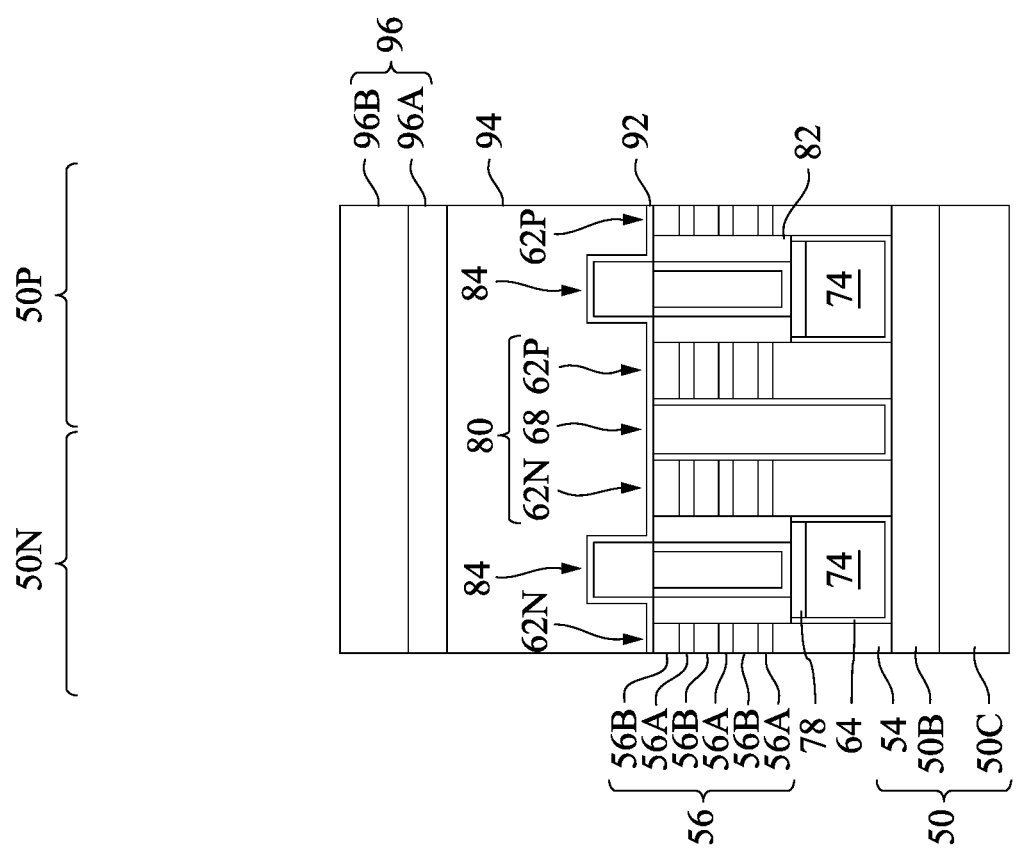

In FIGS. 16A, 16B, and 16C, dummy gates 94 are formed over the dummy dielectric layer 86. The dummy gates 94 may be formed by forming a dummy gate layer and patterning the dummy gate layer. The dummy gate layer may be deposited over the dummy dielectric layer 86 and then planarized, such as by a CMP. The dummy gate layer may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer may be deposited by physical vapor deposition (PVD), CVD, sputter deposition, or other techniques for depositing the selected material. The dummy gate layer may then be patterned to form the dummy gates 94 using acceptable photolithography and etching techniques, such as with masks 96 having a pattern of the dummy gates 94. The pattern of the masks 96 is transferred to the dummy gate layer by an acceptable etching technique to form the dummy gates 94. The pattern of the masks 96 may optionally be further transferred to the dummy dielectric layer 86 by an acceptable etching technique to form dummy dielectrics 92.

The masks 96 may be single layered masks, or may be multi-layered masks, such as multi-layered masks that each include a first mask layer 96A and a second mask layer 96B. The first mask layer 96A and the second mask layer 96B may each be formed from a dielectric material such as silicon oxide, silicon nitride, a combination thereof, or the like, and may be deposited or thermally grown according to acceptable techniques. The material of the first mask layer 96A may have a high etching selectivity from the etching of the material of the second mask layer 96B. For example, the first mask layer 96A may be formed of silicon oxide, and the second mask layer 96B may be formed of silicon nitride.

The dummy gates 94 cover portions of the nanostructures 56 that will be exposed in subsequent processing to form channel regions. Specifically, the dummy gates 94 extend along the portions of the nanostructures 56 that will be used to form channel regions 88. The pattern of the masks 96 may be used to physically separate adjacent dummy gates 94. The dummy gates 94 may also have lengthwise directions substantially perpendicular (within process variations) to the lengthwise directions of the semiconductor fins 54. The masks 96 can optionally be removed after patterning, such as by an acceptable etching technique.

Gate spacers 98 are then formed over the fin structures 62, e.g., on exposed sidewalls of the masks 96, the dummy gates 94, and the dummy dielectrics 92. The gate spacers 98 may be formed by conformally forming an insulating material and subsequently etching the insulating material. The insulating material may be a low-k dielectric material (such as one selected from the candidate dielectric materials of the liner layer 64), which may be deposited by a conformal deposition process (such as one selected from the candidate methods of forming the liner layer 64). The gate spacers 98 can be formed from a singled-layered insulating material or multiple layers of insulating materials. In some embodiments, the gate spacers 98 each include multiple layers of silicon oxycarbonitride, where each layer may have a different composition of silicon oxycarbonitride. In some embodiments, the gate spacers 98 each include a layer of silicon oxide disposed between two layers of silicon nitride. Other spacer structures may be formed. The etching of the insulating material may be anisotropic. For example, the etching process may be a dry etch such as RIE, NBE, or the like. After etching, the gate spacers 98 can have straight sidewalls or curved sidewalls.

Before the formation of the gate spacers 98, implants for lightly doped source/drain (LDD) regions may be performed. In the embodiments with different device types, similar to the implants discussed above, a mask, such as a photoresist, may be formed over the n-type region 50N, while exposing the p-type region 50P, and appropriate type (e.g., p-type) impurities may be implanted into the fin structures 62 exposed in the p-type region 50P. The mask may then be removed. Subsequently, a mask, such as a photoresist, may be formed over the p-type region 50P while exposing the n-type region 50N, and appropriate type impurities (e.g., n-type) may be implanted into the fin structures 62 exposed in the n-type region 50N. The mask may then be removed. The n-type impurities may be any of the n-type impurities previously discussed, and the p-type impurities may be any of the p-type impurities previously discussed. The lightly doped source/drain regions may have a concentration of impurities in the range of about $10^{15}$ cm$^{-3}$ to about $10^{19}$ cm$^{-3}$. An anneal may be used to repair implant damage and to activate the implanted impurities. During the implanting, the channel regions 88 remain covered by the dummy gates 94, so that the channel regions 88 remain substantially free from the impurity implanted in the LDD regions.

It is noted that the above disclosure generally describes a process of forming spacers and LDD regions. Other processes and sequences may be used. For example, fewer or additional spacers may be utilized, different sequence of steps may be utilized (e.g., additional spacers may be formed and removed, etc.), and/or the like. Furthermore, the n-type and p-type devices may be formed using a different structures and steps.

After the gate spacers 98 are formed, source/drain recesses 102 are then formed in the fin structures 62 and the channel spacers 82. In the illustrated embodiment, the source/drain recesses 102 extend through the nanostructures 56 and the channel spacers 82 to expose the semiconductor fins 54 and the STI regions 78. The source/drain recesses 102 may also extend into the semiconductor fins 54. In other words, the source/drain recesses 102 can be formed only in the nanostructures 56 or can also be formed to extend into the semiconductor fins 54. In various embodiments, the source/drain recesses 102 in the fin structures 62 may extend to top surfaces of the semiconductor fins 54 without etching the semiconductor fins 54; the semiconductor fins 54 may be etched such that bottom surfaces of the source/drain recesses 102 in the fin structures 62 are disposed below the top surfaces of the STI regions 78; or the like. The source/drain recesses 102 may be formed using an acceptable etching process, such as one that is selective to the fin structures 62 and the channel spacers 82 (e.g., selectively etches the material(s) of the semiconductor fins 54, the nanostructures 56, and the channel spacers 82 at a faster rate than the material(s) of the dielectric walls 68 and the dielectric fins 84). The dielectric walls 68 and the dielectric fins 84 thus remain after the source/drain recesses 102 are formed. The gate spacers 98 and the masks 96 collectively mask portions of the fin structures 62 and the channel spacers 82 during the etching processes used to form the source/drain recesses 102. Timed etch processes may be used to stop the etching of the source/drain recesses 102 after the source/drain recesses 102 reach a desired depth.

Inner spacers 104 are optionally formed on the sidewalls of the remaining portions of the first nanostructures 56A, e.g., those sidewalls expose by the source/drain recesses 102. As will be discussed in greater detail below, source/drain regions will be subsequently formed in the source/drain recesses 102, and the first nanostructures 56A will be subsequently replaced with corresponding gate structures. The inner spacers 104 act as isolation features between the subsequently formed source/drain regions and the subsequently formed gate structures. Further, the inner spacers 104 may be used to prevent damage to the subsequently formed source/drain regions by subsequent etching processes, such as etching processes used to subsequently form the gate structures.

As an example to form the inner spacers 104, the source/drain recesses 102 can be expanded. Specifically, portions of the sidewalls of the first nanostructures 56A exposed by the source/drain recesses 102 may be recessed. Although sidewalls of the first nanostructures 56A are illustrated as being straight, the sidewalls may be concave or convex. The sidewalls may be recessed by an acceptable etching process, such as one that is selective to the material of the first nanostructures 56A (e.g., selectively etches the material of the first nanostructures 56A at a faster rate than the material (s) of the second nanostructures 56B and the semiconductor fins 54). The etching may be isotropic. For example, when the semiconductor fins 54 and the second nanostructures 56B are formed of silicon and the first nanostructures 56A are formed of silicon germanium, the etching process may be a wet etch using tetramethylammonium hydroxide (TMAH), ammonium hydroxide (NH$_4$OH), or the like. In another embodiment, the etching process may be a dry etch using a fluorine-based gas such as hydrogen fluoride (HF) gas. In some embodiments, the same etching process may be continually performed to both form the source/drain recesses 102 and recess the sidewalls of the first nanostructures 56A. In some embodiments, the etching process used to recess the sidewalls can also trim (e.g., reduce the thicknesses of) the etched portions of the second nanostructures 56B. The inner spacers 104 can then be formed by conformally forming an insulating material and subsequently etching the insulating material. The insulating material may be a low-k dielectric material (such as one selected from the candidate dielectric materials of the liner layer 64), which may be deposited by a conformal deposition process (such as one selected from the candidate methods of forming the liner layer 64). The etching of the insulating material may be anisotropic. For example, the etching process may be a dry etch such as RIE, NBE, or the like. Although outer sidewalls of the inner spacers 104 are illustrated as being recessed from the sidewalls of the gate spacers 98, the outer sidewalls of the inner spacers 104 may extend beyond or be flush with respect to the sidewalls of the gate spacers 98. In other words, the inner spacers 104 may partially fill, completely fill, or overfill the sidewall recesses. Moreover, although the sidewalls of the inner spacers 104 are illustrated as being concave, the sidewalls of the inner spacers 104 may be straight or convex.

Figure 17A:
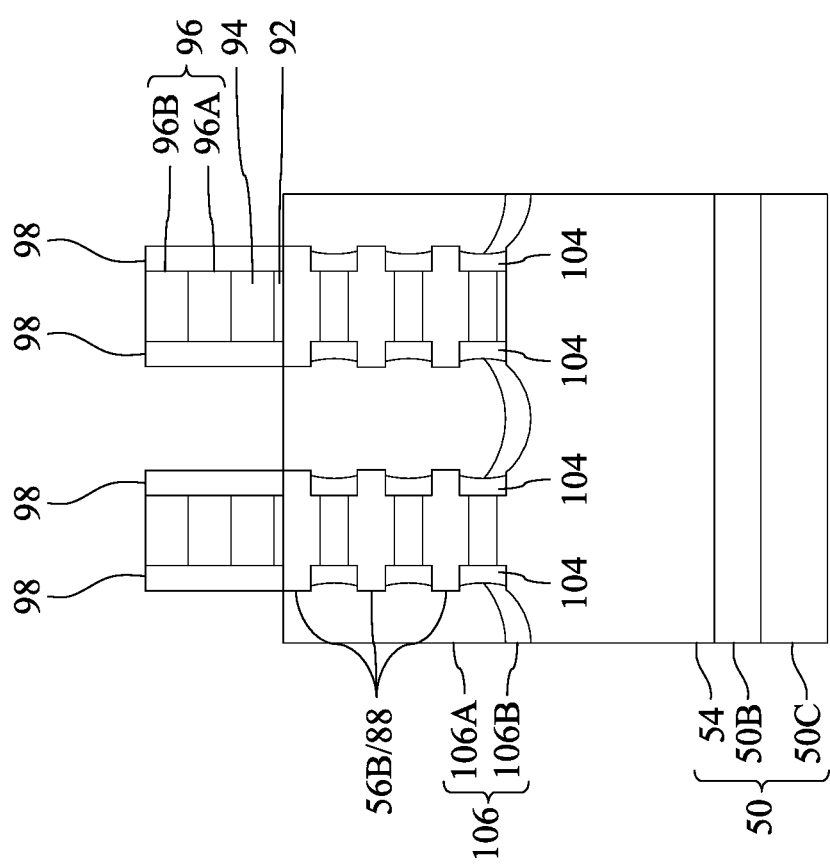
Figure 17C:
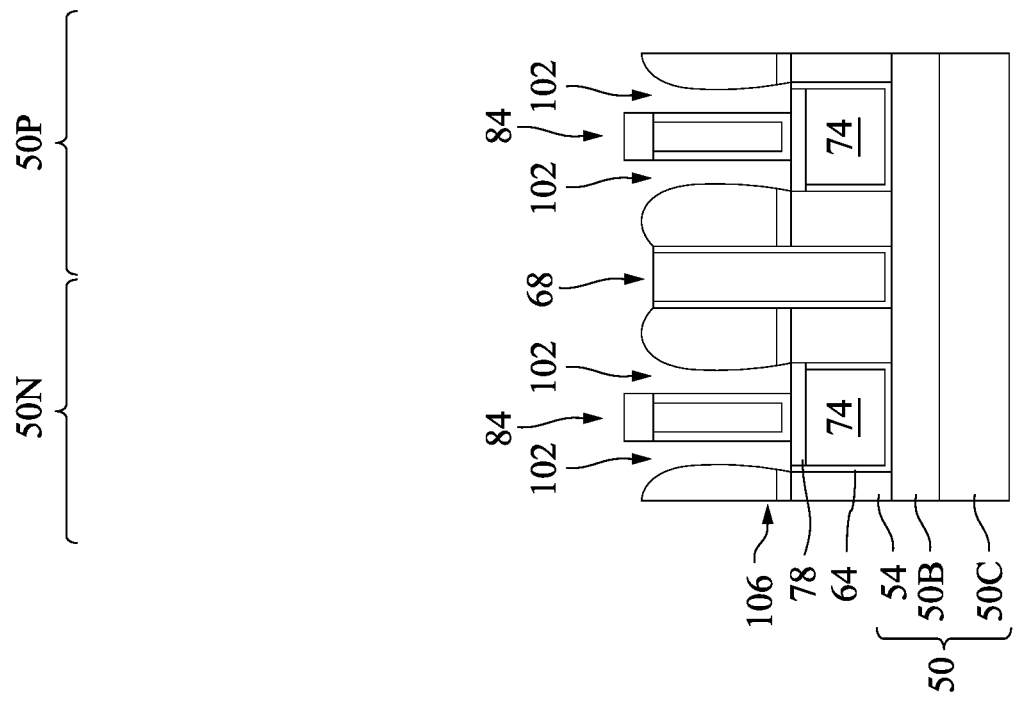
Figure 17B:
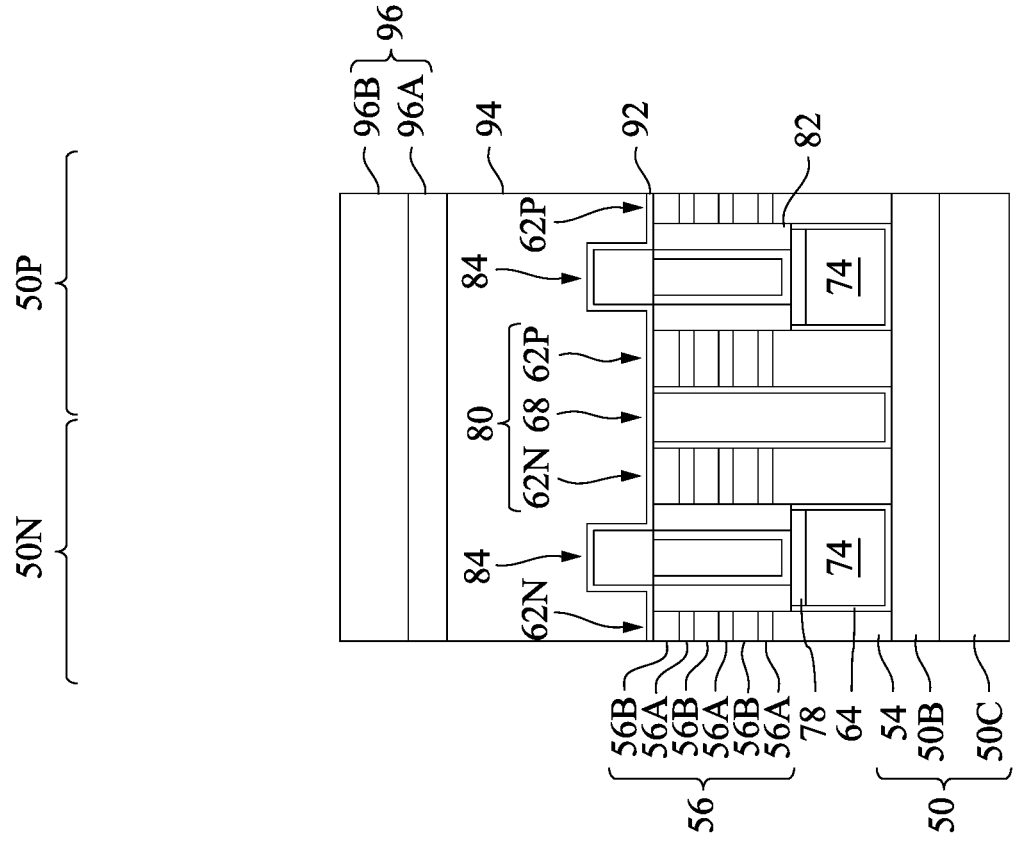

In FIGS. 17A, 17B, and 17C, epitaxial source/drain regions 106 are formed in the source/drain recesses 102. The epitaxial source/drain regions 106 are formed in the source/drain recesses 102 such that each of the dummy gates 94 are disposed between respective neighboring pairs of the epitaxial source/drain regions 106. In some embodiments, the gate spacers 98 and the inner spacers 104 are used to separate the dummy gates 94 and the first nanostructures 56A, respectively, from the epitaxial source/drain regions 106 by an appropriate lateral distance so that the epitaxial source/drain regions 106 do not short out subsequently formed gates of the nano-FETs. The epitaxial source/drain regions 106 may be formed in contact with the inner spacers 104 (if present), and may extend past sidewalls of the second nanostructures 56B. The epitaxial source/drain regions 106 can exert stress on the second nanostructures 56B, thereby improving performance.

The epitaxial source/drain regions 106 in the n-type region 50N may be formed by masking the p-type region 50P. Then, the epitaxial source/drain regions 106 are epitaxially grown in the source/drain recesses 102 in the n-type region 50N. The epitaxial source/drain regions 106 may include any acceptable material appropriate for n-type nano-FETs. For example, the epitaxial source/drain regions 106 in the n-type region 50N may include materials exerting a tensile strain on the channel regions 88, such as silicon, silicon carbide, phosphorous doped silicon carbide, silicon phosphide, or the like. The epitaxial source/drain regions 106 in the n-type region 50N may have surfaces raised from respective surfaces of the fin structures 62, and may have facets.

The epitaxial source/drain regions 106 in the p-type region 50P may be formed by masking the n-type region 50N. Then, the epitaxial source/drain regions 106 are epitaxially grown in the source/drain recesses 102 in the p-type region 50P. The epitaxial source/drain regions 106 may include any acceptable material appropriate for p-type nano-FETs. For example, the epitaxial source/drain regions 106 in the p-type region 50P may include materials exerting a compressive strain on the channel regions 88, such as silicon germanium, boron doped silicon germanium, germanium, germanium tin, or the like. The epitaxial source/drain regions 106 in the p-type region 50P may have surfaces raised from respective surfaces of the fin structures 62, and may have facets.

The epitaxial source/drain regions 106, the second nanostructures 56B, and/or the fins 54 may be implanted with dopants to form source/drain regions, similar to the process previously discussed for forming lightly-doped source/drain regions, followed by an anneal. The source/drain regions may have an impurity concentration in the range of about $10^{19}$ cm$^{-3}$ to about $10^{21}$ cm$^{-3}$. The n-type and/or p-type impurities for source/drain regions may be any of the impurities previously discussed. In some embodiments, the epitaxial source/drain regions 106 may be in situ doped during growth.

As a result of the epitaxy processes used to form the epitaxial source/drain regions 106, upper surfaces of the epitaxial source/drain regions 106 have facets which expand laterally outward beyond surfaces of the fin structures 62. Adjacent epitaxial source/drain regions 106 remain separated by either the dielectric walls 68 or the dielectric fins 84 after the epitaxy process is completed, so that merging of the epitaxial source/drain regions 106 is avoided. Thus, the epitaxial source/drain regions 106 each have a straight bottom surface (contacting a semiconductor fin 54), a straight sidewall (contacting a dielectric wall 68), a faceted side surface (facing a dielectric fin 84), and a faceted top surface (facing away from the substrate 50). Further, physical separation between the epitaxial source/drain regions 106 and the dielectric fins 84 is maintained so that contacts between the sidewalls of the epitaxial source/drain regions 106 and the power rail contacts 74 may be formed. In some embodiments, the epitaxial source/drain regions 106 may be grown along the <010> direction so that lower portions of the source/drain recesses 102 remain between the epitaxial source/drain regions 106 and the dielectric fins 84 are formed. In some embodiments, a post-growth etch back is performed to reform the lower portions of the source/drain recesses 102 separating the epitaxial source/drain regions 106 from the dielectric fins 84. For example, the widths of the epitaxial source/drain regions 106 can be etched to reduce their widths by an amount in the range of about 2 nm to about 20 nm, thus reforming the lower portions of the source/drain recesses 102.

The epitaxial source/drain regions 106 may include one or more semiconductor material layers. For example, the epitaxial source/drain regions 106 may include first semiconductor material layers 106A and second semiconductor material layers 106B. Any number of semiconductor material layers may be used for the epitaxial source/drain regions 106. Each of the first semiconductor material layers 106A and the second semiconductor material layers 106B may be formed of different semiconductor materials and/or may be doped to different dopant concentrations. In some embodiments, the first semiconductor material layers 106A may have a dopant concentration less than the second semiconductor material layers 106B. In embodiments in which the epitaxial source/drain regions 106 include two semiconductor material layers, the first semiconductor material layers 106A may be grown from the fin structures 62, and the second semiconductor material layers 106B may be grown from the first semiconductor material layers 106A.

Figure 18A:
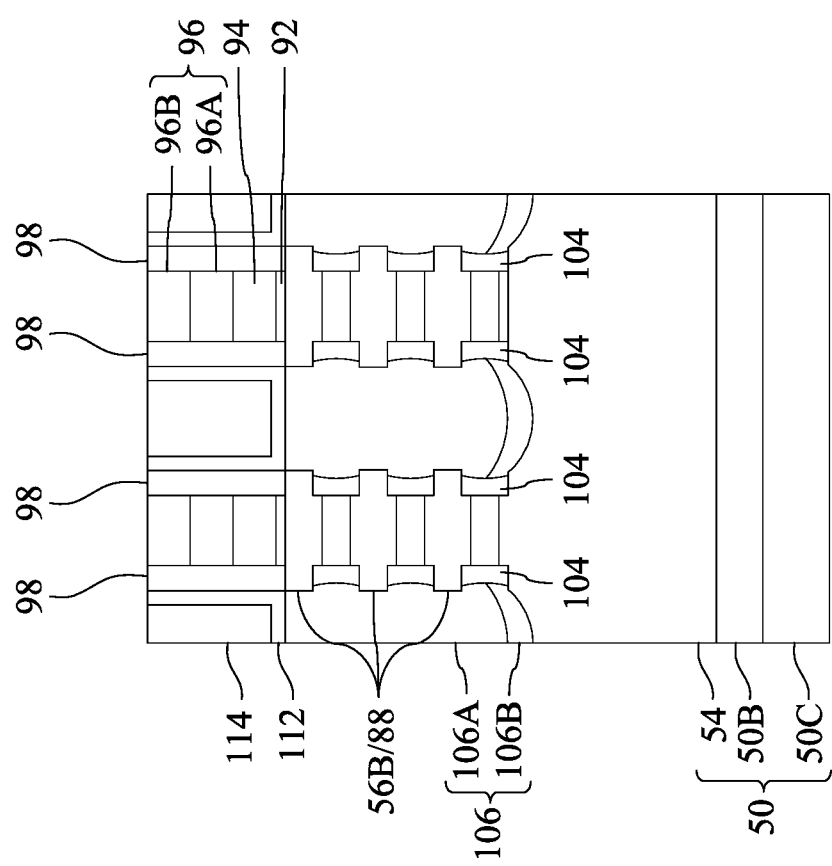
Figure 18C:
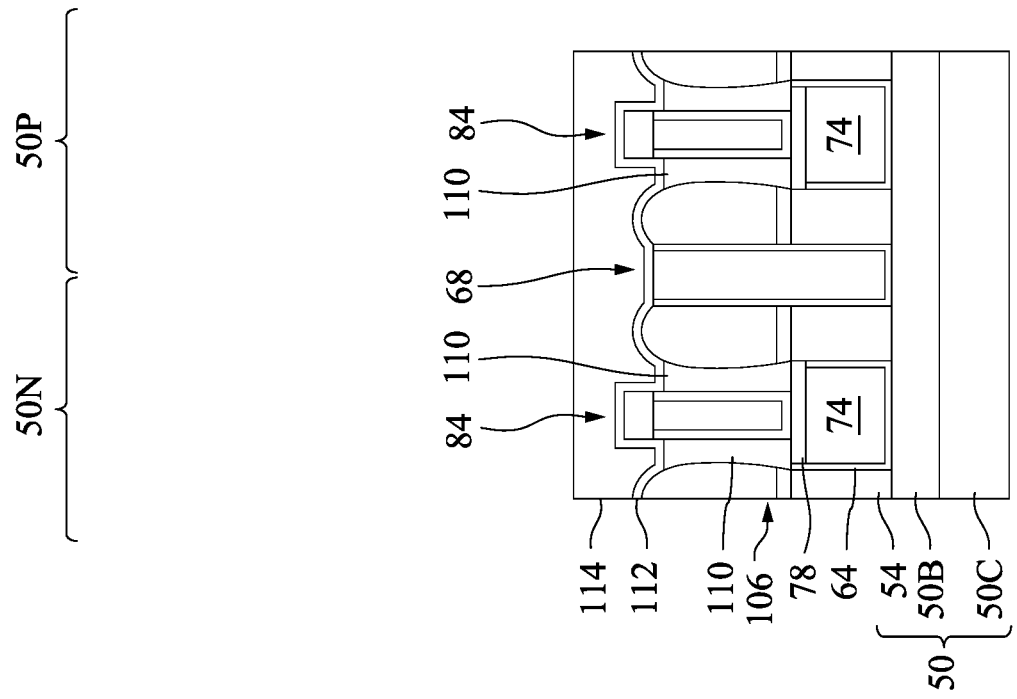
Figure 18B:
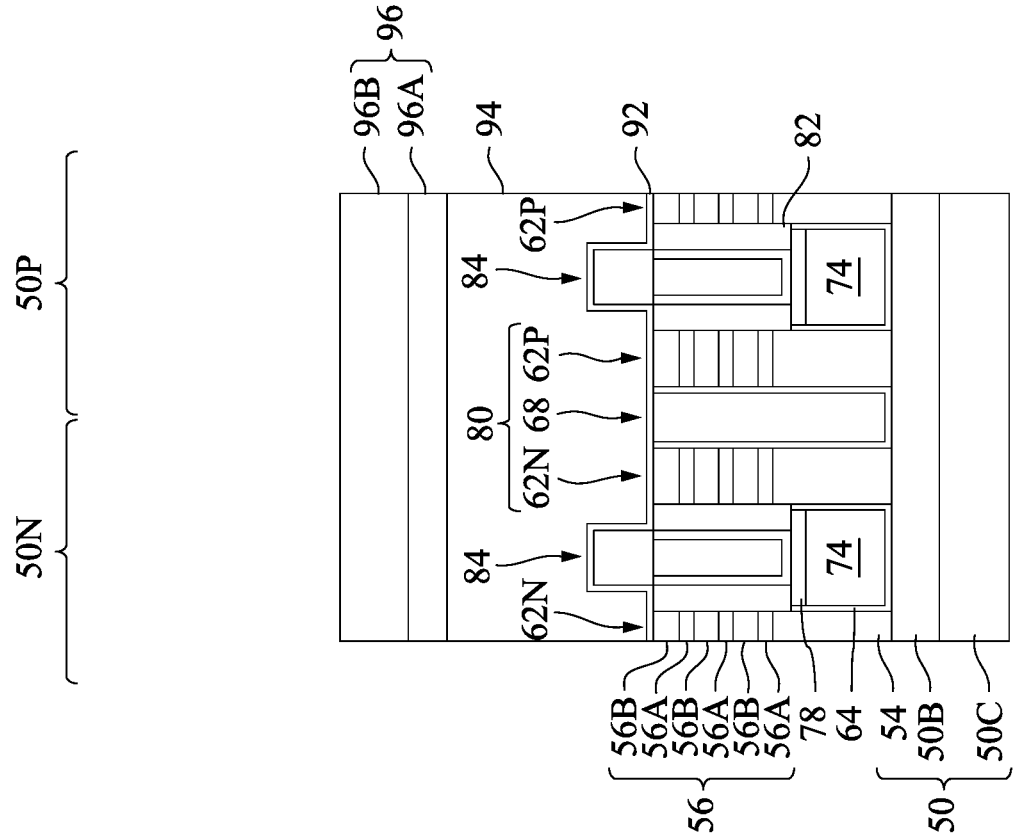

In FIGS. 18A, 18B, and 18C, dielectric layers 110 are formed in the lower portions of the source/drain recesses 102. Each dielectric layer 110 is formed between an epitaxial source/drain region 106 and a corresponding adjacent dielectric fin 84. The dielectric layers 110 may be formed of a low-k dielectric material (such as one selected from the candidate dielectric materials of the liner layer 64), a high-k dielectric material (such as one selected from the candidate dielectric materials of the liner layer 64), combinations thereof, or the like, which may be formed by thermal oxidation or a conformal deposition process (such as one selected from the candidate methods of forming the liner layer 64). A removal process, such as an etch-back process, is then applied to the dielectric layers 110 to remove excess material of the dielectric layers 110 outside of the lower portions of the source/drain recesses 102, e.g., those portions over the epitaxial source/drain regions 106.

A first ILD 114 is then formed over the dielectric layers 110, the epitaxial source/drain regions 106, and the dielectric fins 84. The first ILD 114 may be formed by depositing a dielectric material over the dielectric layers 110, the epitaxial source/drain regions 106, the gate spacers 98, the masks 96 (if present) or the dummy gates 94, and the dielectric fins 84, and subsequently planarizing the dielectric material. Acceptable dielectric materials may include oxides such as silicon oxide, phosphosilicate glass (PSG), borosilicate glass (BSG), boron-doped phosphosilicate glass (BPSG), undoped Silicate Glass (USG), or the like; nitrides such as silicon nitride; or the like. Other insulation materials may be used. The deposition may be by any suitable method, such as CVD, plasma-enhanced CVD (PECVD), or FCVD. Other acceptable processes may be used to form the dielectric material. The planarization may be by any suitable method, such as a CMP, an etch-back process, combinations thereof, or the like. The planarization process levels the top surface of the first ILD 114 with the top surfaces of the masks 96 (if present) or the dummy gates 94. The planarization process may also remove the masks 96 and portions of the gate spacers 98 along sidewalls of the masks 96. After the planarization process, the top surfaces of the first ILD 114, the gate spacers 98, and the masks 96 (if present) or the dummy gates 94 are coplanar (within process variations). Accordingly, the top surfaces of the masks 96 (if present) or the dummy gates 94 are exposed through the first ILD 114. In the illustrated embodiment, the masks 96 remain, and the planarization process levels the top surface of the first ILD 114 with the top surfaces of the masks 96.

In some embodiments, a contact etch stop layer (CESL) 112 is disposed between the first ILD 114 and the dielectric layers 110, the epitaxial source/drain regions 106, the gate spacers 98, the dielectric fins 84, and the dielectric walls 68. The CESL 112 may include a dielectric material, such as, silicon nitride, silicon oxide, silicon oxynitride, or the like, having a high etching selectivity from the etching of the first ILD 114 and the dielectric layers 110.

As will be discussed in greater detail below, portions of the dielectric layers 110 (e.g., those in the cross-section of FIG. 18C) will be replaced with contacts between the sidewalls of the epitaxial source/drain regions 106 and the power rail contacts 74. Forming the dielectric layers 110 adjacent the epitaxial source/drain regions 106 may increase manufacturing costs as compared to forming the CESL 112 and the first ILD 114 adjacent the epitaxial source/drain regions 106. However, inclusion of the dielectric layers 110 allows better control of an etching process that will be used to expose the top surfaces of the power rail contacts 74. Manufacturing yields may thus be increased, decreasing overall manufacturing costs by more than the cost of forming the dielectric layers 110.

Figure 19A:
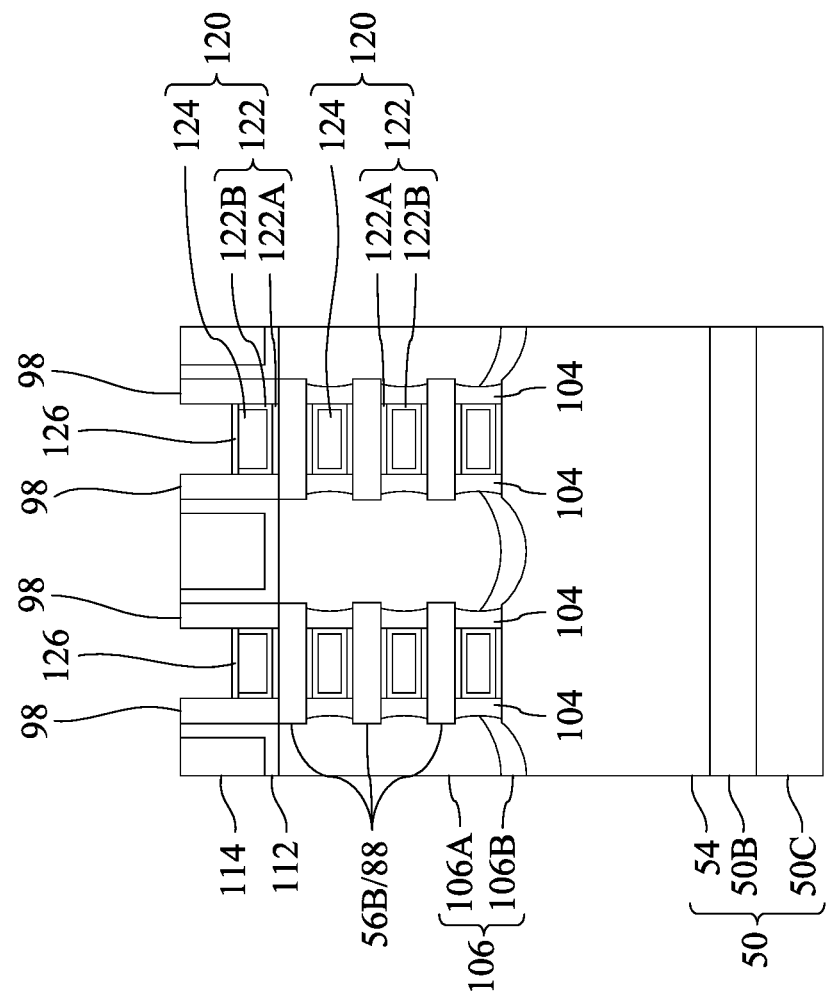
Figure 19B:
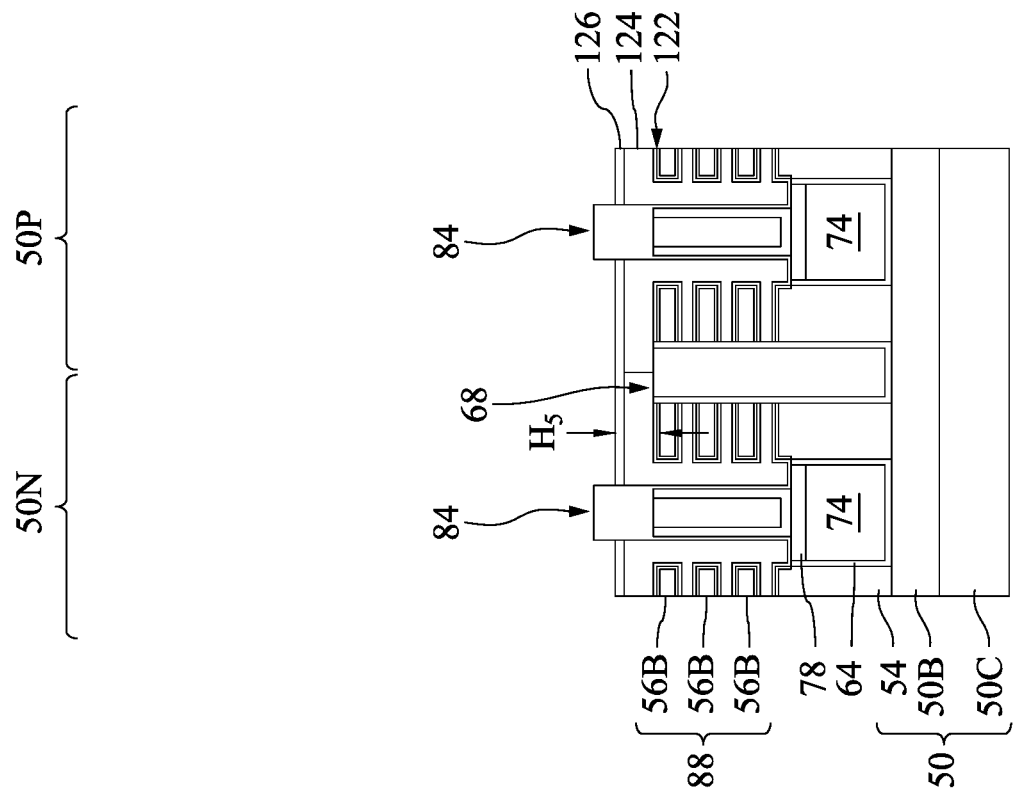
Figure 19C:
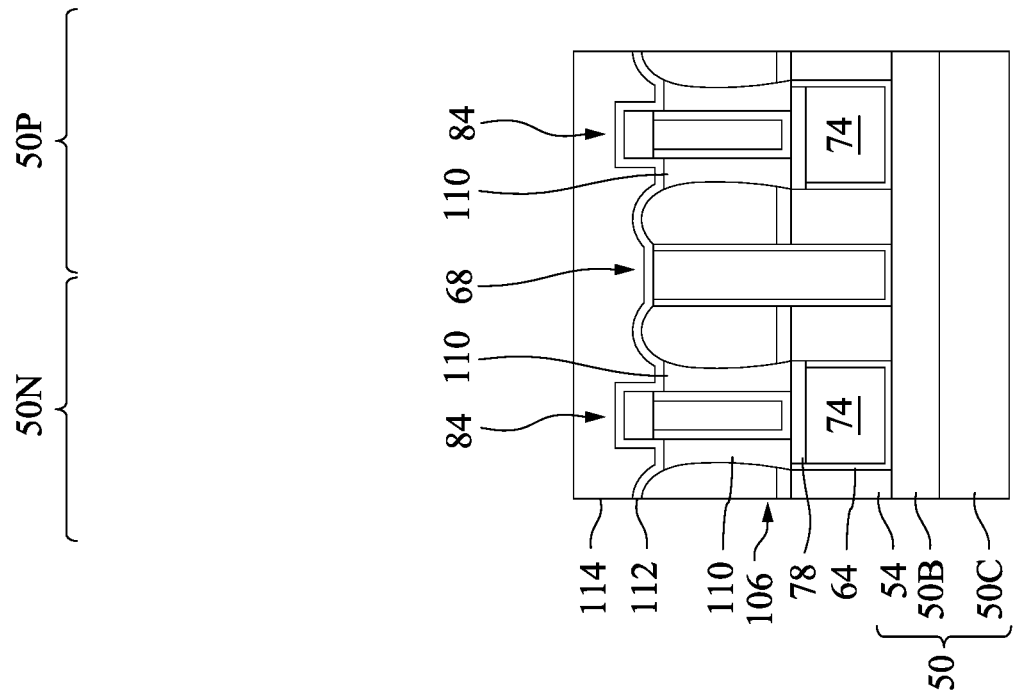

In FIGS. 19A, 19B, and 19C, the masks 96 (if present), the dummy gates 94, the dummy dielectrics 92, the channel spacers 82, and the first nanostructures 56A are removed and replaced with gate structures 120. The gate structures 120 include gate dielectrics 122 and gate electrodes 124 on the gate dielectrics 122. The gate structures 120 may also be referred to as "gate stacks."

The masks 96 (if present) and the dummy gates 94 are removed in an etching process, so that recesses are formed. Portions of the dummy dielectrics 92 in the recesses may also be removed. In some embodiments, the dummy gates 94 are removed by an anisotropic dry etch process. For example, the etching process may include a dry etch process using reaction gas(es) that selectively etch the dummy gates 94 at a faster rate than the first ILD 114 or the gate spacers 98. During the removal, the dummy dielectrics 92 may be used as etch stop layers when the dummy gates 94 are etched. The dummy dielectric dielectrics 92 may then be removed after the removal of the dummy gates 94. Each recess exposes and/or overlies portions of the second nanostructures 56B which act as the channel regions 88. The portions of the second nanostructures 56B which will act as the channel regions 88 are disposed between neighboring pairs of the epitaxial source/drain regions 106.

The channel spacers 82 and the remaining portions of the first nanostructures 56A are then removed to expand the recesses. The channel spacers 82 and the remaining portions of the first nanostructures 56A can be removed by an acceptable etching process that selectively etches the material(s) of the channel spacers 82 and the first nanostructures 56A at a faster rate than the material(s) of the second nanostructures 56B, the semiconductor fins 54, the STI regions 78, the dielectric fins 84, and the dielectric walls 68. The etching may be isotropic. For example, when the semiconductor fins 54 and the second nanostructures 56B are formed of silicon and the channel spacers 82 and the first nanostructures 56A are formed of silicon germanium, the etching process may be a wet etch using tetramethylammonium hydroxide (TMAH), ammonium hydroxide ($NH_4OH$), or the like.

The exposed portions of the second nanostructures 56B and the semiconductor fins 54 are optionally trimmed. The trimming reduces the thicknesses of the exposed portions of the second nanostructures 56B. For example, the trimming can reduce the second thickness $T_2$ (see FIG. 3) of the second nanostructures 56B by an amount in the range of about 40% to about 70%, and can also reduce the width of the exposed portions of the semiconductor fins 54. The trimming may be performed concurrently with the formation of the recesses, or may be performed after the recesses are formed. For example, the exposed portions of the second nanostructures 56B and the semiconductor fins 54 may be trimmed by an acceptable etching process that selectively etches the material(s) of the second nanostructures 56B and the semiconductor fins 54 at a faster rate than the materials of the inner spacers 104, the gate spacers 98, the dielectric fins 84, and the dielectric walls 68. The etching may be isotropic. For example, when the semiconductor fins 54 and the second nanostructures 56B are formed of silicon and the channel spacers 82 and the first nanostructures 56A are formed of silicon germanium, the trimming process may be a wet etch using a diluted ammonium hydroxide-hydrogen peroxide mixture (APM), a sulfuric acid-hydrogen peroxide mixture (SPM), or the like.

Gate dielectrics 122 and gate electrodes 124 are formed for replacement gates. The gate dielectrics 122 are deposited conformally in the recesses, such as on top surfaces and sidewalls of the semiconductor fins 54 and on top surfaces, sidewalls, and bottom surfaces of the second nanostructures 56B. The gate dielectrics 122 may also be deposited on top surfaces of the STI regions 78 and on sidewalls of the dielectric fins 84 and the dielectric walls 68.

The gate dielectrics 122 include one or more dielectric layers, such as an oxide, a metal oxide, a metal silicate, the like, or combinations thereof. In some embodiments, the gate dielectrics 122 include silicon oxide, silicon nitride, or multilayers thereof. In some embodiments, the gate dielectrics 122 include a high-k dielectric material, and in these embodiments, the gate dielectrics 122 may have a k value greater than about 7.0, and may include a metal oxide or a silicate of hafnium, aluminum, zirconium, lanthanum, manganese, barium, titanium, lead, and combinations thereof. The gate dielectrics 122 can be multilayered. For example, in some embodiments, the gate dielectrics 122 may each include an interfacial layer 122A of silicon oxide formed by thermal or chemical oxidation and a metal oxide layer 122B over the interfacial layer. The formation methods of the gate dielectrics 122 may include molecular-beam deposition (MBD), ALD, PECVD, and the like.

The gate electrodes 124 are deposited over the gate dielectrics 122, respectively, and fill the remaining portions of the recesses. The gate electrodes 124 may include a metal-containing material such as titanium nitride, titanium oxide, tantalum nitride, tantalum carbide, cobalt, ruthenium, aluminum, tungsten, combinations thereof, or multi-layers thereof. For example, although single layered gate electrodes 124 are illustrated, the gate electrodes 124 may comprise any number of liner layers, any number of work function tuning layers, and a fill material. Any combination of the layers which make up the gate electrodes 124 may be deposited in the areas between each of the second nanostructures 56B and between the semiconductor fins 54 and the second nanostructures 56B. The formation methods of the gate electrodes 124 may include ALD, PECVD, and the like.

After the filling of the recesses, a planarization process, such as a CMP, may be performed to remove the excess portions of the materials of the gate dielectrics 122 and the gate electrodes 124, which excess portions are over the top surfaces of the first ILD 114 and the gate spacers 98. A recess process, such as an etch back, may then be performed to recess the top surfaces of the gate dielectrics 122 and the gate electrodes 124 from the top surfaces of the of the dielectric fins 84. Timed etch processes may be used to stop the etching of the gate dielectrics 122 and the gate electrodes 124 so that the top surfaces of the gate electrodes 124 have a desired height $H_5$ with respect to a topmost second nanostructure 56B. The height $H_5$ can be in the range of about 6 nm to about 30 nm. The remaining portions of the materials of the gate dielectrics 122 and the gate electrodes 124 thus form the replacement gate structures 120 of the resulting nano-FETs.

An etch stop layer 126 is then deposited over the recessed gate structures 120. The etch stop layer 126 may include a conductive material, such as tungsten, ruthenium, cobalt, copper, molybdenum, nickel, combinations thereof, or the like, having a different etch rate than a subsequently formed gate mask, which may be deposited by ALD, CVD, PVD, or the like. In some embodiments, the etch stop layer 126 is formed of tungsten, such as fluorine-free tungsten, which is deposited by a selective deposition process, such as a selective CVD process. Because the etch stop layer 126 is formed of a conductive material, it can act to stop etching, and can also be used to tune the contact resistance to the gate structures 120.

The formation of the gate dielectrics 122 in the region 50N and the region 50P may occur simultaneously such that the gate dielectrics 122 in each region are formed from the same materials, and the formation of the gate electrodes 124 may occur simultaneously such that the gate electrodes 124 in each region are formed from the same materials. In some embodiments, the gate dielectrics 122 in each region may be formed by distinct processes, such that the gate dielectrics 122 may be different materials, and/or the gate electrodes 124 in each region may be formed by distinct processes, such that the gate electrodes 124 may be different materials. Various masking steps may be used to mask and expose appropriate regions when using distinct processes. For example, in the illustrated embodiment, gate electrodes 124 of different materials are formed in the region 50N and the region 50P.

As shown in FIG. 19B, the gate electrodes 124 around the channel regions 88 of a same forksheet structure 80 can be physically and electrically coupled. Such coupling may be advantageous in some CMOS processes. For example, when the nano-FETs are used to form inverters, gates, memories, and the like, directly connecting the gate electrodes 124 may allow for a reduction in the quantity of gate contacts. The gate electrodes 124 around the channel regions 88 of adjacent forksheet structure 80 are physically and electrically separated by the dielectric fins 84.

Figure 20A:
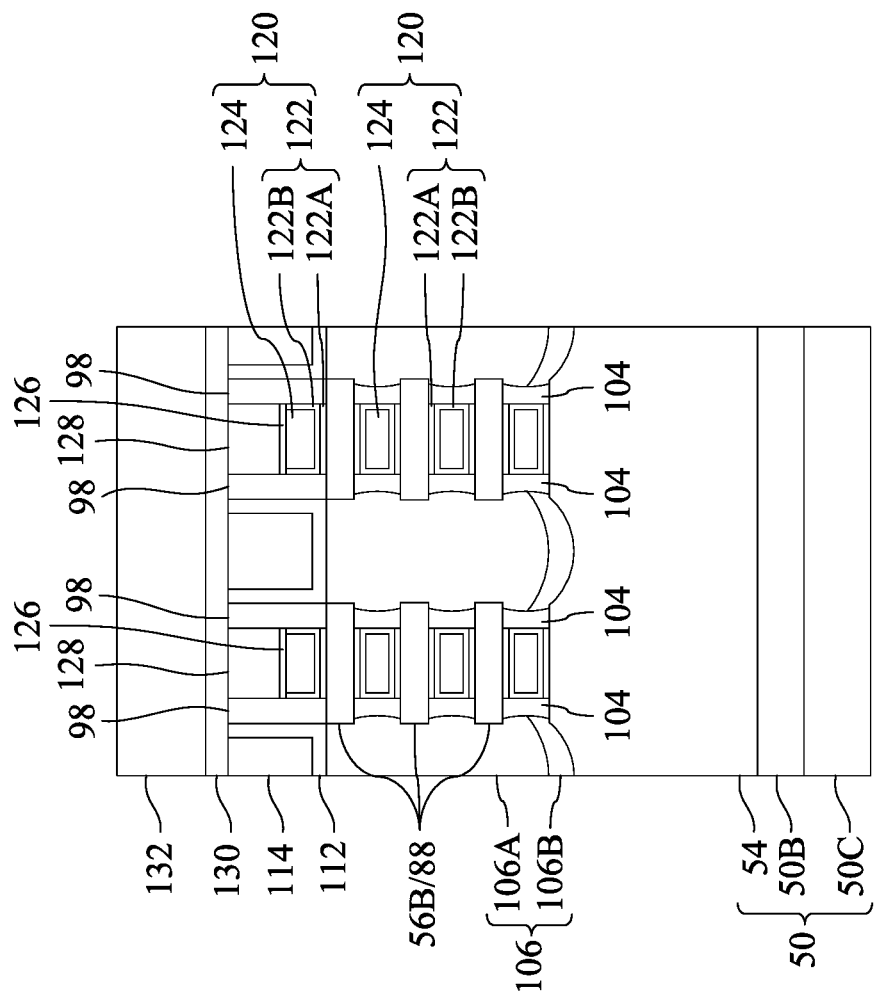
Figure 20C:
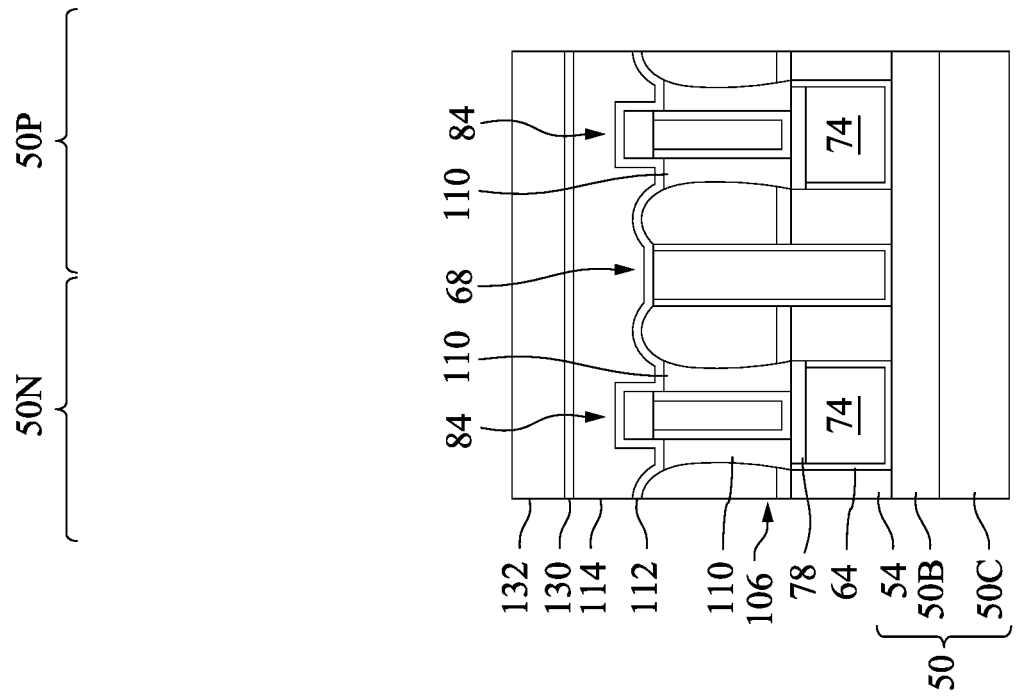
Figure 20B:
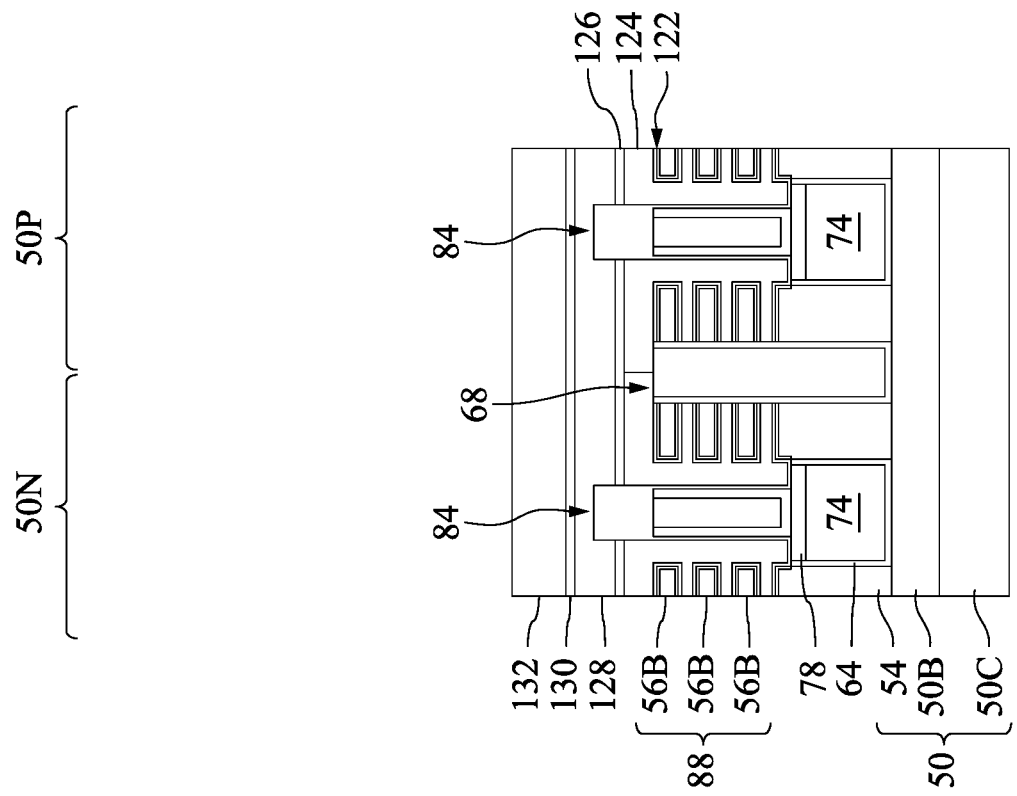

In FIGS. 20A, 20B, and 20C, a gate mask 128 is formed over each gate structure 120, e.g., on each etch stop layer 126. Each gate mask 128 is thus disposed between opposing portions of the gate spacers 98. In some embodiments, forming the gate masks 128 includes forming a dielectric material over the recessed gate structures 120 and then performing a planarization process to remove excess portions of the dielectric material extending over the first ILD 114. The dielectric material may be a low-k dielectric material (such as one selected from the candidate dielectric materials of the liner layer 64), which may be deposited by a conformal deposition process (such as one selected from the candidate methods of forming the liner layer 64).

A second ILD 132 is then deposited over the gate masks 128, the first ILD 114, and the gate spacers 98. The second ILD 132 may be formed of a material that is selected from the same group of candidate materials of the first ILD 114, and may be deposited using a method that is selected from the same group of candidate methods for depositing the first ILD 114. The first ILD 114 and the second ILD 132 may be formed from the same material, or may include different materials. After formation, the second ILD 132 can be planarized, such as by a CMP.

In some embodiments, an etch stop layer 130 is formed between the second ILD 132 and each of the gate masks 128, the first ILD 114, and the gate spacers 98. The etch stop layer 130 may include a dielectric material, such as silicon nitride, silicon oxide, silicon oxynitride, or the like, having a different etch rate than the material of the second ILD 132.

Figure 21A:
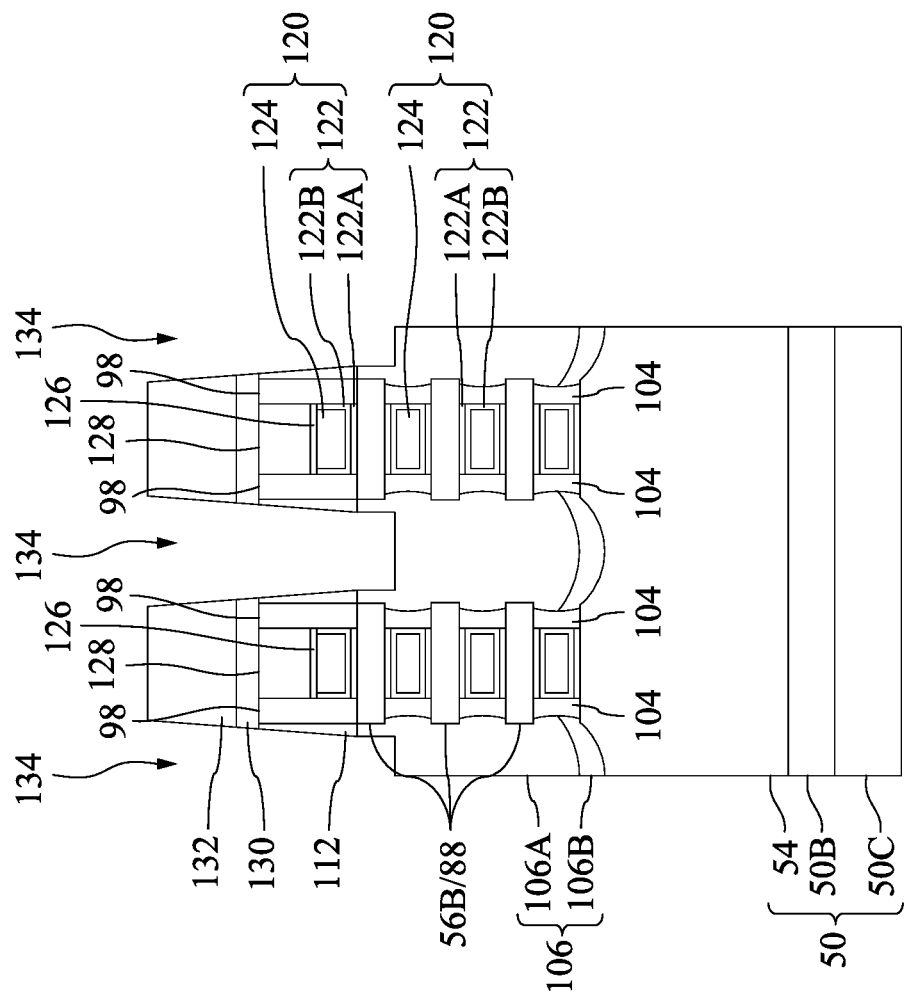
Figure 21C:
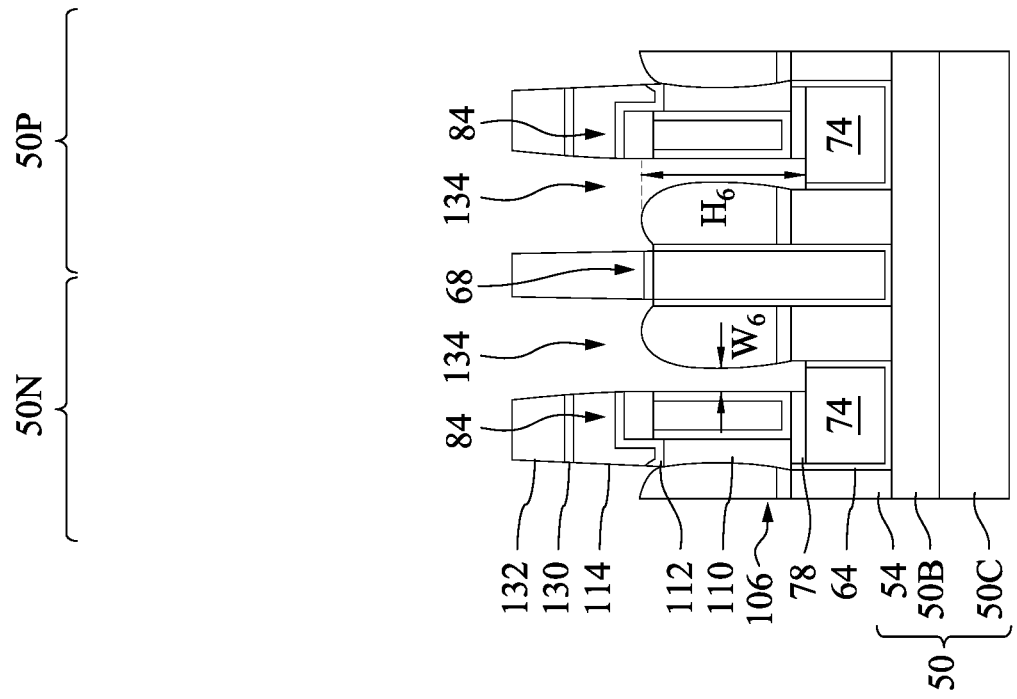
Figure 21B:
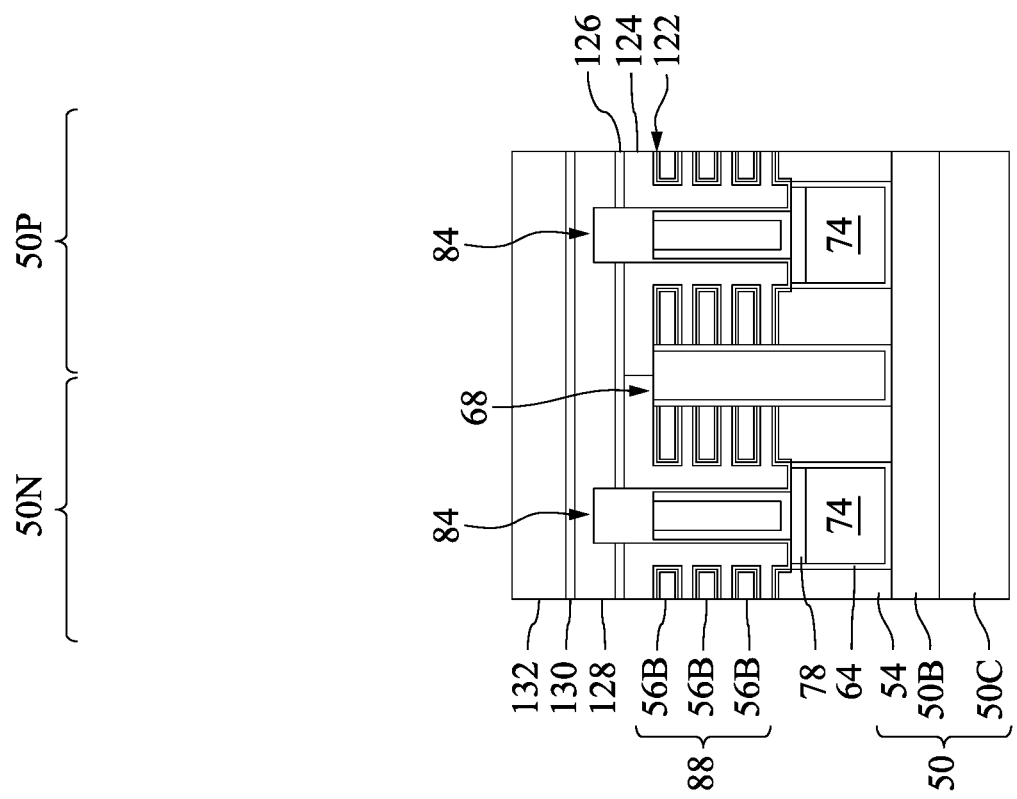

In FIGS. 21A, 21B, and 21C, source/drain contact openings 134 are formed in the second ILD 132, the etch stop layer 130, the first ILD 114, the CESL 112, the dielectric layers 110, and the STI regions 78. The source/drain contact openings 134 expose the faceted top and side surfaces of the epitaxial source/drain regions 106. The source/drain contact openings 134 also expose the top surfaces of the power rail contacts 74 and may expose portions of the sidewalls of the semiconductor fins 54. The source/drain contact openings 134 may be formed using acceptable photolithography and etching techniques. Multiple etching steps may be used to form the source/drain contact openings 134. As noted above, the CESL 112 is formed of a material having a high etching selectivity from the etching of the dielectric layers 110. One of the etching steps used to form the source/drain contact openings is an etching process that is selective to the dielectric layers 110 (e.g., etches the material(s) of the dielectric layers 110 at a faster rate than the material(s) of the CESL 112). The aspect ratio of the lower portions of the source/drain contact openings 134 may thus be improved, helping ensure sufficient area of the top surfaces of the power rail contacts 74 is exposed, which can reduce contact resistance of the nano-FETs. Specifically, the lower portions of the source/drain contact openings 134 can have a width $W_6$ (measured between the sidewalls of the dielectric fins 84 and the side surfaces of the epitaxial source/drain regions 106) in the range of about 4 nm to about 20 nm, and the lower portions of the source/drain contact openings 134 can have a height $H_6$ (measured between the top surfaces of the power rail contacts 74 and the top surfaces of the epitaxial source/drain regions 106) in the range of about 32 nm to about 80 nm, with the ratio of the height $H_6$ to the width $W_6$ being in the range of about 1.6:1 to about 20:1.

In the illustrated embodiment, the source/drain contact openings 134 are formed in a self-aligned patterning method so that all of the first ILD 114 is removed in the cross-section of FIG. 21A. In another embodiment, other patterning methods may be used so that some of the first ILD 114 remains in the cross-section of FIG. 21A.

In the embodiment illustrated in FIG. 21A, etching of the epitaxial source/drain regions 106 occurs so that the source/drain contact openings 134 extend partially into the epitaxial source/drain regions 106. In another embodiment, the source/drain contact openings 134 do not extend into the epitaxial source/drain regions 106.

Figure 22A:
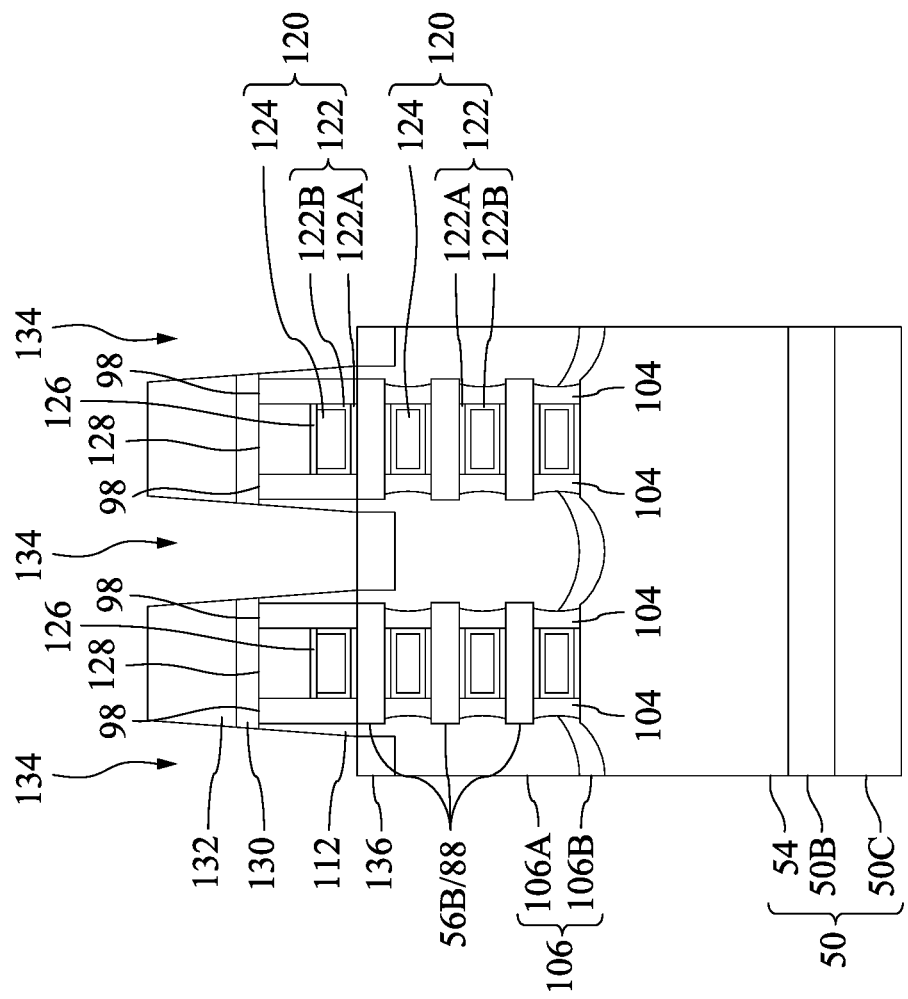
Figure 22C:
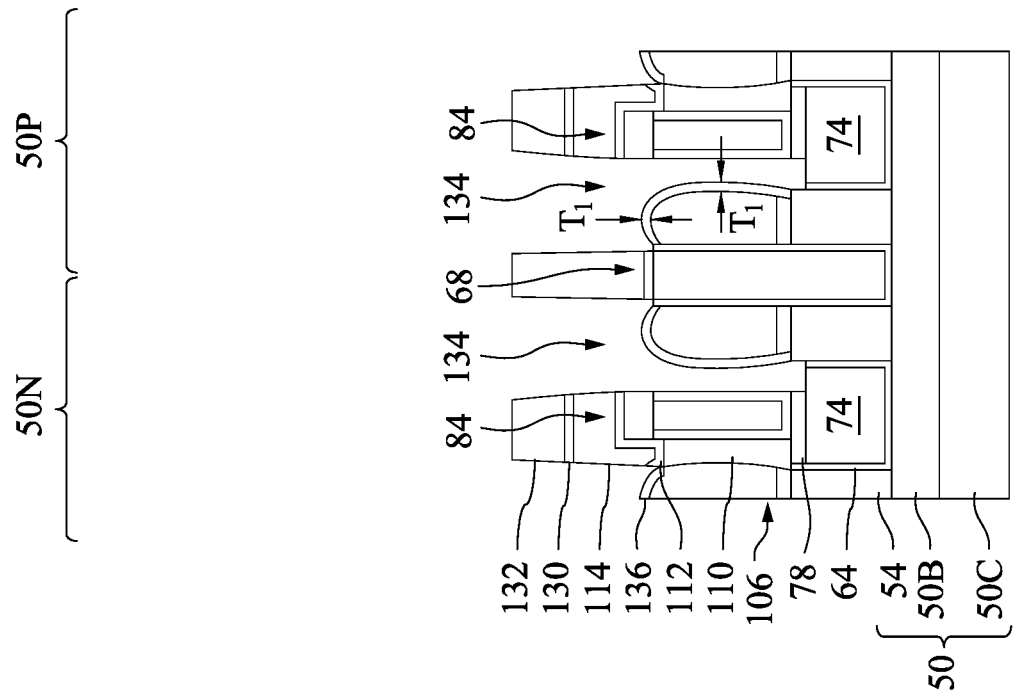
Figure 22B:
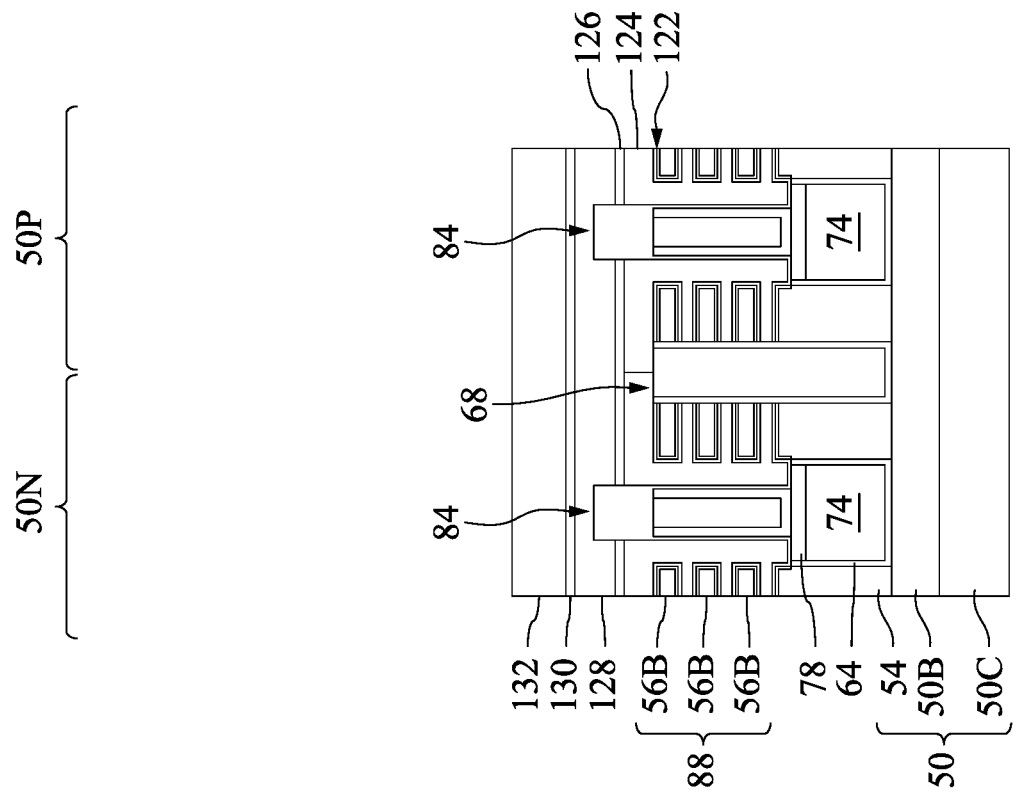

In FIGS. 22A, 22B, and 22C, metal-semiconductor alloy regions 136 are optionally formed in the source/drain contact openings 134, such as on portions of the epitaxial source/drain regions 106 exposed by the source/drain contact openings 134. The metal-semiconductor alloy regions 136 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 136 can be formed by depositing a metal in the source/drain contact openings 134 and then performing a thermal anneal process. The metal can be any metal capable of reacting with the semiconductor materials (e.g., silicon, silicon germanium, germanium, etc.) of the epitaxial source/drain regions 106 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like, and can be deposited to a thickness in the range of about 1 nm to about 10 nm. In an embodiment, the metal-semiconductor alloy regions 136 are silicide regions formed of titanium-silicon. After the thermal anneal process, a cleaning process, such as a wet clean, may be performed to remove any residual metal from the source/drain contact openings 134, such as from surfaces of the power rail contacts 74, the STI regions 78, and the semiconductor fins 54.

The metal-semiconductor alloy regions 136 can be formed to a desired thickness by controlled the thickness of the metal deposited to form the metal-semiconductor alloy regions 136. The metal-semiconductor alloy regions 136 can have a thickness $T_1$ in the range of about 2.5 nm to about 7.5 nm. In some embodiments, the metal used to form the metal-semiconductor alloy regions 136 is deposited by a uniform deposition process, such as ALD, such that the metal-semiconductor alloy regions 136 have uniform thicknesses. In some embodiments, the metal used to form the metal-semiconductor alloy regions 136 is deposited by a non-uniform deposition process, such as PVD, such that the metal-semiconductor alloy regions 136 have non-uniform thicknesses. For example, the portions of the metal-semiconductor alloy regions 136 on the top surfaces of the epitaxial source/drain regions 106 can have a larger thickness $T_1$ than the portions of the metal-semiconductor alloy regions 136 on the side surfaces of the epitaxial source/drain regions 106. Forming the metal-semiconductor alloy regions 136 on the top and side surfaces of the epitaxial source/drain regions 106 can increase the contact area to the epitaxial source/drain regions 106, helping lower the contact resistance as compared to only forming the metal-semiconductor alloy regions 136 on the top surfaces of the epitaxial source/drain regions 106.

Figure 23A:
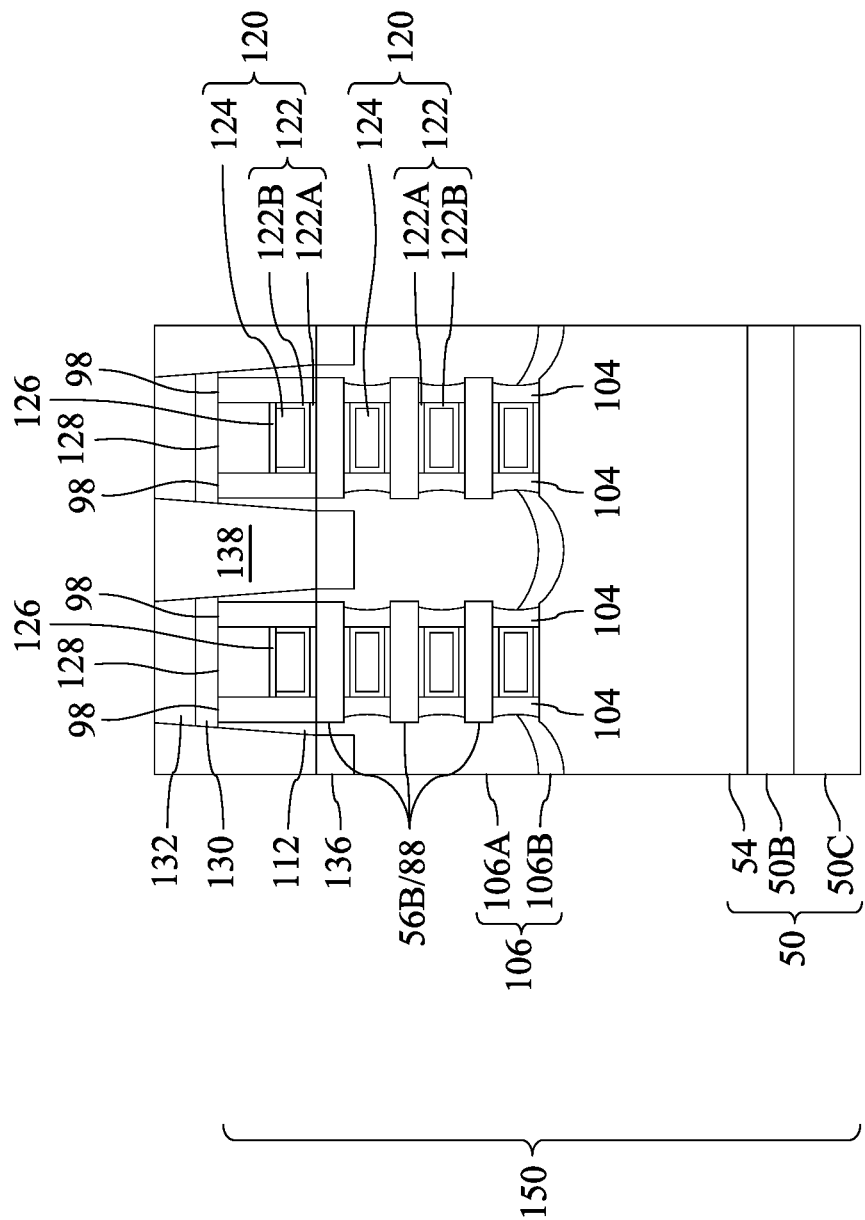
Figure 23C:
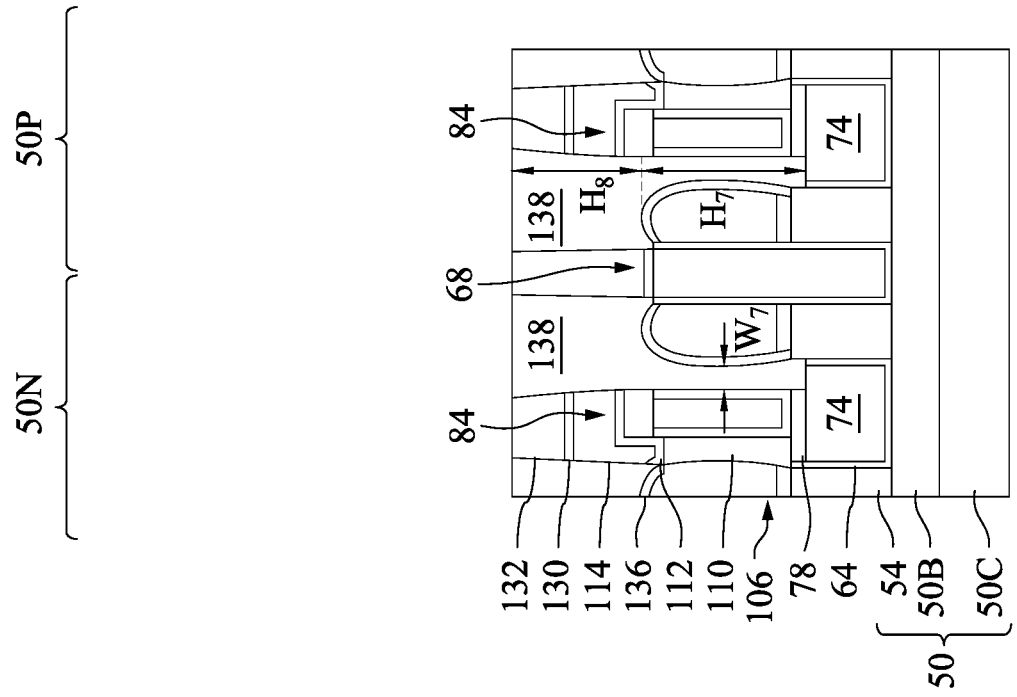
Figure 23B:
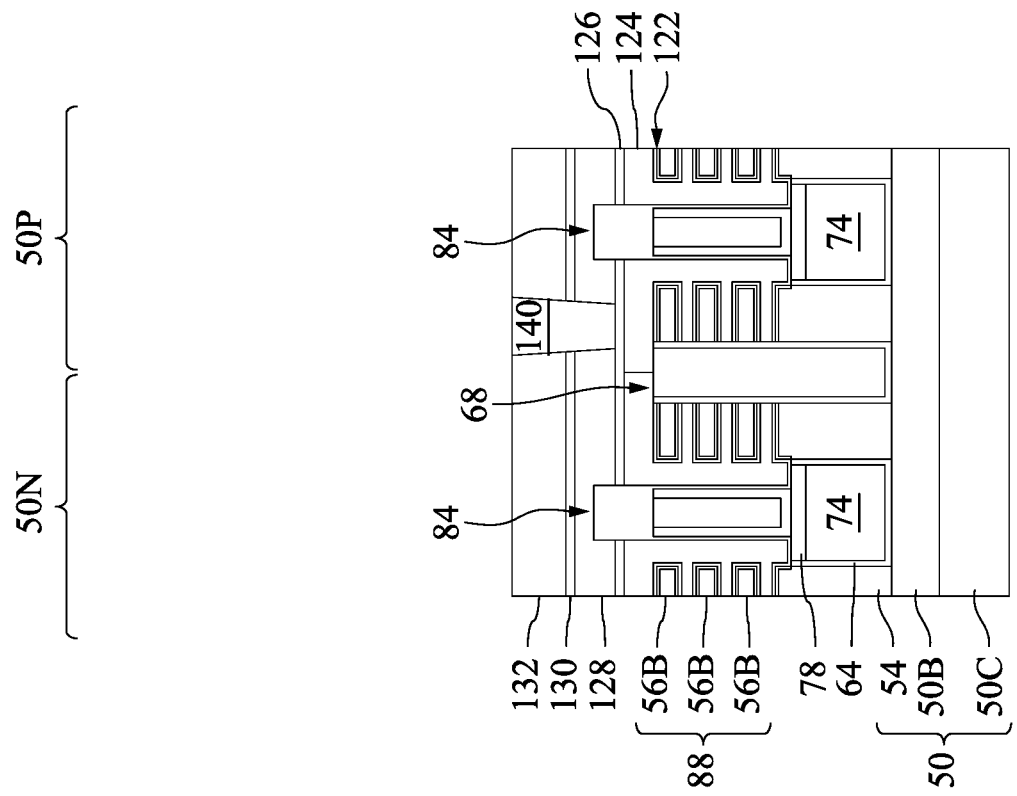

In FIGS. 23A, 23B, and 23C, source/drain contacts 138 are formed in the source/drain contact openings 134. A liner, such as a diffusion barrier layer, an adhesion layer, or the like, and a conductive material are formed in the source/drain contact openings 134. The liner may include titanium, titanium nitride, tantalum, tantalum nitride, or the like. The liner may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. The conductive material may be tungsten, ruthenium, cobalt, copper, molybdenum, nickel, combinations thereof, or the like. The conductive material may be deposited by ALD, CVD, PVD, or the like. A planarization process, such as a CMP, may be performed to remove excess material from the top surface of the second ILD 132. The remaining liner and conductive material in the source/drain contact openings 134 forms the source/drain contacts 138. The source/drain contacts 138 are physically and electrically coupled to the power rail contacts 74 and the metal-semiconductor alloy regions 136 (if present) or the epitaxial source/drain regions 106.

The source/drain contacts 138 have lower portions (between the dielectric fins 84 and the epitaxial source/drain regions 106) and upper portions (above the epitaxial source/drain regions 106). The lower portions of the source/drain contacts 138 can have a width $W_7$ (measured between the sidewalls of the dielectric fins 84 and the side surfaces of the metal-semiconductor alloy regions 136) in the range of about 4 nm to about 20 nm, and the lower portions of the source/drain contacts 138 can have a height $H_7$ (measured between the top surfaces of the power rail contacts 74 and the top surfaces of the metal-semiconductor alloy regions 136) in the range of about 32 nm to about 80 nm. The upper portions of the source/drain contacts 138 can have a height $H_8$ (measured between the top surfaces of the source/drain contacts 138 and the top surfaces of the metal-semiconductor alloy regions 136) in the range of about 1 nm to about 50 nm.

The source/drain contacts 138 connect the epitaxial source/drain regions 106 to the power rail contacts 74. Thus, no metal-semiconductor alloy regions need to be formed on the power rail contacts 74. In other words, all surfaces of the power rail contact 74 are free of metal-semiconductor alloy regions. Manufacturing costs may thus be reduced.

Gate contacts 140 are also formed extending through the second ILD 132, the etch stop layer 130, the gate masks 128, and the etch stop layer 126. As an example to form the gate contacts 140, contact openings are formed through the second ILD 132, the etch stop layer 130, the gate masks 128, and the etch stop layer 126. The contact openings may be formed using acceptable photolithography and etching techniques. A liner, such as a diffusion barrier layer, an adhesion layer, or the like, and a conductive material are formed in the contact openings. The liner may include titanium, titanium nitride, tantalum, tantalum nitride, or the like. The liner may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. The conductive material may be tungsten, cobalt, ruthenium, aluminum, nickel, copper, a copper alloy, silver, gold, or the like. The conductive material may be deposited by ALD, CVD, PVD, or the like. A planarization process, such as a CMP, may be performed to remove excess material from the top surface of the second ILD 132. The remaining liner and conductive material in the contact openings forms the gate contacts 140. The gate contacts 140 are physically and electrically coupled to the gate electrodes 124. The gate contacts 140 can have an overall height in the range of about 1 nm to about 50 nm.

The gate contacts 140 may be formed before, with, or after the source/drain contacts 138. After formation is complete, the top surfaces of the second ILD 132, the source/drain contacts 138, and the gate contacts 140 are coplanar (within process variations). In the illustrated embodiment, the source/drain contacts 138 and the gate contacts 140 are formed in different cross-sections, thereby reducing the risk of contact shorting. In another embodiment, some or all of the source/drain contacts 138 and the gate contacts 140 can be formed in the same cross-sections.

As will be discussed in greater detail below, a first interconnect structure (e.g., a front-side interconnect structure) will be formed over the substrate 50. Some or all of the substrate 50 will then be removed and replaced with a second interconnect structure (e.g., a back-side interconnect structure). Thus, a device layer 150 of active devices is formed between a front-side interconnect structure and a back-side interconnect structure. The front-side and back-side interconnect structures each comprise conductive features that are electrically connected to the nano-FETs of the device layer 150. The conductive features (e.g., metallization patterns, also referred to as interconnects) of the front-side interconnect structure will be electrically connected to front-sides of the epitaxial source/drain regions 106 and the gate electrodes 124 to form functional circuits, such as logic circuits, memory circuits, image sensor circuits, or the like. The conductive features (e.g., power rails) of the back-side interconnect structure will be electrically connected to back-sides of the epitaxial source/drain regions 106 to provide a reference voltage, supply voltage, or the like to the functional circuits. Although the device layer 150 is described as having nano-FETs, other embodiments may include a device layer 150 having a different type of transistor (e.g., planar FETs, FinFETs, TFTs, or the like).

FIGS. 24A through 29C are cross-sectional views of intermediate stages in the manufacturing of semiconductor devices, in accordance with some embodiments. Specifically, the manufacturing of a device layer of nano-FETs is illustrated. FIGS. 23A, 24A, 25A, 26A, 27A, 28A, and 29A are cross-sectional views illustrated along reference cross-section A-A in FIG. 1, except two gate structures are shown. FIGS. 23B, 24B, 25B, 26B, 27B, 28B, and 29B are cross-sectional views illustrated along reference cross-section B-B in FIG. 1, except four fins are shown. FIGS. 23C, 24C, 25C, 26C, 27C, 28C, and 29C are cross-sectional views illustrated along reference cross-section C-C in FIG. 1, except four fins are shown. FIGS. 23A, 24A, 25A, 26A, 27A, 28A, and 29A may be applicable to both the n-type region 50N and the p-type region 50P. Differences (if any) in the structures of the n-type region 50N and the p-type region 50P are described in the text accompanying each figure.

Figure 24A:
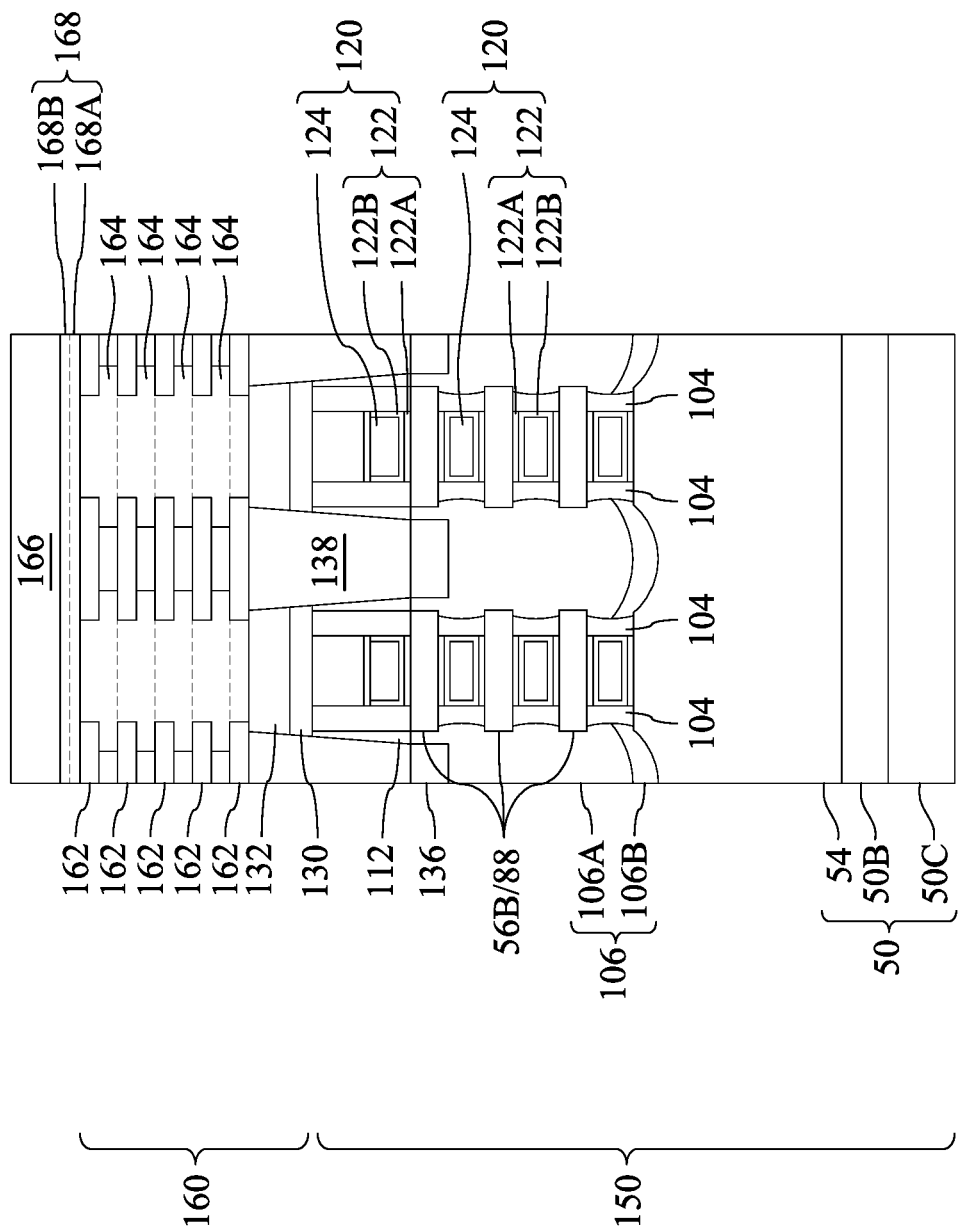
FIGS. 24A through 29C are various views of further intermediate stages in the manufacturing of semiconductor devices, in accordance with some embodiments.
Figure 24C:
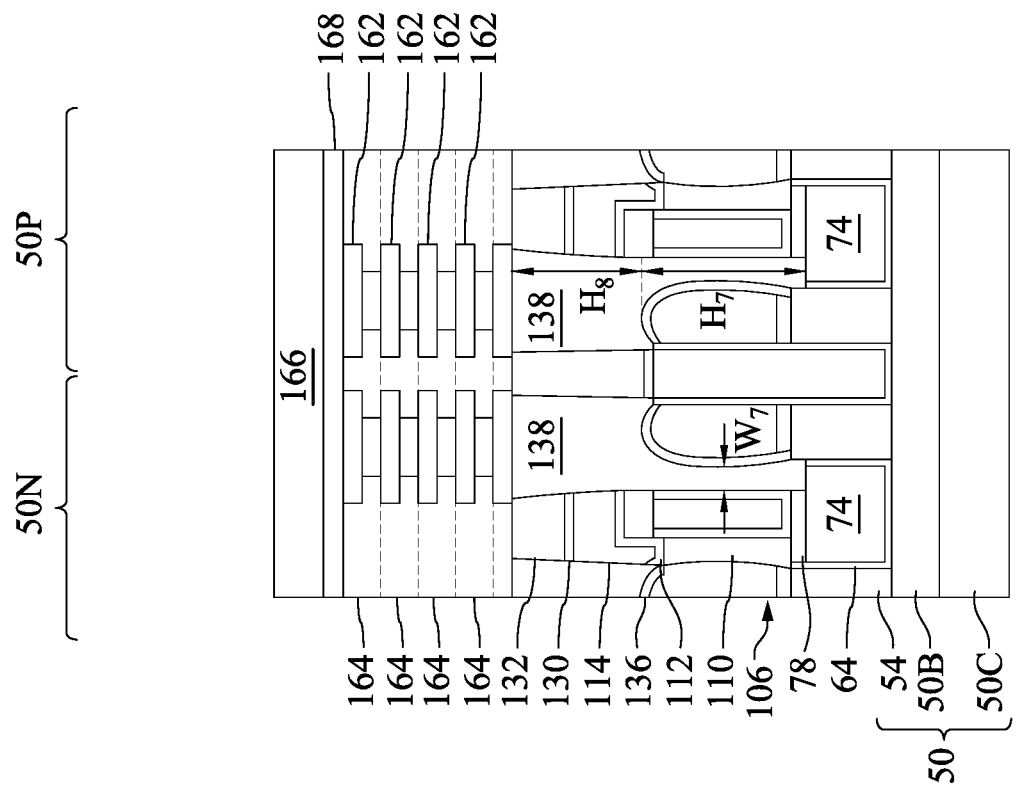
Figure 24B:
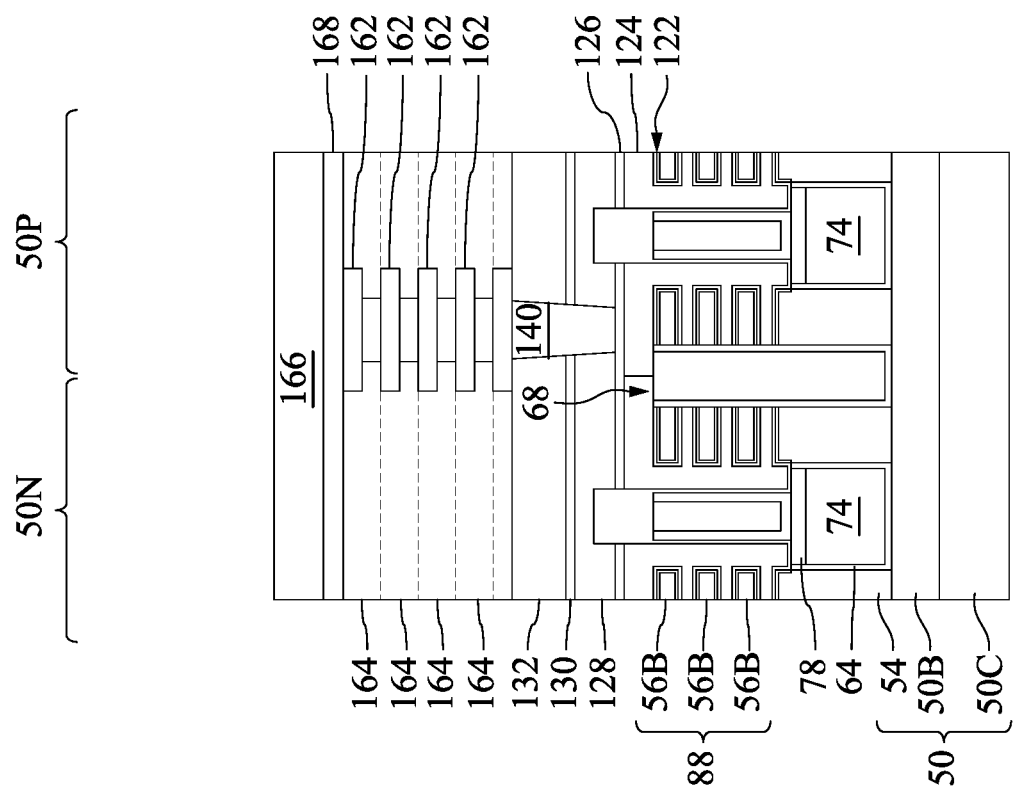

In FIGS. 24A, 24B, and 24C, an interconnect structure 160 is formed on the device layer 150, e.g., on the second ILD 132. The interconnect structure 160 may also be referred to as a front-side interconnect structure because it is formed at a front-side of the substrate 50/the device layer 150 (e.g., a side of the substrate 50 on which the device layer 150 is formed, e.g., the side having the semiconductor layer 50A).

The interconnect structure 160 may comprise one or more layers of conductive features 162 formed in one or more stacked dielectric layers 164. Each of the dielectric layers 164 may comprise a dielectric material, such as a low-k dielectric material, an extra low-k (ELK) dielectric material, or the like. The dielectric layers 164 may be deposited using an appropriate process, such as, CVD, ALD, PVD, PECVD, or the like.

The conductive features 162 may comprise conductive lines and conductive vias interconnecting the layers of conductive lines. The conductive vias may extend through respective ones of the dielectric layers 164 to provide vertical connections between layers of conductive lines. The conductive features 162 may be formed through any acceptable process. For example, the conductive features 162 may be formed through a damascene process, such as a single damascene process, a dual damascene process, or the like. In a damascene process, a respective dielectric layer 164 is patterned utilizing a combination of photolithography and etching techniques to form trenches corresponding to the desired pattern of the conductive features 162. An optional diffusion barrier and/or optional adhesion layer may be deposited and the trenches may then be filled with a conductive material. Suitable materials for the barrier layer includes titanium, titanium nitride, titanium oxide, tantalum, tantalum nitride, titanium oxide, or other alternatives, and suitable materials for the conductive material include tungsten, ruthenium, cobalt, copper, molybdenum, nickel, combinations thereof, or the like. In an embodiment, the conductive features 162 may be formed by depositing a seed layer of copper or a copper alloy, and filling the trenches by electroplating. A chemical mechanical planarization (CMP) process or the like may be used to remove excess conductive material from a surface of the respective dielectric layer 164 and to planarize the surface for subsequent processing.

In the illustrated example, five layers of conductive features 162 and dielectric layers 164 are illustrated. However, it should be appreciated that the interconnect structure 160 may comprise any number of conductive features disposed in any number of dielectric layers. The conductive features 162 of the interconnect structure 160 are electrically connected to the gate contacts 140 and the source/drain contacts 138 to form functional circuits. In other words, the conductive features 162 interconnect the epitaxial source/drain regions 106 and the gate electrodes 124. In some embodiments, the functional circuits formed by the interconnect structure 160 may comprise logic circuits, memory circuits, image sensor circuits, or the like. The second ILD 132, the source/drain contacts 138, and the gate contacts 140 may also be considered part of the interconnect structure 160, such as part of a first level of conductive features of the interconnect structure 160.

A carrier substrate 166 is then bonded to a top surface of the interconnect structure 160 by bonding layers 168 (e.g., including bonding layers 168A, 168B). The carrier substrate 166 may be a glass carrier substrate, a ceramic carrier substrate, a semiconductor substrate (e.g., a silicon substrate), a wafer (e.g., a silicon wafer), or the like. The carrier substrate 166 may provide structural support during subsequent processing steps and in the completed device. The carrier substrate 166 be substantially free of any active or passive devices.

In various embodiments, the carrier substrate 166 may be bonded to the interconnect structure 160 using a suitable technique such as dielectric-to-dielectric bonding, or the like. Dielectric-to-dielectric bonding may comprise depositing the bonding layers 168A, 168B on the interconnect structure 160 and the carrier substrate 166, respectively. In some embodiments, the bonding layer 168A comprises silicon oxide (e.g., a high density plasma (HDP) oxide, or the like) that is deposited by CVD, ALD, PVD, or the like. The bonding layer 168B may likewise be an oxide layer that is formed prior to bonding using, for example, CVD, ALD, PVD, thermal oxidation, or the like. Other suitable materials may be used as well for the bonding layers 168A, 168B.

The dielectric-to-dielectric bonding process may further include applying a surface treatment to one or more of the bonding layers 168. The surface treatment may include a plasma treatment. The plasma treatment may be performed in a vacuum environment. After the plasma treatment, the surface treatment may further include a cleaning process (e.g., a rinse with deionized water, or the like) that may be applied to one or more of the bonding layers 168. The carrier substrate 166 is then aligned with the interconnect structure 160 and the two are pressed against each other to initiate a pre-bonding of the carrier substrate 166 to the interconnect structure 160. The pre-bonding may be performed at room temperature (e.g., in a range of about 20° C. to about 25° C.). After the pre-bonding, an annealing process may be applied by for example, heating the interconnect structure 160 and the carrier substrate 166 to a temperature of about 170° C.

Figure 25A:
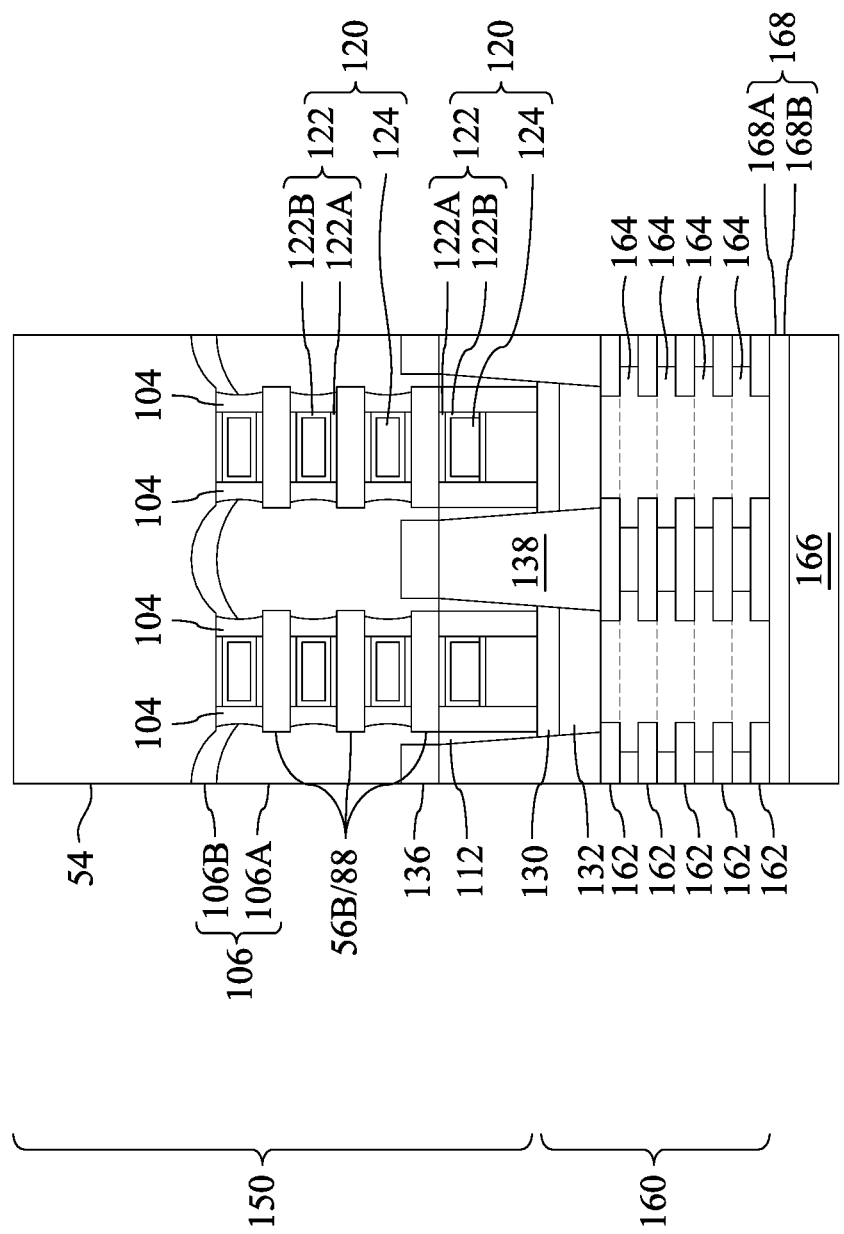
Figure 25C:
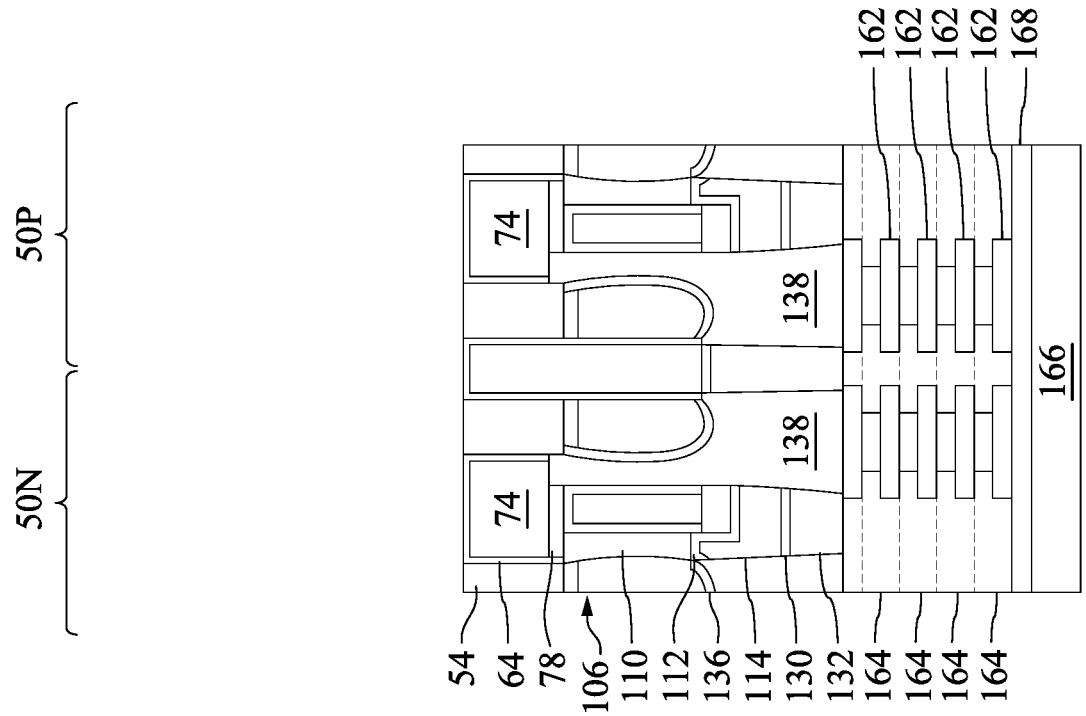
Figure 25B:
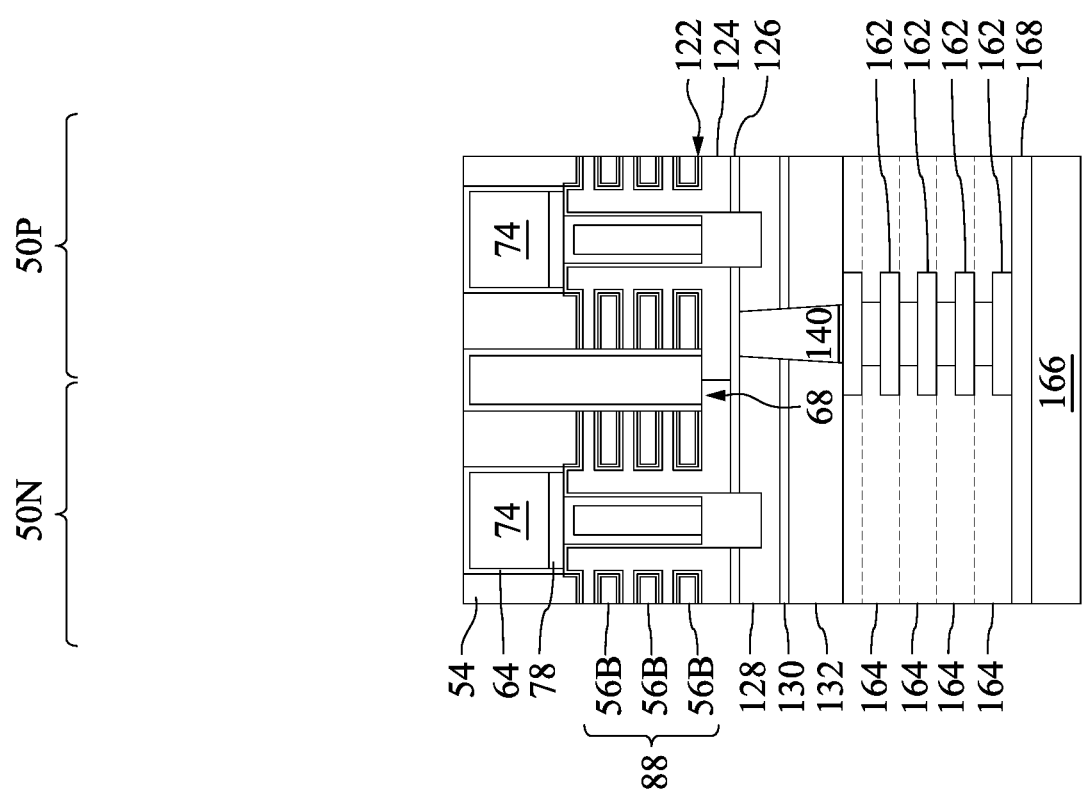

In FIGS. 25A, 25B, and 25C, the intermediate structure is flipped so that the back-side of the substrate 50 faces upwards. The back-side of the substrate 50 refers to the side opposite to the front-side of the substrate 50 on which the device layer 150 is formed. The substrate 50 is then thinned to remove (or at least reduce the thickness of) the back-side portions of the substrate 50, such as the insulator layer 50B and the substrate core 50C. The thinning process may comprise a planarization process (e.g., mechanical grinding, chemical mechanical polish (CMP), or the like), an etch back process, combinations thereof, or the like. The thinning process exposes surfaces of the liner layers 64 and the semiconductor fins 54 at the back-side of the device layer 150.

Figure 26A:
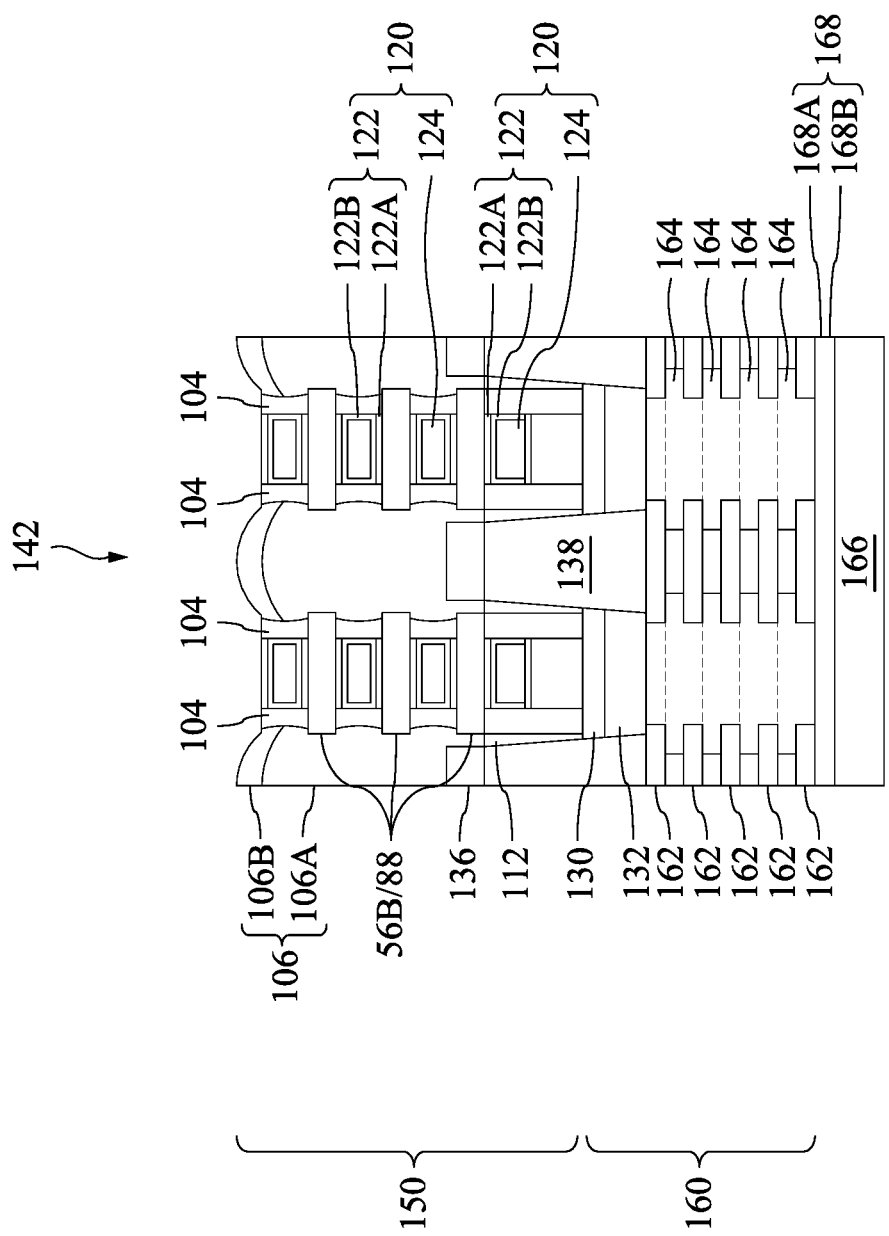
Figure 26C:
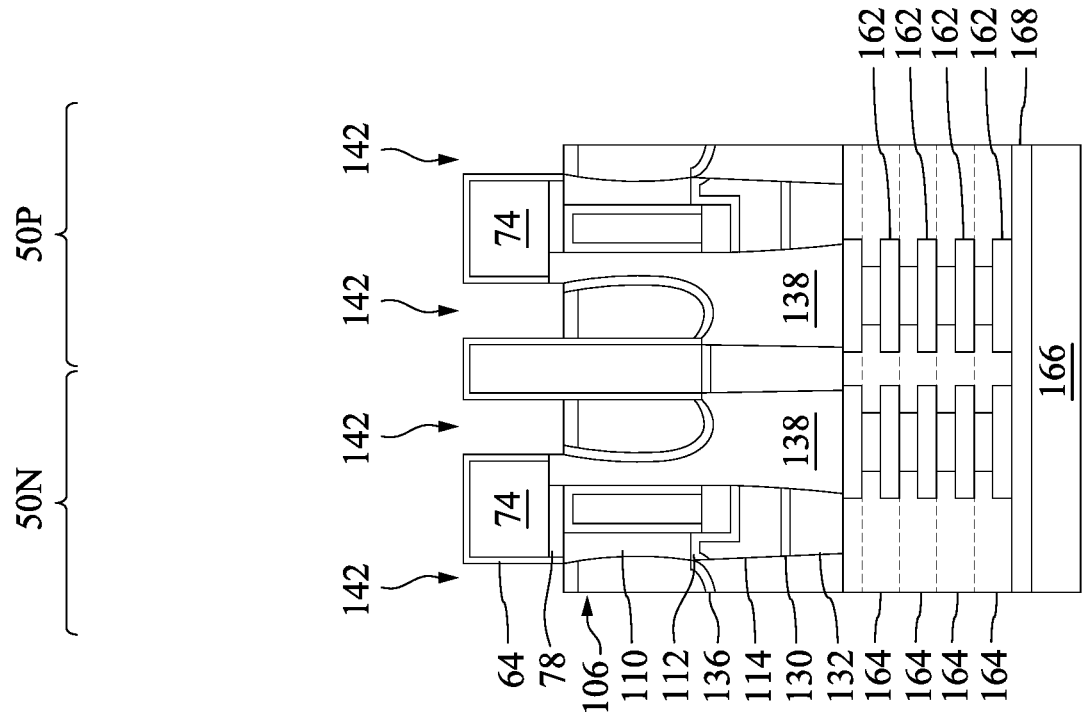
Figure 26B:
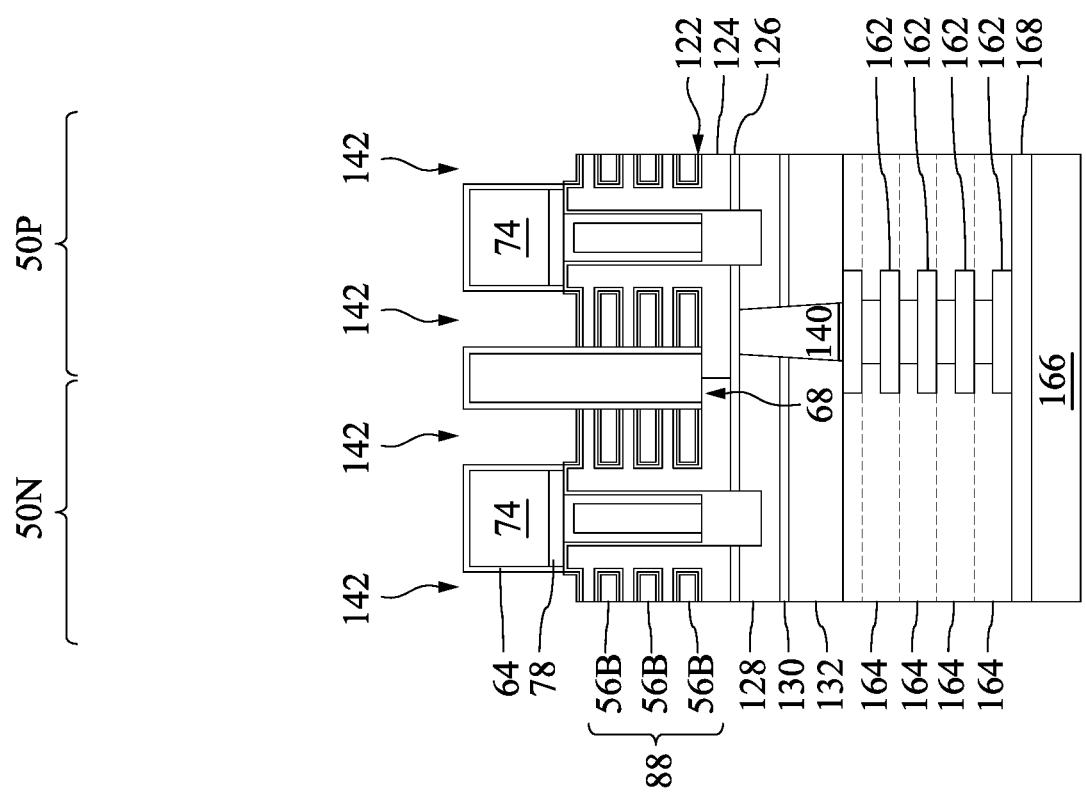

In FIGS. 26A, 26B, and 26C, the semiconductor fins 54 are removed to form recesses 142. Each recess 142 is disposed between a dielectric wall 68 and a power rail contact 74. The semiconductor fins 54 may be removed using acceptable photolithography and etching techniques, such as with an etching process that is selective to the semiconductor fins 54 (e.g., etches the material of the semiconductor fins 54 at a faster rate than the material of the liner layers 64 and the epitaxial source/drain regions 106). During the removal, the lower layers of the epitaxial source/drain regions 106 (e.g., the first semiconductor material layers 106A) may be used as etch stop layers when the semiconductor fins 54 are etched. The lower layers of the epitaxial source/drain regions 106 (e.g., the first semiconductor material layers 106A) may (or may not) be removed during the removal of the semiconductor fins 54.

Figure 27A:
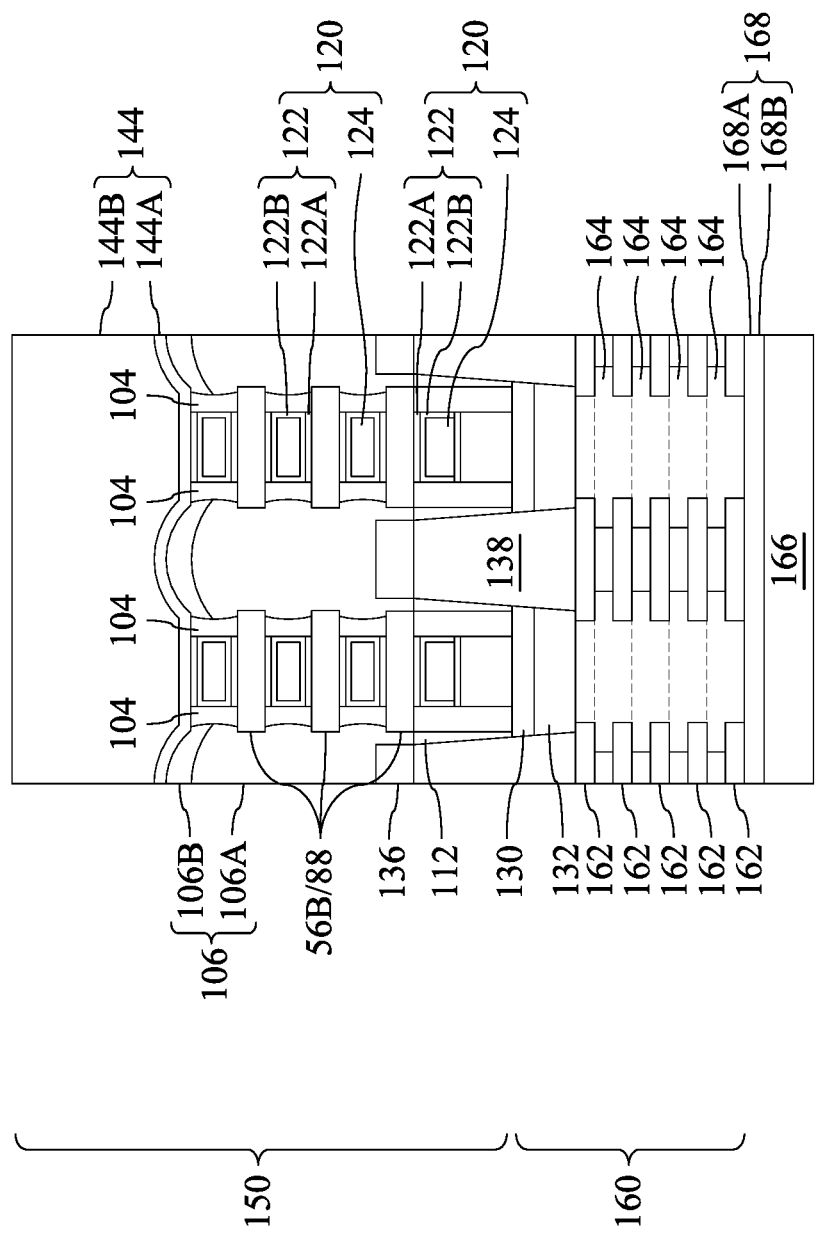
Figure 27C:
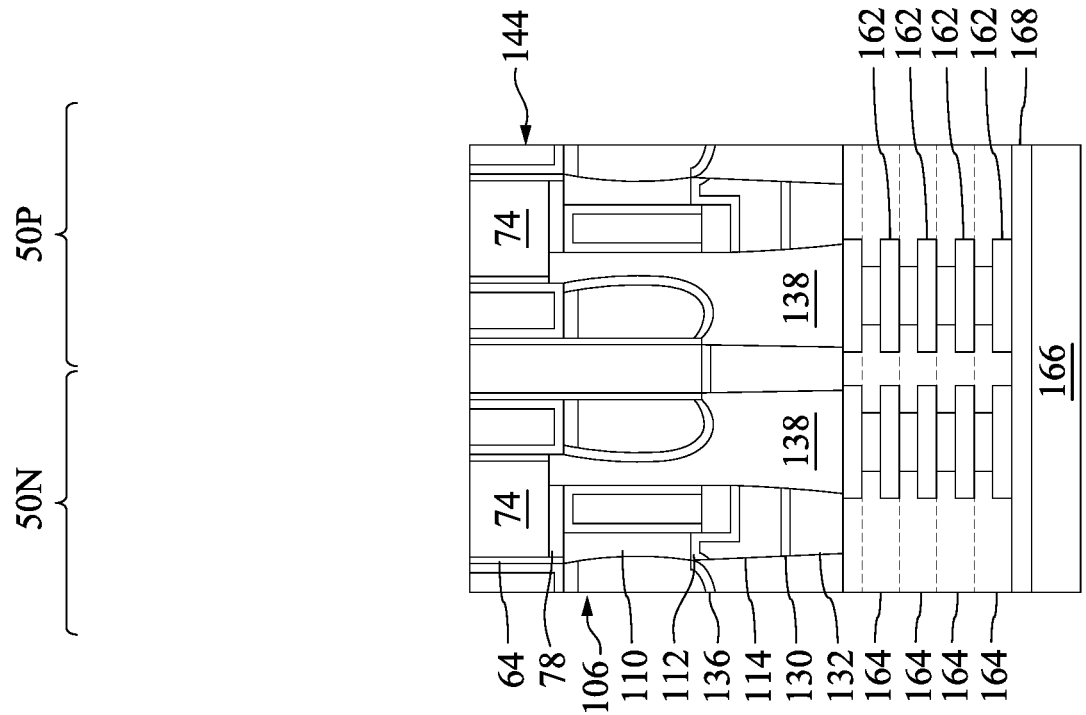
Figure 27B:
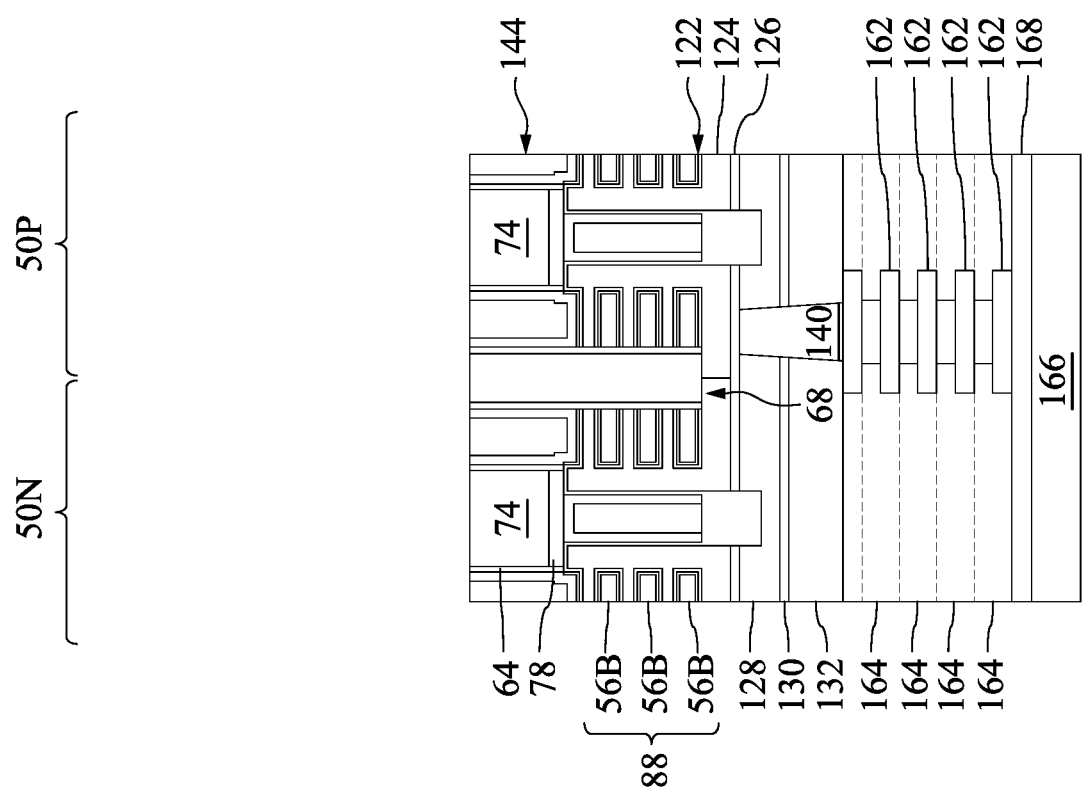

In FIGS. 27A, 27B, and 27C, dielectric fins 144 are formed in the recesses 142, such as on the epitaxial source/drain regions 106. The dielectric fins 144 replace the semiconductor fins 54, which can help reduce the parasitic capacitance and/or the leakage current of the resulting nano-FETs, thereby improving their performance. The dielectric fins 144 may be formed of a low-k dielectric material (such as one selected from the candidate dielectric materials of the liner layer 64), a high-k dielectric material (such as one selected from the candidate dielectric materials of the liner layer 64), combinations thereof, or the like, which may be formed by thermal oxidation or a conformal deposition process (such as one selected from the candidate methods of forming the liner layer 64). In the illustrated embodiment, the dielectric fins 144 include a first dielectric layer 144A and a second dielectric layer 144B on the first dielectric layer 144A, with the first dielectric layer 144A formed of silicon nitride and the second dielectric layer 144B formed of silicon oxide. Forming the first dielectric layer 144A (e.g., a nitride) can help avoid oxidation of the epitaxial source/drain regions 106 and the gate structures 120 during the forming of the second dielectric layer 144B (e.g., an oxide).

After the material(s) of the dielectric fins 144 is deposited, a removal process is applied to remove excess material(s) of the dielectric fins 144 and the liner layer 64 over the power rail contacts 74 and the dielectric walls 68. In some embodiments, a planarization process such as a chemical mechanical polish (CMP), an etch-back process, combinations thereof, or the like may be utilized. The planarization process exposes the power rail contacts 74 and the dielectric walls 68 such that top surfaces of the power rail contacts 74, the dielectric walls 68, the liner layer 64, and the dielectric fins 144 are coplanar (within process variations) after the planarization process is complete. After the planarization process, the first dielectric layer 144A can have a thickness in the range of about 2 nm to about 10 nm, the second dielectric layer 144B can have a height in the range of about 8 nm to about 70 nm, the dielectric fins 144 can have a total height in the range of about 24 nm to about 80 nm, and the height $H_1$ of the power rail contacts 74 can be in the range of about 20 nm to about 60 nm.

Burying the power rail contacts 74 beneath the STI regions 78 allows them to be exposed through a planarization process, avoiding the need for etching contact openings to the back-sides of the power rail contacts 74. The overlay processing window for back-side processing may thus be widened. Further, because the power rail contacts 74 are already connected to the epitaxial source/drain regions 106 at this step of processing, no metal-semiconductor alloy regions need to be formed on the back-sides of the power rail contacts 74. Contact resistance to the nano-FETs may thus be improved.

Figure 28A:
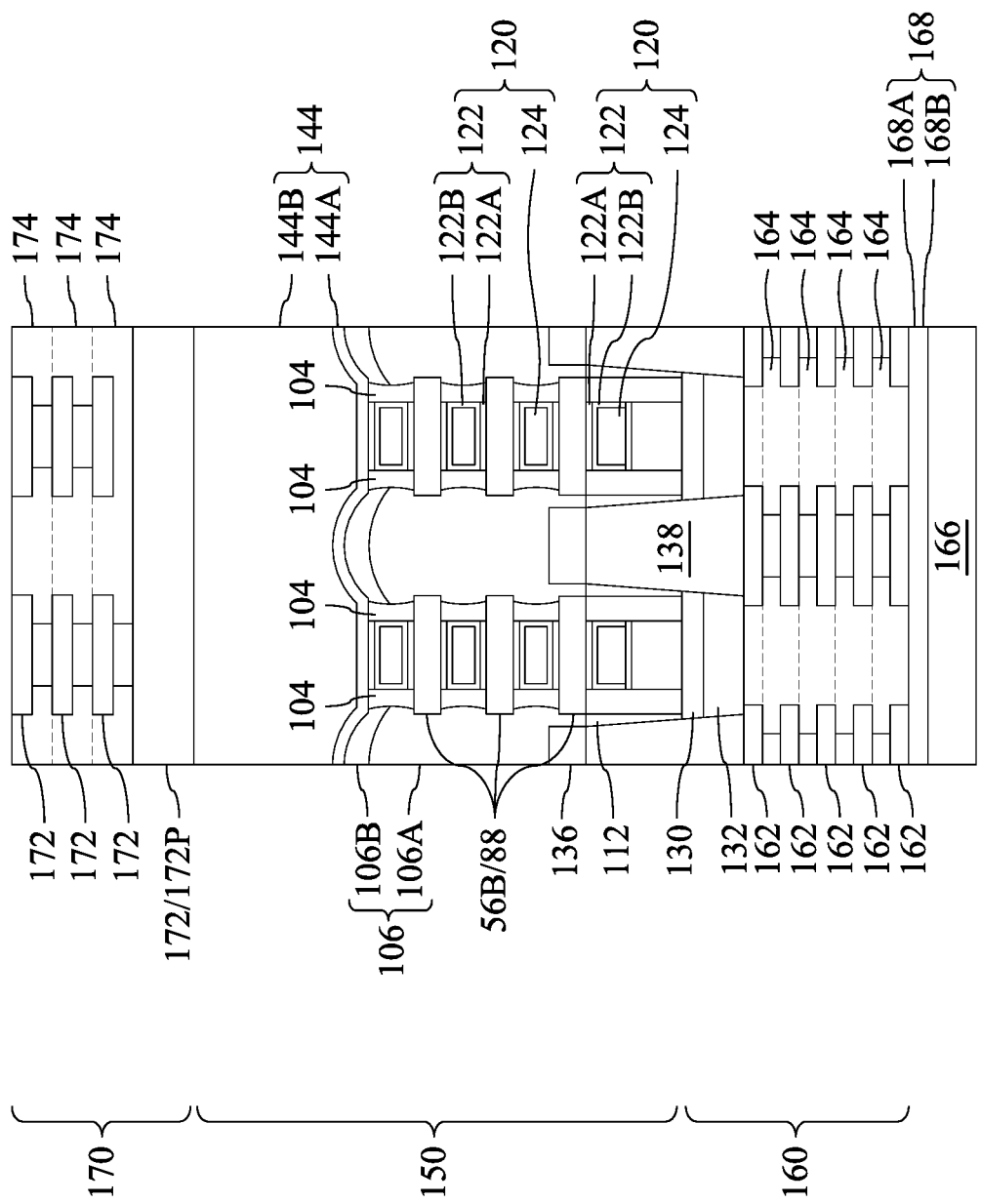

In FIGS. 28A, 28B, and 28C, an interconnect structure 170 is formed at the back-side of the device layer 150, such as over the power rail contacts 74, the dielectric walls 68, and the dielectric fins 144. The interconnect structure 170 may also be referred to as a back-side interconnect structure because it is formed on a back-side of the device layer 150. The components of the interconnect structure 170 may be similar to the interconnect structure 160. For example, the interconnect structure 170 may comprise similar materials and be formed using similar processes as the interconnect structure 160. In particular, the interconnect structure 170 may comprise stacked layers of conductive features 172 formed in stacked dielectric layers 174. The conductive features 172 may include routing lines (e.g., for routing to and from subsequently formed contact pads and external connectors). The conductive features 172 may further include conductive vias that extend in the dielectric layers 174 to provide vertical interconnection between stacked layers of the conductive lines. After formation, the conductive features 172 can have a thickness in the range of about 1 nm to about 50 nm. The power rail contacts 74 connect the conductive features 172 of the interconnect structure 170 to the transistors of the device layer 150 and the conductive features 162 of the interconnect structure 160.

Some or all of the conductive features 172 are power rail lines 172P, which are conductive lines that electrically connect the epitaxial source/drain regions 106 to a reference voltage, supply voltage, or the like. For example, the power rail lines 172P may be first level conductive lines of the interconnect structure 160. By placing the power rail lines 172P at a back-side of the device layer 150 rather than at a front-side of the device layer 150, advantages may be achieved. For example, a gate density of the nano-FETs and/or interconnect density of the interconnect structure 160 may be increased. Further, the back-side of the device layer 150 may accommodate wider power rails, reducing resistance and increasing efficiency of power delivery to the nano-FETs. For example, a width of the conductive features 172 may be at least twice a width of a first level conductive line (e.g., conductive line 162A) of the interconnect structure 160.

In some embodiments, the conductive features of the interconnect structure 170 may be patterned to include one or more embedded passive devices, such as resistors, capacitors, inductors, or the like. The embedded passive devices may be integrated with the conductive features 172 (e.g., the power rail lines 172P) to provide circuits (e.g., power circuits) at the back-side of the device layer 150.

Figure 29A:
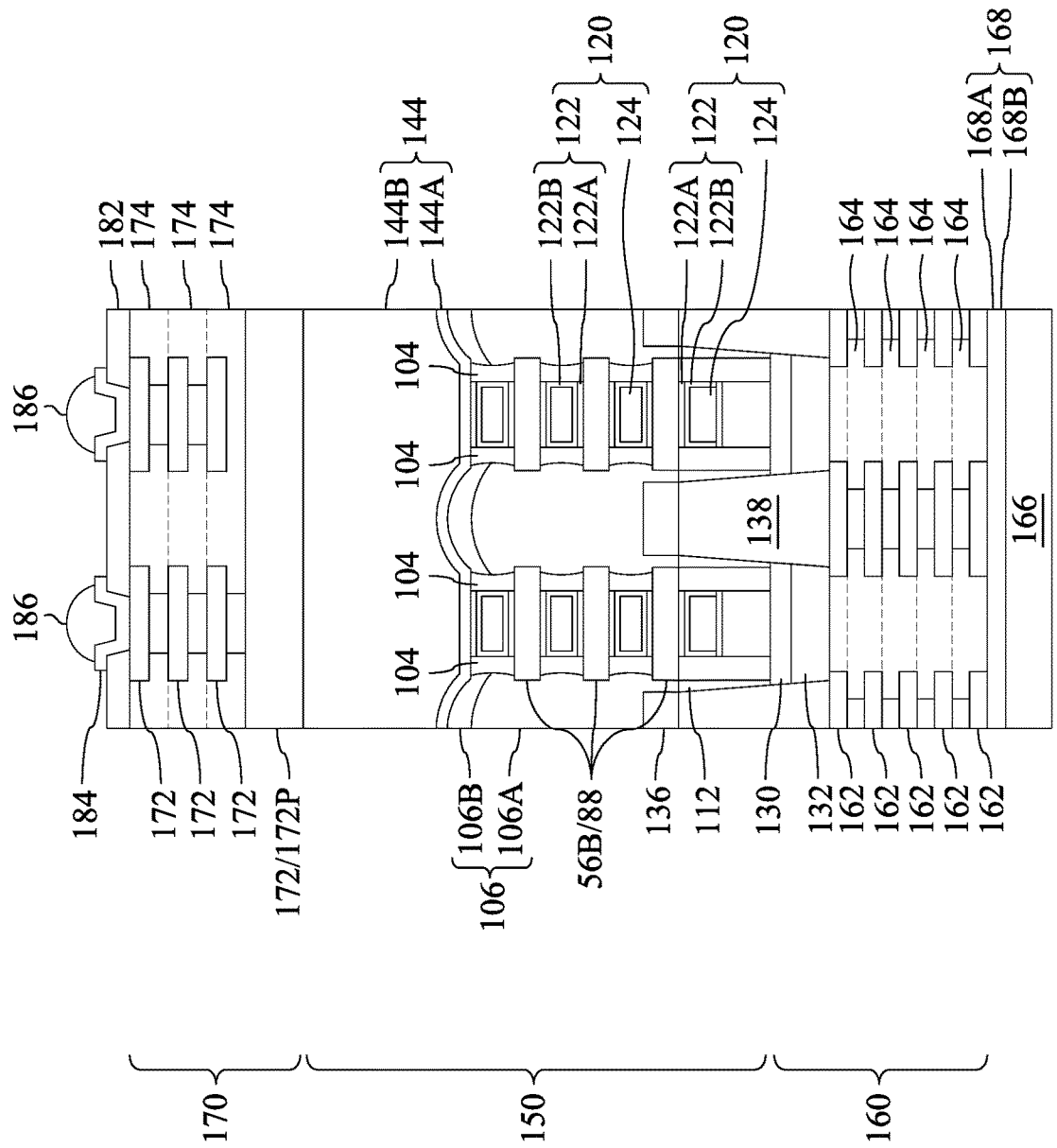
Figure 29C:
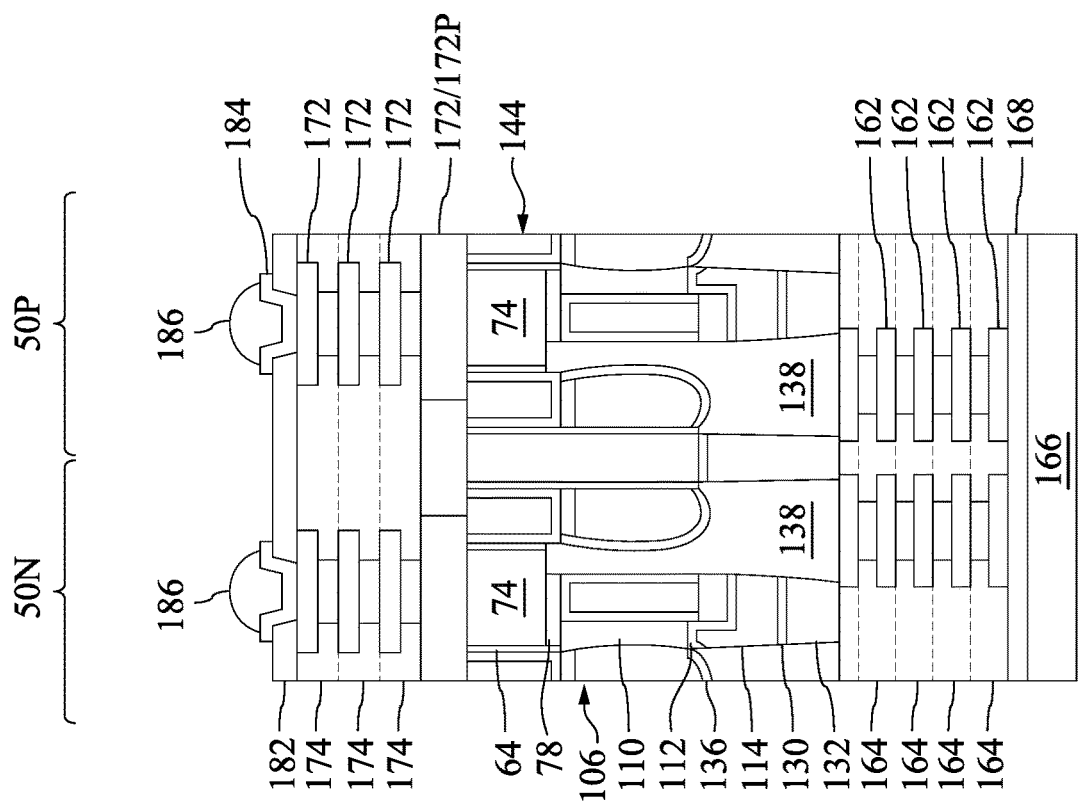
Figure 29B:
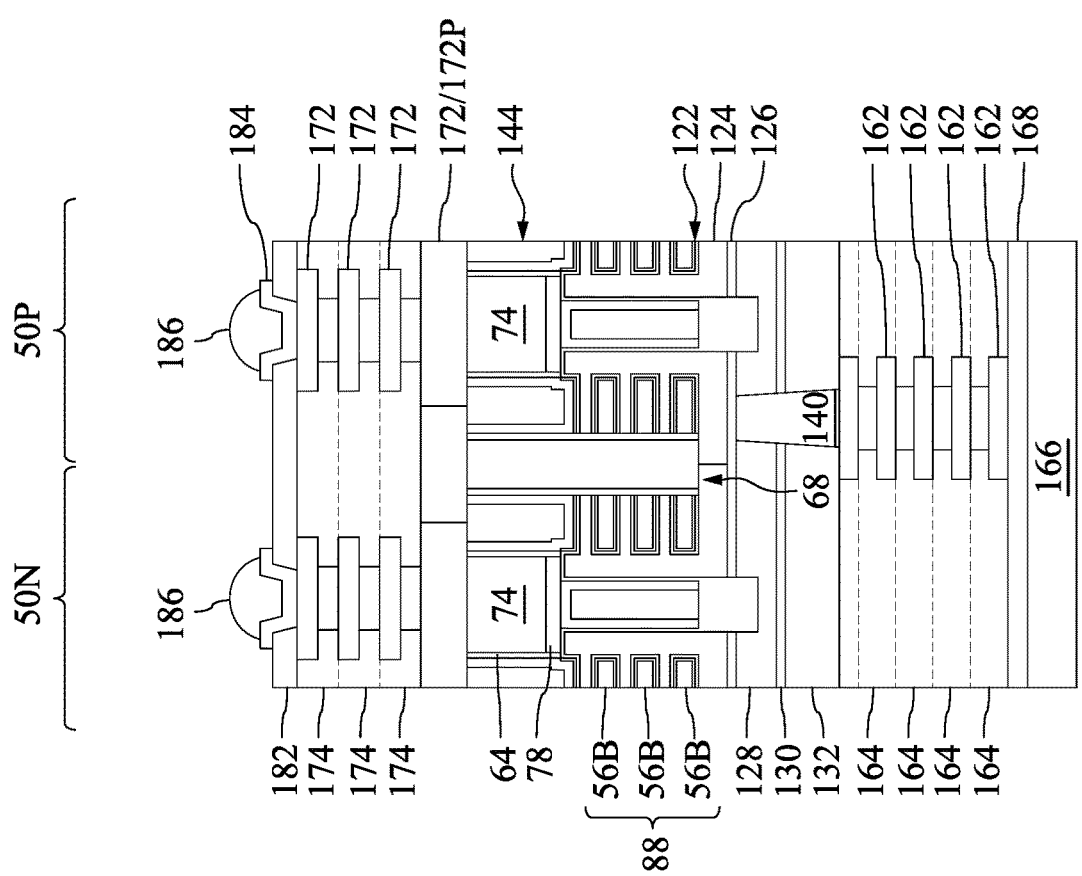

In FIGS. 29A, 29B, and 29C, a passivation layer 182, UBMs 184, and external connectors 186 are formed over the interconnect structure 170. The passivation layer 182 may comprise polymers such as polyimide, polybenzoxazole (PBO), a benzocyclobutene (BCB) based polymer, or the like. Alternatively, passivation layer 182 may include inorganic dielectric materials such as silicon oxide, silicon nitride, silicon carbide, silicon oxynitride, or the like. The material of the passivation layer 182 may be deposited by, for example, CVD, PVD, ALD, or the like.

The UBMs 184 are formed through the passivation layer 182 to the conductive features 172 of the interconnect structure 170, and the external connectors 186 are formed on the UBMs 184. The UBMs 184 may comprise one or more layers of copper, nickel, gold, or the like, which are formed by a plating process, or the like. The external connectors 186 (e.g., solder balls) are formed on the UBMs 184. The formation of external connectors 186 may include placing solder balls on the exposed portions of UBMs 184 and then reflowing the solder balls. In alternative embodiments, the formation of external connectors 186 includes performing a plating step to form solder regions over the topmost conductive features 172 and then reflowing the solder regions. In another embodiment, the external connectors 186 are metal connectors with substantially vertical sidewalls, such as microbumps. The UBMs 184 and the external connectors 186 may be used to provide input/output connections to other electrical components, such as, other device dies, redistribution structures, printed circuit boards (PCBs), motherboards, or the like. The UBMs 184 and the external connectors 186 may also be referred to as back-side input/output pads that may provide signal, reference voltage, supply voltage, and/or ground connections to the nano-FETs of the device layer 150.

Embodiments may achieve advantages. Burying the power rail contacts 74 beneath the STI regions 78 allows their back-sides to be exposed through a planarization process, avoiding the need for etching contact openings to the back-sides of the power rail contacts 74. Further, because the power rail contacts 74 are connected to the epitaxial source/drain regions 106 by the source/drain contacts 138, no metal-semiconductor alloy regions need to be formed on the back-sides of the power rail contacts 74. Contact resistance to the nano-FETs may thus be improved.

In an embodiment, a method includes: forming a forksheet structure over a substrate; forming a power rail contact adjacent the forksheet structure; forming an isolation region on the power rail contact, the forksheet structure protruding from the isolation region; growing a first source/drain region in the forksheet structure; depositing an interlayer dielectric (ILD) on the first source/drain region; and forming a source/drain contact through the ILD and the isolation region, the source/drain contact connected to the first source/drain region and the power rail contact. In some embodiments of the method, the forksheet structure includes first nanostructures, second nanostructures, and a dielectric wall between the first nanostructures and the second nanostructures, the first source/drain region adjoining the first nanostructures, the method further including: growing a second source/drain region in the forksheet structure, the second source/drain region adjoining the second nanostructures, the dielectric wall disposed between the first source/drain region and the second source/drain region. In some embodiments, the method further includes: forming a first gate structure around the first nanostructures; and forming a second gate structure around the second nanostructures, the second gate structure connected to the first gate structure. In some embodiments of the method, the first nanostructures, the second nanostructures, and the dielectric wall have parallel longitudinal axes in a first direction, and the dielectric wall is disposed between the first source/drain region and the second source/drain region in a second direction, the first direction being perpendicular to the second direction. In some embodiments of the method, forming the power rail contact includes: depositing a conductive layer on and adjacent the forksheet structure; and removing portions of the conductive layer on the forksheet structure, the power rail contact including portions of the conductive layer remaining adjacent the forksheet structure. In some embodiments of the method, forming the isolation region includes: depositing a dielectric layer on the forksheet structure and the power rail contact; and removing portions of the dielectric layer on the forksheet structure, the isolation region including portions of the dielectric layer remaining on the power rail contact. In some embodiments of the method, forming the forksheet structure includes: forming a first fin structure and a second fin structure extending from the substrate; depositing a dielectric layer over and between the first fin structure and the second fin structure; and removing portions of the dielectric layer over the first fin structure and the second fin structure to form a dielectric wall including portions of the dielectric layer remaining between the first fin structure and the second fin structure. In some embodiments, the method further includes: forming a dielectric fin on the isolation region, the first source/drain region being separated from the dielectric fin after growing the first source/drain region; and after growing the first source/drain region, depositing a dielectric layer between the dielectric fin and the first source/drain region, the ILD deposited on the dielectric layer. In some embodiments of the method, forming the source/drain contact includes: etching an opening through the ILD, the dielectric layer, and the isolation region, portions of the opening in the ILD exposing a top surface of the first source/drain region, portions of the opening in the dielectric layer exposing a side surface of the first source/drain region, portions of the opening in the isolation region exposing the power rail contact; forming a metal-semiconductor alloy region on the first source/drain region and in the opening, portions of the metal-semiconductor alloy region on the top surface of the first source/drain region having a first thickness, portions of the metal-semiconductor alloy region on the side surface of the first source/drain region having a second thickness, the first thickness being greater than or equal to the second thickness; and forming the source/drain contact on the metal-semiconductor alloy region and portions of the power rail contact exposed by the opening.

In an embodiment, a device includes: a power rail contact; an isolation region on the power rail contact; a first dielectric fin on the isolation region; a second dielectric fin adjacent the isolation region and the power rail contact; a first source/drain region on the second dielectric fin; and a source/drain contact between the first source/drain region and the first dielectric fin, the source/drain contact contacting a top surface of the first source/drain region, a side surface of the first source/drain region, and a top surface of the power rail contact. In some embodiments, the device further includes: a liner layer disposed between the first dielectric fin and each of the isolation region and the power rail contact. In some embodiments, the device further includes: a metal-semiconductor alloy region between the source/drain contact and the first source/drain region, portions of the metal-semiconductor alloy region on the top surface of the first source/drain region having a first thickness, portions of the metal-semiconductor alloy region on the side surface of the first source/drain region having a second thickness, the first thickness being greater than or equal to the second thickness. In some embodiments of the device, the first thickness and the second thickness are in a range of 2.5 nm to 7.5 nm. In some embodiments of the device, back-side surfaces of the power rail contact and the second dielectric fin are coplanar. In some embodiments, the device further includes: a second dielectric layer on the back-side surfaces of the power rail contact and the first dielectric fin; and a power rail line in the second dielectric layer, the power rail line connected to the power rail contact. In some embodiments of the device, surfaces of the power rail contact are free of metal-semiconductor alloy regions. In some embodiments, the device further includes: a dielectric layer laterally disposed between the first dielectric fin and the first source/drain region, the source/drain contact extending through the dielectric layer; and an interlayer dielectric (ILD) on the dielectric layer, the first dielectric fin, and the second dielectric fin, the source/drain contact extending through the ILD.

In an embodiment, a device includes: a first interconnect structure including metallization patterns; a second interconnect structure including a power rail line; a device layer between the first interconnect structure and the second interconnect structure, the device layer including: a transistor including a source/drain region; a power rail contact connected to the power rail line; and a source/drain contact connected to the power rail contact, the source/drain region, and the metallization patterns.

In some embodiments of the device, the device layer further includes: an isolation region isolating the transistor from other transistors of the device layer, the power rail contact buried in the isolation region. In some embodiments of the device, the source/drain region has a faceted top surface and a faceted side surface, the source/drain contact extending along the faceted top surface and the faceted side surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a forksheet structure over a substrate;
   forming a power rail contact adjacent the forksheet structure;
   forming an isolation region on the power rail contact, the forksheet structure protruding from the isolation region;
   after forming the isolation region, growing a first source/drain region in the forksheet structure;
   depositing an interlayer dielectric (ILD) on the first source/drain region; and
   forming a source/drain contact through the ILD and the isolation region, the source/drain contact connected to the first source/drain region and the power rail contact.

2. The method of claim 1, wherein the forksheet structure comprises first nanostructures, second nanostructures, and a dielectric wall between the first nanostructures and the second nanostructures, the first source/drain region adjoining the first nanostructures, the method further comprising:
   growing a second source/drain region in the forksheet structure, the second source/drain region adjoining the second nanostructures, the dielectric wall disposed between the first source/drain region and the second source/drain region.

3. The method of claim 2 further comprising:
   forming a first gate structure around the first nanostructures; and
   forming a second gate structure around the second nanostructures, the second gate structure connected to the first gate structure.

4. The method of claim 2, wherein the first nanostructures, the second nanostructures, and the dielectric wall have parallel longitudinal axes in a first direction, and the dielectric wall is disposed between the first source/drain region and the second source/drain region in a second direction, the first direction being perpendicular to the second direction.

5. The method of claim 1, wherein forming the power rail contact comprises:
   depositing a conductive layer on and adjacent the forksheet structure; and
   removing portions of the conductive layer on the forksheet structure, the power rail contact comprising portions of the conductive layer remaining adjacent the forksheet structure.

6. The method of claim 1, wherein forming the isolation region comprises:
   depositing a dielectric layer on the forksheet structure and the power rail contact; and
   removing portions of the dielectric layer on the forksheet structure, the isolation region comprising portions of the dielectric layer remaining on the power rail contact.

7. The method of claim 1, wherein forming the forksheet structure comprises:
   forming a first fin structure and a second fin structure extending from the substrate;
   depositing a dielectric layer over and between the first fin structure and the second fin structure; and
   removing portions of the dielectric layer over the first fin structure and the second fin structure to form a dielectric wall comprising portions of the dielectric layer remaining between the first fin structure and the second fin structure.

8. The method of claim 1 further comprising:
   forming a dielectric fin on the isolation region, the first source/drain region being separated from the dielectric fin after growing the first source/drain region; and
   after growing the first source/drain region, depositing a dielectric layer between the dielectric fin and the first source/drain region, the ILD deposited on the dielectric layer.

9. The method of claim 8, wherein forming the source/drain contact comprises:
   etching an opening through the ILD, the dielectric layer, and the isolation region, portions of the opening in the ILD exposing a top surface of the first source/drain region, portions of the opening in the dielectric layer exposing a side surface of the first source/drain region, portions of the opening in the isolation region exposing the power rail contact;
   forming a metal-semiconductor alloy region on the first source/drain region and in the opening, portions of the metal-semiconductor alloy region on the top surface of the first source/drain region having a first thickness, portions of the metal-semiconductor alloy region on the side surface of the first source/drain region having a second thickness, the first thickness being greater than or equal to the second thickness; and
   forming the source/drain contact on the metal-semiconductor alloy region and portions of the power rail contact exposed by the opening.

10. A device comprising:
    a power rail contact;
    an isolation region on a top surface of the power rail contact;
    a first dielectric fin on the isolation region;
    a second dielectric fin adjacent the isolation region and the power rail contact;
    a first source/drain region on the second dielectric fin; and
    a source/drain contact between the first source/drain region and the first dielectric fin, the source/drain contact contacting a top surface of the first source/drain region, a side surface of the first source/drain region, and the top surface of the power rail contact.

11. The device of claim 10 further comprising:
    a liner layer disposed between the first dielectric fin and each of the isolation region and the power rail contact.

12. The device of claim 10 further comprising:
    a metal-semiconductor alloy region between the source/drain contact and the first source/drain region, portions of the metal-semiconductor alloy region on the top surface of the first source/drain region having a first thickness, portions of the metal-semiconductor alloy region on the side surface of the first source/drain region having a second thickness, the first thickness being greater than or equal to the second thickness.

13. The device of claim 12, wherein the first thickness and the second thickness are in a range of 2.5 nm to 7.5 nm.

14. The device of claim 10, wherein back-side surfaces of the power rail contact and the second dielectric fin are coplanar.

15. The device of claim 14 further comprising:
    a second dielectric layer on the back-side surfaces of the power rail contact and the first dielectric fin; and a power rail line in the second dielectric layer, the power rail line connected to the power rail contact.

16. The device of claim 14, wherein surfaces of the power rail contact are free of metal-semiconductor alloy regions.

17. The device of claim 10 further comprising:
a dielectric layer laterally disposed between the first dielectric fin and the first source/drain region, the source/drain contact extending through the dielectric layer; and
an interlayer dielectric (ILD) on the dielectric layer, the first dielectric fin, and the second dielectric fin, the source/drain contact extending through the ILD.

18. A device comprising:
a first interconnect structure comprising metallization patterns, the metallization patterns comprising a first level conductive line;
a second interconnect structure comprising a power rail line, a width of the power rail line being at least twice a width of the first level conductive line;
a device layer between the first interconnect structure and the second interconnect structure, the device layer comprising:
a transistor comprising a source/drain region;
a power rail contact connected to the power rail line; and
a source/drain contact connected to the power rail contact, the source/drain region, and the first level conductive line.

19. The device of claim 18, wherein the device layer further comprises:
an isolation region isolating the transistor from other transistors of the device layer, the power rail contact buried in the isolation region.

20. The device of claim 18, wherein the source/drain region has a faceted top surface and a faceted side surface, the source/drain contact extending along the faceted top surface and the faceted side surface.

* * * * *